United States Patent
Park et al.

(10) Patent No.: US 11,582,786 B2
(45) Date of Patent: Feb. 14, 2023

(54) METHOD AND APPARATUS FOR GRANT-FREE DATA TRANSMISSION IN WIRELESS COMMUNICATION SYSTEM

(71) Applicant: Samsung Electronics Co., Ltd., Gyeonggi-do (KR)

(72) Inventors: Sungjin Park, Gyeonggi-do (KR); Taehyoung Kim, Gyeonggi-do (KR); Jeongho Yeo, Gyeonggi-do (KR); Jinyoung Oh, Gyeonggi-do (KR); Hyunseok Ryu, Gyeonggi-do (KR); Jonghyun Bang, Gyeonggi-do (KR); Cheolkyu Shin, Gyeonggi-do (KR)

(73) Assignee: Samsung Electronics Co., Ltd

( * ) Notice: Subject to any disclaimer, the term of this patent is extended or adjusted under 35 U.S.C. 154(b) by 51 days.

(21) Appl. No.: 17/153,443

(22) Filed: Jan. 20, 2021

(65) Prior Publication Data

US 2021/0227570 A1    Jul. 22, 2021

(30) Foreign Application Priority Data

Jan. 20, 2020 (KR) .......................... 10-2020-0007549
Apr. 6, 2020 (KR) .......................... 10-2020-0041581

(51) Int. Cl.
  *H04W 56/00* (2009.01)
  *H04W 72/12* (2023.01)
  *H04W 76/27* (2018.01)
  *H04L 1/00* (2006.01)
  *H04L 27/26* (2006.01)

(52) U.S. Cl.
  CPC ....... *H04W 72/1289* (2013.01); *H04L 1/0004* (2013.01); *H04L 1/0061* (2013.01);
  (Continued)

(58) Field of Classification Search
  CPC ............. H04W 72/1289; H04W 76/27; H04W 72/1257; H04L 27/26025; H04L 1/0004; H04L 1/0061
  (Continued)

(56) References Cited

U.S. PATENT DOCUMENTS

2019/0082454 A1   3/2019   Shi et al.
2019/0281354 A1   8/2019   Fakoorian et al.
(Continued)

FOREIGN PATENT DOCUMENTS

CN     110677222      1/2020
WO    WO 2019/028276   2/2019

OTHER PUBLICATIONS

NTT Docomo, Inc., "Discussions on DL SPS Enhancement", R1-1912891, 3GPP TSG RAN WG1 #99, Nov. 18-22, 2019, 9 pages.
(Continued)

*Primary Examiner* — Sai Ming Chan
(74) *Attorney, Agent, or Firm* — The Farrell Law Firm, P.C.

(57) ABSTRACT

A method performed by a terminal in a communication system is provided. The method includes identifying a first physical downlink shared channel (PDSCH) scheduled by a physical downlink control channel (PDCCH), and a second PDSCH without a corresponding PDCCH; identifying that the first PDSCH and the second PDSCH are overlapped in time; and decoding the first PDSCH on a basis that the PDCCH scheduling the first PDSCH ends at least 14 symbols before the starting symbol of the second PDSCH.

20 Claims, 22 Drawing Sheets

(52) U.S. Cl.
CPC ... *H04L 27/26025* (2021.01); *H04W 72/1257* (2013.01); *H04W 76/27* (2018.02)

(58) Field of Classification Search
USPC .......................................................... 370/329
See application file for complete search history.

(56) References Cited

U.S. PATENT DOCUMENTS

2019/0342944 A1    11/2019  Chatterjee et al.
2020/0022175 A1*   1/2020   Xiong ............... H04W 72/0453

OTHER PUBLICATIONS

Nokia et al., "Clarification to the Dynamically Scheduled PDSCH Collision with SPS-PDSCH", R1-1911663, 3GPP TSG RAN WG1 #98bis, Oct. 14-20, 2019, 4 pages.
3GPP, 3rd Generation Partnership Project; Technical Specification Group Radio Access Network; NR; Physical Layer Procedures for Data (Release 16), 3GPP TS 38.214 V16.0.0, Dec. 2019, 147 pages.
International Search Report dated Apr. 8, 2021 issued in counterpart application No. PCT/KR2021/000677, 7 pages.
Nokia, Nokia Shanghai Bell, "IIot WI: Resource Conflicts between UL Grants, HARQ-ACK and Activation/Release Aspects for SPS", R1-1912609, 3GPP TSG RAN WG1 Meeting #99, Nov. 18-22, 2019, 10 pages.
Chinese Office Action dated Dec. 23, 2021 issued in counterpart application No. 202180002383.4, 19 pages.
European Search Report dated Jan. 7, 2022 issued in counterpart application No. 21733880.5-1215, 10 pages.

* cited by examiner

METHOD AND APPARATUS FOR GRANT-FREE DATA TRANSMISSION IN WIRELESS COMMUNICATION SYSTEM

CROSS-REFERENCE TO RELATED APPLICATION(S)

This application is based on and claims priority under 35 U.S.C. § 119 to Korean Patent Application No. 10-2020-0007549, filed on Jan. 20, 2020, and Korean Patent Application No. 10-2020-0041581, filed on Apr. 6, 2020 in the Korean Intellectual Property Office, the disclosures of which are incorporated by reference herein in their entireties.

BACKGROUND

1. Field

The disclosure relates generally to a method for grant-free data transmission in a wireless communication system and, particularly, to a downlink grant-free data transmission method.

2. Description of Related Art

To meet the increased demand for wireless data traffic since deployment of fourth generation (4G) communication systems, efforts have been made to develop an improved fifth generation (5G) or pre-5G communication system. Therefore, the 5G or pre-5G communication system is also called a "Beyond 4G Network" or a "Post Long-Term Evolution System". The 5G communication system is considered to be implemented in higher frequency millimeter wave (mmWave) bands, e.g., 60 gigahertz (GHz) bands, so as to accomplish higher data rates. To decrease propagation loss of the radio waves and increase the transmission distance, beamforming techniques, massive multiple-input multiple-output (MIMO) techniques, full dimensional MIMO (FD-MIMO) techniques, array antenna techniques, analog beam forming techniques, and large scale antenna techniques are discussed in 5G communication systems. In addition, in 5G communication systems, developments for system network improvement is under way based on advanced small cells, cloud radio access networks (RANs), ultra-dense networks, device-to-device (D2D) communication, wireless backhaul technology, moving network technology, cooperative communication technology, coordinated multi-points (CoMP) technology, and reception-end interference cancellation technology. In the 5G system, hybrid frequency shift keying (FSK) and quadrature amplitude modulation (QAM) (FQAM) technology, sliding window superposition coding (SWSC) as an advanced coding modulation (ACM) technology, filter bank multi carrier (FBMC) technology, non-orthogonal multiple access (NOMA) technology, and sparse code multiple access (SCMA) as an advanced access technology have also been developed.

The Internet is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication network, and a machine type communication (MTC) network, have been recently researched. Such an IoT environment may provide intelligent Internet technology services that create a new value to human life by collecting and analyzing data generated among connected things. IoT may be applied to a variety of fields including smart home fields, smart building fields, smart city fields, smart car or connected car fields, smart grid fields, health care fields, smart appliance fields and advanced medical service fields through convergence and combination between existing information technology (IT) and various industrial applications.

Various attempts have been made to apply 5G communication systems to IoT networks. For example, technologies such as a sensor network technologies, MTC technologies, and M2M communication technologies may be implemented by beamforming, MIMO, and array antennas. Application of a cloud radio access network (RAN), as the above-described big data processing technology, may also be considered an example of convergence of the 5G technology with the IoT technology.

5G communication systems are evolving such that various services can be provided. As various services are provided, there is a need for a scheme for efficiently providing such services.

SUMMARY

The present disclosure has been made to address the above-mentioned problems and disadvantages, and to provide at least the advantages described below.

In accordance with an aspect of the disclosure, a method performed by a terminal is provided. The method includes identifying a first physical downlink shared channel (PDSCH) scheduled by a physical downlink control channel (PDCCH), and a second PDSCH without a corresponding PDCCH; identifying that the first PDSCH and the second PDSCH are overlapped in time; and decoding the first PDSCH on a basis that the PDCCH scheduling the first PDSCH ends at least 14 symbols before the starting symbol of the second PDSCH.

In accordance with another aspect of the disclosure, a method performed by a base station is provided. The method includes identifying a PDSCH scheduled by a PDCCH, and a second PDSCH without a corresponding PDCCH; identifying that the first PDSCH and the second PDSCH are overlapped in time; and transmitting the first PDSCH on a basis that the PDCCH scheduling the first PDSCH ends at least 14 symbols before the starting symbol of the second PDSCH.

In accordance with another aspect of the disclosure, a terminal is provided. The terminal includes a transceiver; and a controller configured to identify a first PDSCH scheduled by a PDCCH, and a second PDSCH without a corresponding PDCCH; identify that the first PDSCH and the second PDSCH are overlapped in time; and decode the first PDSCH on a basis that the PDCCH scheduling the first PDSCH ends at least 14 symbols before the starting symbol of the second PDSCH.

In accordance with another aspect of the disclosure, a base station is provided. The base station includes a transceiver; and a controller configured to identify a first PDSCH scheduled by a PDCCH, and a second PDSCH without a corresponding PDCCH; identify that the first PDSCH and the second PDSCH are overlapped in time; and transmit the first PDSCH on a basis that the PDCCH scheduling the first PDSCH ends at least 14 symbols before the starting symbol of the second PDSCH.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
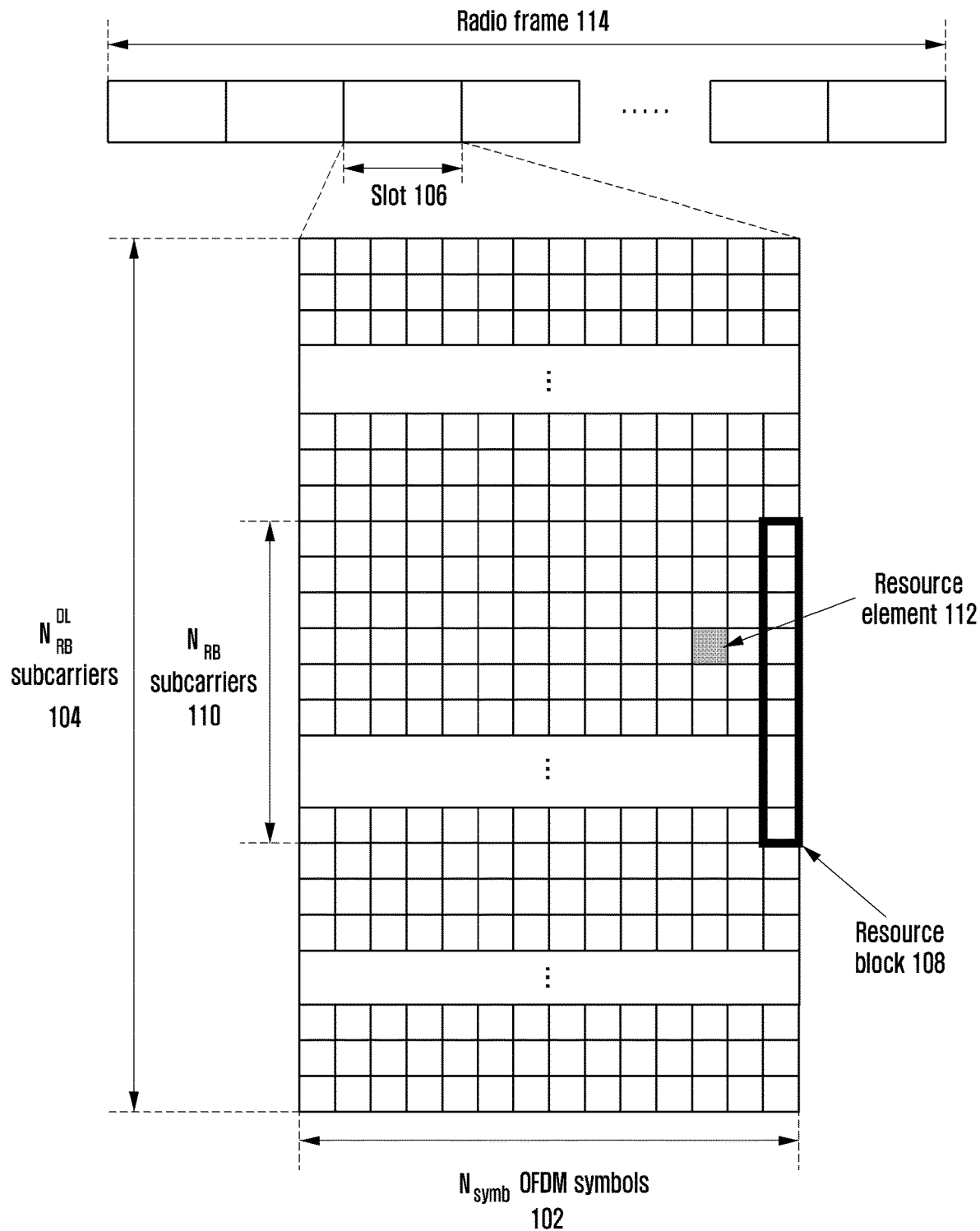
FIG. 1 is a diagram illustrating a transmission structure in a time-frequency domain, which is a radio resource domain of a 5G or a new radio (NR) system, according to an embodiment.

In the following disclosure, an embodiment for performing grant-free data transmission/reception with efficient use of radio resources will be described. Particularly, a downlink grant-free data transmission/reception method and an uplink grant-free data transmission/reception method will be described.

Accordingly, radio resources may be efficiently used, and various services may be efficiently provided to the user according to priority.

Hereinafter, embodiments of the disclosure will be described in detail with reference to the accompanying drawings.

In describing embodiments of the disclosure, descriptions related to technical contents well-known in the art and not associated directly with the disclosure may be omitted. Such an omission of unnecessary descriptions is intended to prevent obscuring of the main idea of the disclosure and more clearly convey the main idea.

For the same reason, in the accompanying drawings, some elements may be exaggerated, omitted, or schematically illustrated. Further, the size of each element may not completely reflect the actual size. In the drawings, identical or corresponding elements may be provided with identical reference numerals.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art, and the disclosure is defined only by the scope of the appended claims. Throughout the specification, the same or like reference numerals designate the same or like elements.

Here, it will be understood that each block of the flowchart illustrations, and combinations of blocks in the flowchart illustrations, can be implemented by computer program instructions. These computer program instructions can be provided to a processor of a general purpose computer, a special purpose computer, or a programmable data processing apparatus to produce a machine, such that instructions, which are executed via the processor of the computer or the programmable data processing apparatus, create a means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including an instruction means that implements the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

Further, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, a "unit" refers to a software element or a hardware element, such as a field programmable gate array (FPGA) or an application specific integrated circuit (ASIC), which performs a predetermined function. However, the "unit" does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, databases, data structures, tables, arrays, and parameters. The elements and functions provided by the "unit" may either be combined into a smaller number of elements, or a "unit", or divided into a larger number of elements, or a "unit". Moreover, the elements and "units" or may be implemented to reproduce one or more computer processing units (CPUs) within a device or a security multimedia card. Further, the "unit" in the embodiments may include one or more processors.

The wireless communication system has evolved from early voice-oriented services to a broadband wireless communication system that provides high-speed, high-quality packet data services according to communication standards such as high-speed packet access (HSPA) of $3^{rd}$ Generation Partnership Project (3GPP), long-term evolution (LTE) or evolved universal terrestrial radio access (E-UTRA), LTE-advanced (LTE-A), LTE-Pro, high-rate packet data (HRPD) of 3GPP2, ultra-mobile broadband (UMB), and IEEE 802.16e. In addition, a communication standard of 5G or NR is being generated as a 5G wireless communication system.

In the 5G or NR system, which is a representative example of a broadband wireless communication system, an orthogonal frequency-division multiplexing (OFDM) scheme is employed in a downlink and an uplink. Specifically, a cyclic-prefix OFDM (CP-OFDM) scheme is employed in the down link, and a discrete Fourier transform spreading OFDM (DFT-S-OFDM) scheme is employed in addition to CP-OFDM in the uplink. The uplink refers to a radio link through which a terminal transmits data or control signals to a base station, and the downlink refers to a radio link through which the base station transmits data or control signals to the terminal. In such a multiple-access method, data or control information of each user can be separated by performing assignment and operations so that time-frequency resources to which data or control information to be carried for each user do not overlap so that orthogonality is established.

The 5G or NR system employs an HARQ scheme in which the physical layer retransmits corresponding data when a decoding failure occurs in initial transmission. In the HARQ scheme, when the receiver fails to accurately decode data, the receiver transmits information (a negative acknowledgement (NACK)) notifying the transmitter of the decoding failure, so that the transmitter can retransmit the corresponding data in the physical layer. The receiver improves the data reception performance by combining the data retransmitted by the transmitter with data that has previously failed to be decoded. In addition, when the receiver correctly decodes the data, the receiver transmits information (an ACK) notifying the transmitter of successful decoding so that the transmitter can transmit new data.

Meanwhile, the NR access technology system, a new 5G communication, is designed to allow various services to be freely multiplexed in time and frequency resources, and accordingly, waveforms, numerology, and reference signals can be allocated dynamically or freely according to the requirements of the corresponding service. Meanwhile, in the 5G or NR system, the types of supported services may be divided into categories such as eMBB, mMTC, and URLLC. The eMBB is a service aiming at high-speed transmission of high-capacity data, the mMTC is a service aiming at minimizing terminal power and connecting multiple terminals, and the URLLC is a service aiming at high reliability and low latency. Different requirements may be applied according to the type of service applied to the terminal.

In this disclosure, each term is defined based on each function and may vary according to the intention or custom of users or operators. Hereinafter, the base station performs resource allocation of the terminal, and may be at least one of a gNode B (gNB), an eNode B (eNB), a Node B, a radio access unit, a base station controller, or a node on the network. The terminal may include a user equipment (UE), a mobile station (MS), a cellular phone, a smart phone, a computer, or a multimedia system capable of performing a communication function. Hereinafter, an NR system is described as an example, but the disclosure is not limited thereto, and embodiments of the disclosure may be applied to various communication systems having similar technical backgrounds or channel types. In addition, the embodiments may be applied to other communication systems through some modifications without significantly departing from the scope of the disclosure, as determined by a person skilled in the art.

In this disclosure, the terms of a conventional physical channel and a signal may be used interchangeably with data or control signals. For example, the PDSCH is a physical channel through which data is transmitted, but in the disclosure, the PDSCH may be referred to as data. That is, PDSCH transmission/reception may be understood as data transmission/reception.

In this disclosure, higher signaling (i.e., higher layer signaling) is a signal transmission method in which signals are transmitted from a base station to a terminal using a downlink data channel of a physical layer, or from a terminal to a base station using an uplink data channel of a physical layer, and may be referred to as radio resource control (RRC) signaling or a medium access control (MAC) control element (CE).

As research on a 5G communication system has recently progressed, various methods for scheduling communication with a terminal are being discussed. Accordingly, an efficient scheduling and data transmission/reception scheme in consideration of the characteristics of a 5G communication system is required. In order to provide a plurality of services to a user in a communication system, a method of providing each service within the same time period according to the characteristics of the corresponding service and an apparatus using the same are required.

In general, the terminal needs to receive separate control information from the base station in order to transmit or receive data to or from the base station. However, in the case of periodic traffic or a service type requiring low delay and/or high reliability, it may be possible to transmit or receive data without the additional control information.

In this disclosure, a method of transmitting or receiving data without separate control information is referred to as a configured grant-based data transmission method. "Configured grant" may be used interchangeably with "grant-free" or "configured scheduling". A method of receiving or transmitting data after receiving the data transmission resource setting and related information configured through control information may be referred to as a first signal transmission/reception type, and a method of transmitting or receiving data, based on preconfigured information without control information may be referred to as a second signal transmission/reception type. For the second signal transmission/reception type, a preconfigured resource region periodically exists, and in these regions, there are an uplink type 1 grant (UL type 1 grant), which is a method configured only with a higher signal, and an uplink type 2 grant (UL type 2 grant) (or SPS), which is a combination of a higher signal and an L1 signal (that is, DCI). In the case of the UL type 2 grant (or SPS), some information is a higher signal, and whether data is actually transmitted is determined by the L1 signal. Here, the L1 signal may be divided into a signal indicating activation of a resource set as a higher signal and a signal indicating release of the activated resource again.

106. The length of the subframe may be defined as 1.0 millisecond (ms), and the radio frame 114 may be defined as 10 ms. The minimum transmission unit in the frequency domain is a subcarrier, and the bandwidth of the entire system transmission band may be composed of a total of $N_{BW}$ subcarriers 110. However, these specific values may be variably applied depending on the system.

The basic unit of the time-frequency resource domain is a resource element (RE) 112, and may be expressed as an OFDM symbol index and a subcarrier index. A resource block (RB) 108 may be defined as $N_{RB}$ consecutive subcarriers 110 in the frequency domain.

In general, the minimum transmission unit of data is an RB unit. In a 5G or NR system, generally $N_{symb}$=14 and $N_{RB}$=12, and $N_{BW}$ may be proportional to the bandwidth of the system transmission band. The data rate increases in proportion to the number of RBs scheduled for the terminal. In a 5G or NR system, in the case of a frequency division duplex (FDD) system operating by dividing downlink and uplink into frequencies, the downlink transmission bandwidth and the uplink transmission bandwidth may be different from each other. The channel bandwidth represents the RF bandwidth corresponding to the system transmission bandwidth. Table 1 below shows the correspondence between the system transmission bandwidth and the channel bandwidth defined in the LTE system, which is a 4G wireless communication, before the 5G or NR system. For example, in an LTE system having a 10 megahertz (MHz) channel bandwidth, a transmission bandwidth is composed of 50 RBs.

TABLE 1

| Channel bandwidth $BW_{Channel}$ [MHz] | 1.4 | 3 | 5 | 10 | 15 | 20 |
|---|---|---|---|---|---|---|
| Transmission bandwidth configuration NRB | 6 | 15 | 25 | 50 | 75 | 100 |

In a 5G or NR system, a channel bandwidth wider than the channel bandwidth of LTE shown in Table 1 may be employed. Table 2 shows the correspondence between system transmission bandwidth, channel bandwidth, and subcarrier spacing (SCS) in a 5G or NR system.

TABLE 2

| SCS [kHz] | Channel bandwidth, $BW_{Channel}$ [MHz] | | | | | | | | | |
|---|---|---|---|---|---|---|---|---|---|---|
|  | 5 | 10 | 15 | 20 | 25 | 40 | 50 | 60 | 80 | 100 |
| Maximum Transmission bandwidth NRB | 15 | 25 | 52 | 79 | 106 | 133 | 216 | 270 | N.A. | N.A. | N.A. |
|  | 30 | 11 | 24 | 38 | 51 | 65 | 106 | 133 | 162 | 217 | 273 |
|  | 60 | N.A. | 11 | 18 | 24 | 31 | 51 | 65 | 79 | 107 | 135 |

In the disclosure, when the DL SPS transmission period is aperiodic or is less than 1 slot, a semi-static HARQ-ACK codebook and a dynamic HARQ-ACK codebook determining method, and a method of transmitting HARQ-ACK information corresponding thereto are included.

FIG. 1 is a diagram illustrating a transmission structure in a time-frequency domain, which is a radio resource domain of a 5G or NR system, according to an embodiment.

Referring to FIG. 1, in the radio resource domain, the horizontal axis represents the time domain and the vertical axis represents the frequency domain. The minimum transmission unit in the time domain is an OFDM symbol, and $N_{symb}$ OFDM symbols 102 are collected to form one slot In a 5G or NR system, scheduling information for downlink data or uplink data is transmitted from the base station to the terminal through DCI. The DCI is defined according to various formats, and may be indicate whether the DCI is scheduling information (UL grant) for uplink data, scheduling information (DL grant) for downlink data, whether the DCI is compact DCI having a small size of control information, whether spatial multiplexing using multiple antennas is applied, whether the DCI is DCI for power control, and the like according to each format. For example, DCI format 1_1, which is scheduling control information (DL grant) for downlink data, may include at least one of the following types of control information:

Carrier indicator: This indicates a transmission frequency.
DCI format indicator: This is an indicator that identifies whether the DCI is for downlink or uplink.
Bandwidth part (BWP) indicator: This indicates which BWP is used from transmission.
Frequency domain resource allocation: This indicates an RB in the frequency domain allocated for data transmission. The expressed resources are determined according to the system bandwidth and resource allocation method.
Time domain resource allocation: This indicates the OFDM symbol and slot in which the data related channel is to be transmitted.
Virtual RB (VRB)-to-physical RB (PRB) mapping: This indicates how to map a VRB index and a PRB index.
Modulation and coding scheme (MCS): This indicates the modulation scheme and coding rate used for data transmission. That is, it is possible to indicate a coding rate value that can indicate a transport block size (TBS) and channel coding information along with information on quadrature phase shift keying (QPSK), 16 quadrature amplitude modulation (QAM), 64QAM, or 256QAM.
Code block group (CBG) transmission information: This indicates information on which a CBG is transmitted when a CBG retransmission is configured.
HARQ process number: This indicates the HARQ process number.
New data indicator: This indicates whether HARQ is an initial transmission or a retransmission.
Redundancy version (RV): This indicates a redundancy version of the HARQ.
Physical uplink control channel (PUCCH) resource indicator: This indicates a PUCCH resource for transmitting ACK/NACK information for downlink data.
PDSCH-to-HARQ feedback timing indicator: This indicates a slot in which ACK/NACK information for downlink data is transmitted.
Transmit power control (TPC) command for PUCCH: This indicates a transmit power control command for PUCCH, which is an uplink control channel.

In the case of PUSCH transmission, time domain resource allocation may be transmitted by information on a slot in which a PUSCH is transmitted and a starting OFDM symbol position S in a corresponding slot and the number of OFDM symbols L to which the PUSCH is mapped. The aforementioned S may be a relative position from the start of the slot, L may be the number of consecutive OFDM symbols, and S and L may be determined from a start and length indicator value (SLIV) defined as follows.

If $(L-1) \leq 7$ then $$SLIV = 14 * (L-1) + S$$

else $$SLIV = 14 * (14 - L + 1) + (14 - 1 - S)$$

where $0 < L \leq 14 - S$

In a 5G or NR system, a table including information on an SLIV value, a PUSCH mapping type, and a slot in which a PUSCH is transmitted may be configured in one row through RRC configuration. Thereafter, in the time domain resource allocation of DCI, by indicating an index value in a configured table, the base station may transfer the SLIV value, the PUSCH mapping type, and information on the slot in which the PUSCH is transmitted to the terminal. This method is also applied to the PDSCH.

Specifically, when the base station indicates to the terminal the time resource allocation field index m included in the DCI scheduling the PDSCH, this informs the combination of DRMS Type A position information corresponding to m+1, PDSCH mapping type information, slot index K0, data resource start symbol S, and data resource allocation length L in a table representing time domain resource allocation information. As an example, Table 3, below, is a table including PDSCH time domain resource allocation information based on a normal cyclic prefix.

TABLE 3

| Row index | dmrs-TypeA-Position | PDSCH mapping type | $K_0$ | S | L |
|---|---|---|---|---|---|
| 1 | 2 | Type A | 0 | 2 | 12 |
|   | 3 | Type A | 0 | 3 | 11 |
| 2 | 2 | Type A | 0 | 2 | 10 |
|   | 3 | Type A | 0 | 3 | 9 |
| 3 | 2 | Type A | 0 | 2 | 9 |
|   | 3 | Type A | 0 | 3 | 8 |
| 4 | 2 | Type A | 0 | 2 | 7 |
|   | 3 | Type A | 0 | 3 | 6 |
| 5 | 2 | Type A | 0 | 2 | 5 |
|   | 3 | Type A | 0 | 3 | 4 |
| 6 | 2 | Type B | 0 | 9 | 4 |
|   | 3 | Type B | 0 | 10 | 4 |
| 7 | 2 | Type B | 0 | 4 | 4 |
|   | 3 | Type B | 0 | 6 | 4 |
| 8 | 2,3 | Type B | 0 | 5 | 7 |
| 9 | 2,3 | Type B | 0 | 5 | 2 |
| 10 | 2,3 | Type B | 0 | 9 | 2 |
| 11 | 2,3 | Type B | 0 | 12 | 2 |
| 12 | 2,3 | Type A | 0 | 1 | 13 |
| 13 | 2,3 | Type A | 0 | 1 | 6 |
| 14 | 2,3 | Type A | 0 | 2 | 4 |
| 15 | 2,3 | Type B | 0 | 4 | 7 |
| 16 | 2,3 | Type B | 0 | 8 | 4 |

In Table 3, the dmrs-typeA-Position is a field indicating the position of a symbol at which a demodulation reference signal (DMRS) is transmitted within a slot indicated by a system information block (SIB), which is one of terminal common control information. Possible values for this field are 2 or 3. When the number of symbols constituting one slot is 14 and the first symbol index is 0, 2 means the third symbol and 3 means the fourth symbol. In Table 3, the PDSCH mapping type is information indicating the location of the DMRS in the scheduled data resource region. When the PDSCH mapping type is A, the DMRS is always transmitted/received at the symbol position determined in dmrs-typeA-Position regardless of the allocated data time domain resource. When the PDSCH mapping type is B, the DMRS is always transmitted/received in the first symbol of the allocated data time domain resources. In other words, PDSCH mapping type B does not use dmrs-typeA-Position information.

In Table 3, $K_0$ denotes an offset of a slot index to which a PDCCH to which DCI is transmitted belongs and a slot index to which a PDSCH or PUSCH scheduled in the DCI belongs. For example, when the slot index of the PDCCH is n, the slot index of the PDSCH or PUSCH scheduled by the DCI of the PDCCH is n+$K_0$. In Table 3, S denotes a start symbol index of a data time domain resource within one slot. The range of possible S values is usually 0 to 13 based on a normal cyclic prefix. In Table 3, L means the length of a data time domain resource interval within one slot. Possible values of L range from 1 to 14.

In the 5G or NR system, PUSCH mapping types are defined as type A and type B. In PUSCH mapping type A, the first OFDM symbol among DMRS OFDM symbols is located in the second or third OFDM symbol in the slot. In PUSCH mapping type B, the first OFDM symbol among the DMRS OFDM symbols is located in the first OFDM symbol in the time domain resource allocated for PUSCH transmission. The above-described PUSCH time domain resource allocation method may be equally applicable to PDSCH time domain resource allocation.

The DCI may be transmitted on a PDCCH (or control information, hereinafter, which may be used interchangeably) through channel coding and modulation processes. In general, the DCI is scrambled with a specific radio network temporary identifier (RNTI) (or terminal identifier) for each terminal independently, a cyclic redundancy check (CRC) is added, is channel-coded, and then is transmitted by configuring each independent PDCCH. The PDCCH is transmitted by being mapped to a control resource set (CORESET) configured to the terminal.

Downlink data may be transmitted on a PDSCH, which is a physical channel for transmitting downlink data. The PDSCH may be transmitted after the control channel transmission period, and scheduling information such as a specific mapping position and modulation scheme in the frequency domain is determined based on the DCI transmitted through the PDCCH.

Through the MCS among the control information constituting DCI, the base station notifies the terminal of the modulation method applied to the PDSCH to be transmitted and the size of the data to be transmitted (transport block size (TBS)). In an embodiment, the MCS may consist of 5 bits or more or less bits. The TBS corresponds to a size before channel coding for error correction is applied to data (a transport block (TB)) intended to be transmitted by the base station.

In the disclosure, the TB may include a MAC header, a MAC CE, one or more MAC service data units (SDUs), and padding bits. Alternatively, the TB may represent a unit of data dropped from the MAC layer to a physical layer or a MAC protocol data unit (PDU).

The modulation schemes supported by the 5G or NR system are QPSK, 16QAM, 64QAM, and 256QAM, and each modulation order ($Q_m$) corresponds to 2, 4, 6, and 8. That is, in the case of QPSK modulation, 2 bits per symbol can be transmitted; in the case of 16QAM modulation, 4 bits per OFDM symbol can be transmitted; in the case of 64QAM modulation, 6 bits per symbol can be transmitted; and in the case of 256QAM modulation, 8 bits per symbol can be transmitted.

When the PDSCH is scheduled by the DCI, HARQ-ACK information indicating success or failure of decoding for the PDSCH is transmitted from the terminal to the base station through the PUCCH. Such HARQ-ACK information is transmitted in a slot indicated by the PDSCH-to-HARQ feedback timing indicator included in the DCI scheduling the PDSCH, and values mapped to the PDSCH-to-HARQ feedback timing indicator of 1 to 3 bits are configured by higher layer signals as shown in Table 4, below. When the PDSCH-to-HARQ feedback timing indicator indicates k, the terminal transmits HARQ-ACK information in slot n in which PDSCH is transmitted, after k slots, that is, in n+k slots.

TABLE 4

PDSCH-to-HARQ_feedback timing indicator

| 1 bit | 2 bits | 3 bits | Number of slots k |
|---|---|---|---|
| '0' | '00' | '000' | $1^{st}$ value provided by dl-DataToUL-ACK |
| '1' | '01' | '001' | $2^{nd}$ value provided by dl-DataToUL-ACK |
|  | '10' | '010' | $3^{rd}$ value provided by dl-DataToUL-ACK |
|  | '11' | '011' | $4^{th}$ value provided by dl-DataToUL-ACK |
|  |  | '100' | $5^{th}$ value provided by dl-DataToUL-ACK |
|  |  | '101' | $6^{th}$ value provided by dl-DataToUL-ACK |
|  |  | '110' | $7^{th}$ value provided by dl-DataToUL-ACK |
|  |  | '111' | $8^{th}$ value provided by dl-DataToUL-ACK |

When the PDSCH-to-HARQ feedback timing indicator is not included in DCI format 1_1 for scheduling the PDSCH, the terminal transmits HARQ-ACK information in slot n+k according to the k value configured as higher layer signaling for HARQ-ACK information. When transmitting HARQ-ACK information on the PUCCH, the terminal transmits the HARQ-ACK information to the base station using the PUCCH resource determined based on the PUCCH resource indicator included in the DCI scheduling the PDSCH. In this case, the ID of the PUCCH resource mapped to the PUCCH resource indicator may be configured through higher layer signaling.

Figure 2:
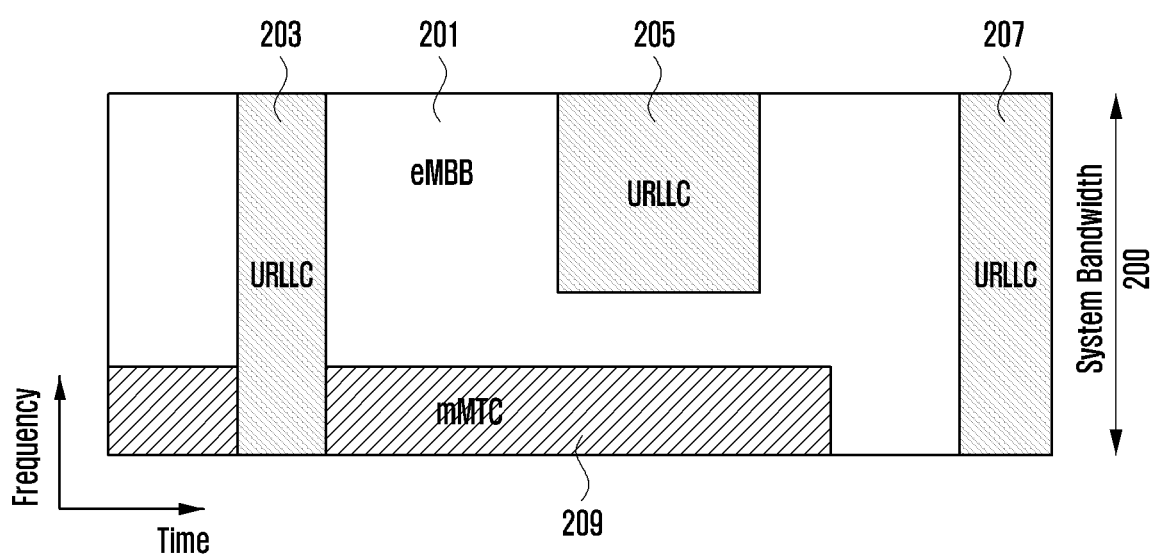
FIG. 2 is a diagram illustrating an example of allocating data for enhanced mobile broadband (eMBB), ultra-reliable and low-latency communications (URLLC), and massive machine type communications (mMTC) in a time-frequency resource domain in a 5G or NR system, according to an embodiment.

FIG. 2 is a diagram illustrating an example of allocating data for eMBB, URLLC, and mMTC in a time-frequency resource domain in a 5G or NR system, according to an embodiment.

Referring to FIG. 2, data for eMBB, URLLC, and mMTC may be allocated in the entire system frequency band 200. When first URLLC data 203, second URLLC data 205, or third URLLC data 207 are generated and transmission is required while the eMBB data 201 and the mMTC data 209 are allocated and transmitted in a specific frequency band, the transmitter may transmit the first URLLC data 203, the second URLLC data 205, or the third URLLC data 207 without emptying or transmitting the portion to which the eMBB data 201 and the mMTC data 209 are already allocated. Among the services described above, since URLLC needs to reduce a delay time, URLLC data may be allocated and transmitted to a portion of resources to which eMBB or mMTC data are allocated. When URLLC data is additionally allocated and transmitted in a resource to which eMBB data is allocated, eMBB data may not be transmitted in overlapping time-frequency resources, and thus transmission performance of eMBB data may be lowered. That is, eMBB data transmission failure due to URLLC allocation may occur.

Figure 3:
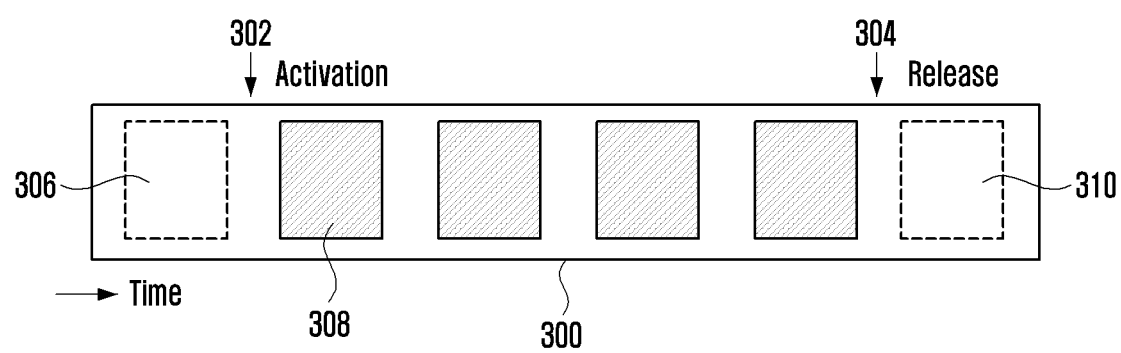
FIG. 3 is a diagram illustrating a grant-free transmission/reception operation, according to an embodiment.

FIG. 3 is a diagram illustrating a grant-free transmission/reception operation, according to an embodiment.

The grant-free transmission/reception operation of the terminal may include a first signal transmission/reception type for performing downlink data reception according to information configured only as a higher signal from a base station, and a second signal transmission/reception type for performing downlink data reception according to transmission configuration information indicated by a higher signal and an L1 signal.

A method of operating a terminal for a second signal transmission/reception type will be described. In the disclosure, SPS, which is a second signal type for receiving downlink data, refers to grant-free (non-approval)-based PDSCH transmission in downlink. In the DL SPS, the terminal may receive grant-free PDSCH transmission, based on higher signal configuration and additional configuration information indicated by DCI.

DL SPS refers to downlink semi-persistent scheduling, and is a method in which the base station periodically transmits and receives downlink data information, based on information configured by higher signaling without scheduling specific DCI to the terminal. The DL SPS can be applied in voice over Internet protocol (VoIP) or periodic traffic situations. Alternatively, resource configuration for DL SPS is periodic, but data actually generated may be aperiodic. In this case, since the terminal does not know whether actual data is generated from the periodically configured resource, it may be possible to perform the following three (3) types of operations.

Method 3-1: For a periodically configured DL SPS resource region, the terminal transmits HARQ-ACK information on the demodulation/decoding result for the received data to the base station in the uplink resource region corresponding to the resource region.

Method 3-2: With respect to the periodically configured DL SPS resource region, when DMRS or signal detection for data is successfully performed, the terminal transmits HARQ-ACK information for a result of demodulation/decoding of received data to the base station in an uplink resource region corresponding to the resource region.

Method 3-3: When decoding/demodulation is successful (i.e., ACK is generated) for the periodically configured DL SPS resource region, the terminal transmits HARQ-ACK information for the demodulation/decoding result for the received data to the base station in the uplink resource region corresponding to the corresponding resource region.

In Method 3-1, even if the actual base station does not transmit downlink data for the DL SPS resource region, the terminal always transmits HARQ-ACK information to the uplink resource region corresponding to the DL SPS resource region. In Method 3-2, since the base station does not know when to transmit data to the DL SPS resource region, in a situation in which the terminal knows whether data is transmitted or received, such as successful DMRS detection or CRC detection, it may be possible to transmit HARQ-ACK information. In Method 3-3, only when data demodulation/decoding is successful, the terminal transmits HARQ-ACK information to the uplink resource region corresponding to the corresponding DL SPS resource region.

Among the above-described methods, a terminal may always support only one or two or more methods. It may be possible to select one of the above methods as 3GPP standard or higher signal. For example, when the base station instructs method 3-1 as a higher signal, the terminal may be able to perform HARQ-ACK information for a corresponding DL SPS based on method 3-1. Alternatively, it may be possible to select one method according to the higher DL SPS configuration information. For example, when the transmission period in the DL SPS higher configuration information is n slots or more, the terminal applies method 3-1, and vice versa, the terminal may apply method 3-3. In this example, the transmission period is given as an example, but it may be possible for a method to be applied by an MCS table, DMRS configuration information, and resource configuration information.

The terminal performs downlink data reception in a downlink resource region configured for higher signaling. It may be possible to perform activation or release of the downlink resource region set as the higher signaling through L1 signaling.

FIG. 3 illustrates the operation for the DL SPS. The terminal configures the next DL SPS configuration information from the higher-level signal.

Periodicity is a DL SPS transmission period. nrofHARQ-Processes is a number of HARQ processes for the DL SPS. n1PUCCH-AN is HARQ resource configuration information for the DL SPS. An mcs-Table is MCS table setting information applied to the DL SPS.

In the disclosure, all of the DL SPS configuration information may be configured for each primary cell (Pcell) or secondary cell (Scell), and may also be configured for each frequency band section (BWP). In addition, it may be possible to configure one or more DL SPSs for each BWP for each specific cell.

In FIG. 3, the terminal determines grant-free transmission/reception configuration information 300 through reception of a higher signal for the DL SPS. The terminal may transmit/receive data to the resource region 308 configured after receiving 302 the DCI indicating activation of DL SPS, and cannot transmit/receive data to the resource region 306 before receiving the corresponding DCI. In addition, the terminal cannot receive data for the resource region 310 after receiving 304 the DCI indicating release.

The terminal verifies the DL SPS assignment PDCCH when both of the following two conditions are satisfied for SPS scheduling activation or release.

Condition 1: When the CRC bit of the DCI format transmitted from the PDCCH is scrambled with the CS-RNTI configured as higher signaling.

Condition 2: When the new data indicator (NDI) field for the activated transport block is configured as 0.

When some of the fields constituting the DCI format transmitted through the DL SPS assignment PDCCH are the same as those shown in Table 5 or Table 6, below, the terminal determines that the information in the DCI format is a valid activation or a valid release of the DL SPS. As an example, when the terminal detects a DCI format including the information shown in Table 5, the terminal determines that the DL SPS has been activated. Additionally or alternatively, when the terminal detects the DCI format including the information shown in Table 6, the terminal determines that the DL SPS has been released.

When some of the fields constituting the DCI format transmitted through the DL SPS assignment PDCCH are not the same as those shown in Table 5 (special field configuration information for activating DL SPS) or Table 6 (special field configuration information for releasing DL SPS), the terminal determines that the DCI format is detected as a CRC that does not match.

TABLE 5

|  | DCI format 1_0 | DCI format 1_1 |
| --- | --- | --- |
| HARQ process number | set to all '0's | set to all '0's |
| Redundancy version | set to '00' | For the enabled transport block: set to '00' |

TABLE 6

|  | DCI format 1_0 |
| --- | --- |
| HARQ process number | set to all '0's |
| Redundancy version | set to '00' |
| Modulation and coding scheme | set to all '1's |
| Resource block assignment | set to all '1's |

When the terminal receives the PDSCH without receiving the PDCCH or receives the PDCCH indicating SPS PDSCH release, the terminal generates a corresponding HARQ-ACK information bit. In addition, in at least Rel-15 NR, the terminal does not expect to transmit HARQ-ACK information for reception of two or more SPS PDSCHs in one PUCCH resource. In other words, in at least Rel-15 NR, the terminal includes only HARQ-ACK information for one SPS PDSCH reception in one PUCCH resource.

The DL SPS may also be configured in a Pcell and an Scell. Parameters that can be configured for DL SPS higher level signaling are as follows.

Periodicity: Transmission period of DL SPS.
nrofHARQ-processes: The number of HARQ processes that can be configured for DL SPS.
n1PUCCH-AN: PUCCH HARQ resource for DL SPS, the base station configures the resource to PUCCH format 0 or 1.

Table 5 and Table 6, described above, are fields available in a situation in which only one DL SPS can be set per cell and per BWP. In a situation in which multiple DL SPSs are configured for each cell and for each BWP, the DCI field for activating (or releasing) each DL SPS resource may be different. The disclosure provides a method for solving such a situation.

In the disclosure, not all DCI formats described in Table 5 and Table 6 are used to activate or release DL SPS resources. For example, DCI format 1_0 and DCI format 1_1 used to schedule a PDSCH may be used for activating DL SPS resources. In addition, DCI format 1_0, used to schedule the PDSCH, may be used for releasing DL SPS resources.

Figure 4:
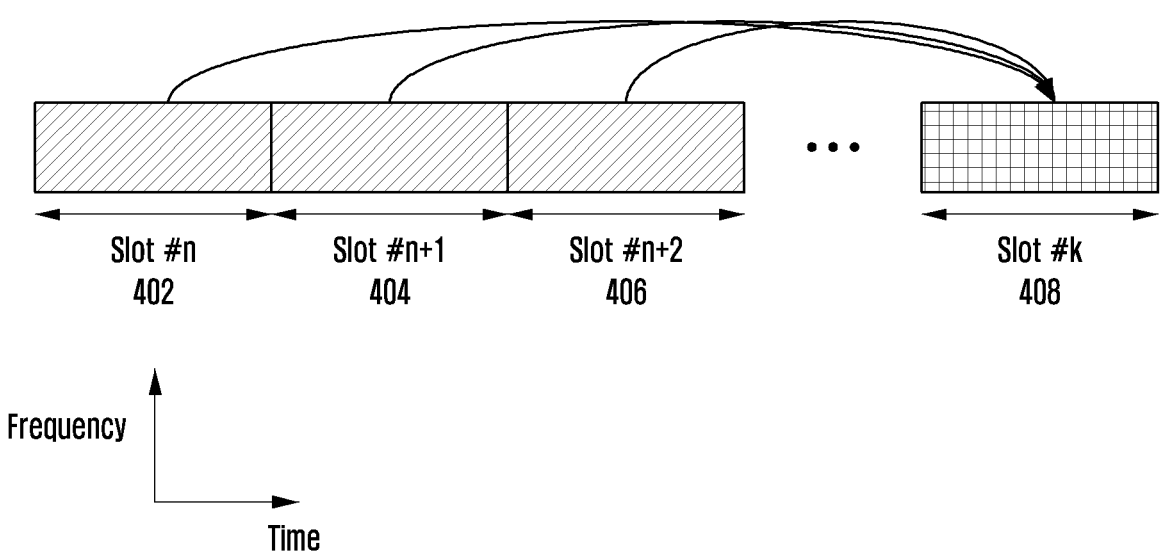
FIG. 4 is a diagram illustrating a method of configuring a semi-static hybrid automatic repeat request (HARQ)-acknowledgement (ACK) codebook in an NR system, according to an embodiment.

FIG. 4 is a diagram illustrating a method of configuring a semi-static HARQ-ACK codebook in an NR system, according to an embodiment.

In a situation in which the number of HARQ-ACK PUCCHs that the terminal can transmit within one slot is limited to one, when the terminal receives the higher configuration of the semi-static HARQ-ACK codebook, the terminal reports HARQ-ACK information for PDSCH reception or SPS PDSCH release in the HARQ-ACK codebook in the slot indicated by the value of the PDSCH-to-HARQ_feedback timing indicator in DCI format 1_0 or DCI format 1_1. The terminal reports the HARQ-ACK information bit value in the HARQ-ACK codebook as NACK in a slot not indicated by the PDSCH-to-HARQ_feedback timing indicator field in DCI format 1_0 or DCI format 1_1. If the terminal reports only one SPS PDSCH release or HARQ-ACK information for one PDSCH reception in $M_{A,c}$ cases for candidate PDSCH reception, and the report is scheduled by DCI format 1_0 including information indicating 1 in the counter DACI field in the Pcell, the terminal determines one HARQ-ACK codebook for the corresponding SPS PDSCH release or the corresponding PDSCH reception.

Additionally, the HARQ-ACK codebook determination method, described below, is followed.

Assuming that the set of PDSCH reception candidate cases in the serving cell c is $M_{A,c}$, $M_{A,c}$ can be obtained in the following Pseudo-Code 1 steps.

Pseudo-Code 1

[Start]
Step Initialize j to 0 and $M_{A,c}$ to empty set. The HARQ-ACK transmission timing index k is initialized to 0.
Step 2: Configure R as a set of rows in a table including slot information to which PDSCH is mapped, start symbol information, number of symbols, or length information. If the PDSCH capable mapping symbol indicated by each value of R is configured as an uplink symbol according to the downlink and uplink configuration configured at the higher level, the corresponding row is deleted from R.
Step 3-1: If the terminal can receive one PDSCH for unicast in one slot, and R is not an empty set, one is added to the set $M_{A,c}$.
Step 3-2: If the terminal can receive more than one PDSCH for unicast in one slot, count the number of PDSCHs that can be allocated to different symbols in the calculated R and add the corresponding number to $M_{A,c}$.
Step 4: Start over from Step 2 by increasing k by 1.
[End]

Taking the above-described pseudo-code 1 as an example of FIG. 4, in order to perform HARQ-ACK PUCCH transmission in slot #k 408, all slot candidates capable of PDSCH-to-HARQ-ACK timing that can indicate slot #k 408 are considered. In FIG. 4, it is assumed that HARQ-ACK transmission is possible in slot #k 408 by a combination of PDSCH-to-HARQ-ACK timing that allows only PDSCHs scheduled in slot #n 402, slot #n+1 404, and slot #n+2 406. In addition, the maximum number of schedulable PDSCHs is derived for each slot based on time domain resource configuration information of the PDSCH that can be scheduled in slots 402, 404, and 406, and information indicating whether a symbol in the slot is downlink or uplink. For example, assuming that 2 PDSCHs in slot 402, 3 PDSCHs in slot 404, and 2 PDSCHs in slot 406 are each capable of maximum scheduling, the maximum number of PDSCHs included in the HARQ-ACK codebook transmitted in slot 408 is 7 in total. This is called the cardinality of the HARQ-ACK codebook.

Step 3-2 in a specific slot is described through Table 7, below.

TABLE 7

Default PDSCH time domain resource allocation (A) for normal CP

| Row index | dmrs-TypeA-Position | PDSCH mapping type | $K_0$ | S | L | Ending | Order |
| --- | --- | --- | --- | --- | --- | --- | --- |
| 1 | 2 | Type A | 0 | 0 | 12 | 13 | 1x |
|  | 3 | Type A | 0 | 3 | 11 | 13 | 1x |
| 2 | 2 | Type A | 0 | 2 | 10 | 11 | 1x |
|  | 3 | Type A | 0 | 3 | 9 | 11 | 1x |
| 3 | 2 | Type A | 0 | 2 | 9 | 10 | 1x |
|  | 3 | Type A | 0 | 3 | 8 | 10 | 1x |
| 4 | 2 | Type A | 6 | 2 | 7 | 8 | 1x |
|  | 3 | Type A | 0 | 3 | 6 | 8 | 1x |
| 5 | 2 | Type A | 0 | 0 | 5 | 6 | 1x |
|  | 3 | Type A | 0 | 3 | 4 | 6 | 1x |
| 6 | 2 | Type B | 0 | 9 | 4 | 12 | 2x |
|  | 3 | Type B | 0 | 10 | 4 | 13 | 3 |
| 7 | 2 | Type B | 0 | 4 | 4 | 7 | 1x |
|  | 3 | Type B | 0 | 6 | 4 | 9 | 2 |

TABLE 7-continued

Default PDSCH time domain resource allocation (A) for normal CP

| Row index | dmrs-TypeA-Position | PDSCH mapping type | $K_0$ | S | L | Ending | Order |
|---|---|---|---|---|---|---|---|
| 8 | 2,3 | Type B | 6 | 5 | 7 | 11 | 1x |
| 9 | 2,3 | Type B | 0 | 5 | 2 | 6 | 1x |
| 10 | 2,3 | Type B | 0 | 9 | 0 | 10 | 2x |
| 11 | 2,3 | Type B | 0 | 12 | 2 | 13 | 3x |
| 12 | 2,3 | Type A | 0 | 1 | 13 | 13 | 1x |
| 13 | 2,3 | Type A | 0 | 1 | 6 | 6 | 1x |
| 14 | 2,3 | Type A | 0 | 2 | 4 | 5 | 1 |
| 15 | 2,3 | Type B | 0 | 4 | 7 | 10 | 1x |
| 16 | 2,3 | Type B | 0 | 8 | 4 | 11 | 2x |

Table 7 is a table of time resource allocation in which the terminal operates by default before the terminal receives time resource allocation through a separate RRC signal. For reference, a PDSCH time resource allocation value is determined by dmrs-TypeA-Position, which is a common RRC signal of the terminal, in addition to indicating the row index value as a separate RRC. In Table 7 above, the ending column and the order column are values separately added for convenience of description, and may not actually exist. The ending column refers to the end symbol of the scheduled PDSCH, and the order column refers to a code position value located in a specific codebook in the semi-static HARQ-ACK codebook. Table 7 is applied to time resource allocation applied in DCI format 1_0 of the common search area of the PDCCH.

The terminal performs the following four (4) steps to determine the HARQ-ACK codebook by calculating the maximum number of non-overlapping PDSCHs in a specific slot.

Step 1: A PDSCH allocation value that ends first in a slot is searched for among all rows of the PDSCH time resource allocation table. In Table 7, it can be seen that row index 14 is the first to end. This is marked as 1 in the order column. In addition, the row index 14 and other row indices that overlap at least one symbol are marked as 1x in the Order column.

Step 2: Among the remaining row indices not displayed in the Order column, the PDSCH allocation value that is terminated first is searched. In Table 7, a row with a row index of 7 and a dmrs-TypeA-Position value of 3 corresponds to this. In addition, the row index and other row indexes that overlap at least one symbol are marked as 2x in the Order column.

Step 3: Step 2 is repeated and the order value is increased and displayed. For example, among the row indices not indicated in the Order column in Table 7, the PDSCH allocation value that is terminated first is searched. In Table 7, a row with a row index of 6 and a dmrs-TypeA-Position value of 3 corresponds to this. In addition, the row index and other row indices that overlap at least one symbol are marked as 3x in the Order column.

Step 4: If order is displayed in all row indices, all steps are ended. And the size of the corresponding order is the maximum number of PDSCHs that can be scheduled without overlapping time in the corresponding slot. The meaning of scheduling without time overlap means that different PDSCHs are scheduled with time division multiplexing (TDM).

In the Order column of Table 7, the maximum value of an order means the size of the HARQ-ACK codebook of the corresponding slot, and an order value means the HARQ-ACK codebook point where the HARQ-ACK feedback bit for the corresponding scheduled PDSCH is located. For example, row index 16 in Table 7 means that it exists in the second code position in the quasi-static HARQ-ACK codebook of size 3. If the set of PDSCH reception candidates (occasion for candidates PDSCH receptions) in the serving cell c is referred to as $M_{A,c}$, the terminal transmitting HARQ-ACK feedback may obtain $M_{A,c}$ in the steps of Pseudo-Code 1, above, or Pseudo-Code 2, below. The $M_{A,c}$ may be used to determine the number of HARQ-ACK bits to be transmitted by the terminal. Specifically, the HARQ-ACK codebook may be configured using the cardinality of the $M_{A,c}$ set.

Additionally or alternatively, items a) to d) to be considered for determining a quasi-static HARQ-ACK codebook (or type 1 HARQ-ACK codebook) may be as follows.

a) For a set of slot timing values $K_1$ associated with the active uplink bandwidth part (UL BWP):
   If the UE is configured to monitor PDCCH for DCI format 1_0 and is not configured to monitor PDCCH for DCI format 1_1 on serving cell c, $K_1$ is provided by the slot timing values {1, 2, 3, 4, 5, 6, 7, 8} for DCI format 1_0.
   If the UE is configured to monitor PDCCH for DCI format 1_1 for serving cell c, $K_1$ is provided by dl-DataToUL-ACK for DCI format 1_1.

b) On a set of row indexes R of a table that is provided either by a first set of row indexes of a table that is provided by PDSCH-TimeDomainResoumeAllocationList in PDSCH-ConfigCommon, by a default PDSCH time domain resource allocation A [6, TS 38.214], or by the union of the first set of row indexes and a second set of row indexes, if provided by PDSCH-TimeDomainResoumeAllocationList in PDSCH-Config, associated with the active downlink bandwidth part (DL BWP) and defining respective sets of slot offsets $K_0$, start and length indicators SLIV, and PDSCH mapping types for PDSCH reception is described in [6, TS 38.214].

c) The ratio $2^{\mu_{DL}-\mu_{UL}}$ between the downlink SCS configuration $\mu_{DL}$ and the uplink SCS configuration $\mu_{UL}$ are provided by subcarrierSpacing in BWP-Downlink and BWP-Uplink for the active DL BWP and the active UL BWP respectively d) If provided, TDD-UL-DL-ConfigurationCommon and TDD-UL-DL-ConfigDedicated are described in Sub-clause 11.1.

As another example, the pseudo-code for determining the HARQ-ACK codebook may be as follows.

Pseudo-Code 2

[Start]
For the set of slot timing values $K_1$, the terminal determines a set of $M_{A,c}$ occasions for candidate PDSCH receptions or SPS PDSCH releases according to the following pseudo-code. A location in the Type-1 HARQ-ACK codebook for HARQ-ACK information corresponding to a SPS PDSCH release is same as for a corresponding SIPS PDSCH reception.
Set j=0—index of occasion for candidate PDSCH reception or SPS PDSCH release
Set B=∅
Set $M_{A,c}$=∅
Set $c(K_1)$ to the cardinality of set $K_1$ Set k=0—index of slot timing values $K_{1,k}$, in descending order of the slot timing values, in set $K_1$ for serving cell c
while k<c($K_1$)
    if mod($n_U-K_{1,k}+1$, max($2^{\mu_{UL}-\mu_{DL}}$, 1))=0
Set $n_D$=0—index of a downlink slot within an uplink slot
while $n_D$<max ($2^{\mu_{DL}-\mu_{UL}}$, 1)
    Set R to the set of rows
    Set c(R) to the cardinality of R
    Set r=0—index of row in set R
    if slot $n_U$ starts at a same time as or after a slot for an active DL BWP change on serving cell c or an active UL BWP change on the PCell and slot $\lfloor(n_U-K_{1,k})*2^{\mu_{DL}-\mu_{UL}}\rfloor+n_D$ is before the slot for the active DL BWP change on serving cell c or the active UL BWP change on the PCell
        continue;
    else
    while r<c(R)
        if the UE is provided TDD-UL-DL-ConfigurationCommon or TDD-UL-DL-ConfigDedicated and, for each slot from slot $\lfloor(n_U-K_{1,k})*2^{\mu_{DL}-\mu_{UL}}\rfloor+n_D-N_{PDSCH}^{repeat}+1$ to slot $\lfloor(n_U-K_{1,k})*2^{\mu_{DL}-\mu_{UL}}\rfloor+n_D$, at least one symbol of the PDSCH time resource derived by row r is configured as uplink where $K_{1,k}$ is the k-th slot timing value in set $K_1$, $R=R/r;$ end if $r=r+1;$ end while
if the UE does not indicate a capability to receive more than one unicast PDSCH per slot and R≠∅,
$M_{A,c}=M_{A,c}\cup j;$ $j=j+1;$ The UE does not expect to receive SPS PDSCH release and unicast PDSCH in a same slot;
else
    Set c(R) to the cardinality of R
    Set m to the smallest last OFDM symbol index, as determined by the SLIV; among all rows of R
    while R≠∅
        Set r=0
        while r<c(R)
            if S≤m for start OFDM symbol index S for row r
                $b_{r,k,n_D}=j;$—index of occasion for candidate PDSCH reception or SPS PDSCH release associated with row r $R=R/r;$ $B = B \cup_{b_{r,k,n_D}};$ end if $r=r+1,$ end while
$M_{A,c}=M_{A,c}\cup j$ $j=j+1;$ Set m to the smallest last OFDM symbol index among all rows of R;
    end while
  end if
end if $n_D=n_D+1;$ end while
end if
k=k+1;
end while
[End]

In Pseudo-Code 2, the location of the HARQ-ACK codebook containing HARQ-ACK information for DCI indicating DL SPS release is based on the location where the DL SPS PDSCH is received. For example, if the start symbol in which the DL SPS PDSCH is transmitted starts from the 4th OFDM symbol on a slot basis and the length is 5 symbols, the HARQ-ACK information including the DL SPS release indicating release of the corresponding SPS is assumed to start from the 4th OFDM symbol of the slot in which the DL SPS release is transmitted and a PDSCH having a length of 5 symbols is mapped, and the corresponding HARQ-ACK information is determined through a PDSCH-to-HARQ-ACK timing indicator and a PUSCH resource indicator included in control information indicating DL SPS release. Additionally or alternatively, if the start symbol in which the DL SPS PDSCH is transmitted starts from the 4th OFDM symbol on a slot basis and the length is 5 symbols, the HARQ-ACK information including the DL SPS release indicating the release of the corresponding SPS is assumed to start from the 4th OFDM symbol of the slot indicated by the time domain resource allocation (TDRA) of DCI, which is DL SPS release, and a PDSCH having a length of 5 symbols is mapped, the corresponding HARQ-ACK information is determined through a PDSCH-to-HARQ-ACK timing indicator and a PUSCH resource indicator included in control information indicating DL SPS release.

Figure 5:
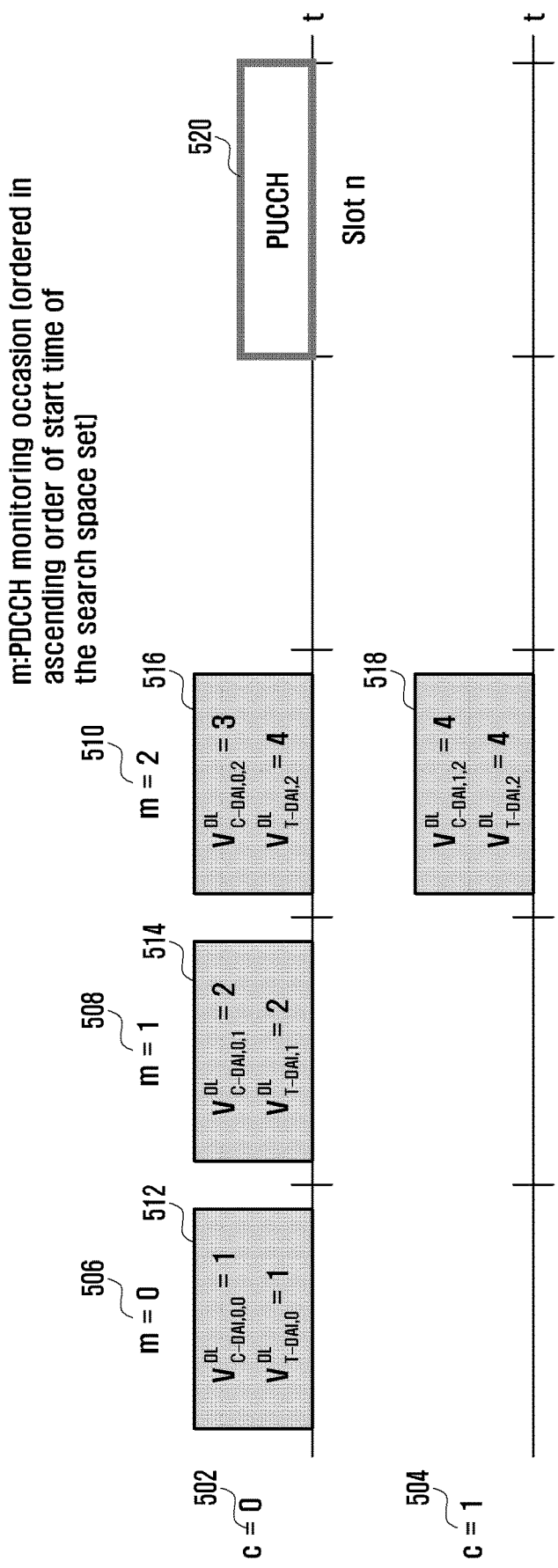
FIG. 5 is a diagram illustrating a method of configuring a dynamic HARQ-ACK codebook in an NR system, according to an embodiment.

FIG. 5 is a diagram illustrating a method of configuring a dynamic HARQ-ACK codebook in an NR system, according to an embodiment.

Based on the PDSCH-to-HARQ_feedback timing value for PUCCH transmission of HARQ-ACK information in slot n for PDSCH reception or SPS PDSCH release, and K0, which is the transmission slot location information of the PDSCH scheduled in DCI format 1_0 or 1_1, the terminal transmits HARQ-ACK information transmitted in one PUCCH in the corresponding slot n. Specifically, for the above-described HARQ-ACK information transmission, the terminal determines the PDSCH-to-HARQ_feedback timing and the HARQ-ACK codebook of the PUCCH transmitted in the slot determined by K0, based on the downlink assignment index (DAI) included in the DCI indicating PDSCH or SPS PDSCH release.

The DAI is composed of counter DAI and total DAI. The counter DAI is information indicating the location of the HARQ-ACK information corresponding to the PDSCH scheduled in DCI format 1_0 or DCI format 1_1 in the HARQ-ACK codebook. Specifically, the value of the counter DAI in DC format 1_0 or 1_1 indicates the accumulated value of PDSCH reception or SPS PDSCH release scheduled by DCI format 1_0 or DCI format 1_1 in a specific cell c. The above-described cumulative value is set based on a PDCCH monitoring occasion in which the scheduled DCI exists and a serving cell.

The total DAI is a value indicating the size of the HARQ-ACK codebook. Specifically, the value of total DAI refers to the total number of previously scheduled PDSCH or SPS PDSCH releases including the time when DCI is scheduled. In addition, the total DAI is a parameter used when HARQ-ACK information in a serving cell c includes HARQ-ACK information for a PDSCH scheduled in another cell including the serving cell c in carrier aggregation (CA) situation. In other words, there is no total DAI parameter in a system operating with one cell.

An example of the operation of the DAI is shown in FIG. 5. FIG. 5 shows changes in the values of the counter DAI (C-DAI) and the total DAI (T-DAI) indicated by DCI searched for each PDCCH monitoring occasion set for each carrier when the terminal transmits the HARQ-ACK codebook selected based on DAI in the $n^{th}$ slot of the carrier 0 502 to the PUCCH 520 in a situation in which two carriers are configured. First, in the DCI searched at m=0 506, the C-DAI and T-DAI each indicate a value of 1 in box 512. In the DCI searched at m=1 508, the C-DAI and T-DAI indicate a value 2 in box 514, respectively. In the DCI searched in carrier 0 (c=0 502) of m=2 510, the C-DAI indicates a value of 3 in box 516. The DCI searched in carrier 1 (c=1, 504) of m=2 510 indicates a value of 4 in box 518 by C-DAI. In this case, when carriers 0 and 1 are scheduled on the same monitoring occasion, all T-DAs are indicated as 4.

In FIGS. 4 and 5, the HARQ-ACK codebook determination operates in a situation in which only one PUCCH containing HARQ-ACK information is transmitted in one slot. This is called mode 1. As an example of how one PUCCH transmission resource is determined in one slot, when PDSCHs scheduled in different DCIs are multiplexed into one HARQ-ACK codebook in the same slot and transmitted, the PUCCH resource selected for HARQ-ACK transmission is determined as the PUCCH resource indicated by the PUCCH resource field indicated in the DCI that last scheduled the PDSCH. That is, the PUCCH resource indicated by the PUCCH resource field indicated in the DCI scheduled before the DCI is ignored.

A description below defines a method and apparatus for determining a HARQ-ACK codebook in a situation in which two or more PUCCHs containing HARQ-ACK information can be transmitted in one slot. This is called mode 2. The terminal may operate only in mode 1 (transmitting only one HARQ-ACK PUCCH in one slot) or mode 2 (transmitting one or more HARQ-ACK PUCCHs in one slot). Alternatively, a terminal supporting both mode 1 and mode 2 may configure the base station to operate in only one mode by higher-level signaling, or it may be possible to implicitly determine mode 1 and mode 2 by DCI format, RNTI, DCI specific field value, or scrambling. For example, the PDSCH scheduled in DCI format A and HARQ-ACK information associated therewith may be based on mode 1, and the PDSCH scheduled in DCI format B and HARQ-ACK information associated therewith may be based on mode 2.

Whether the HARQ-ACK codebook described above is semi-static in FIG. 4 or dynamic in FIG. 5 is determined by an RRC signal.

Figure 6:
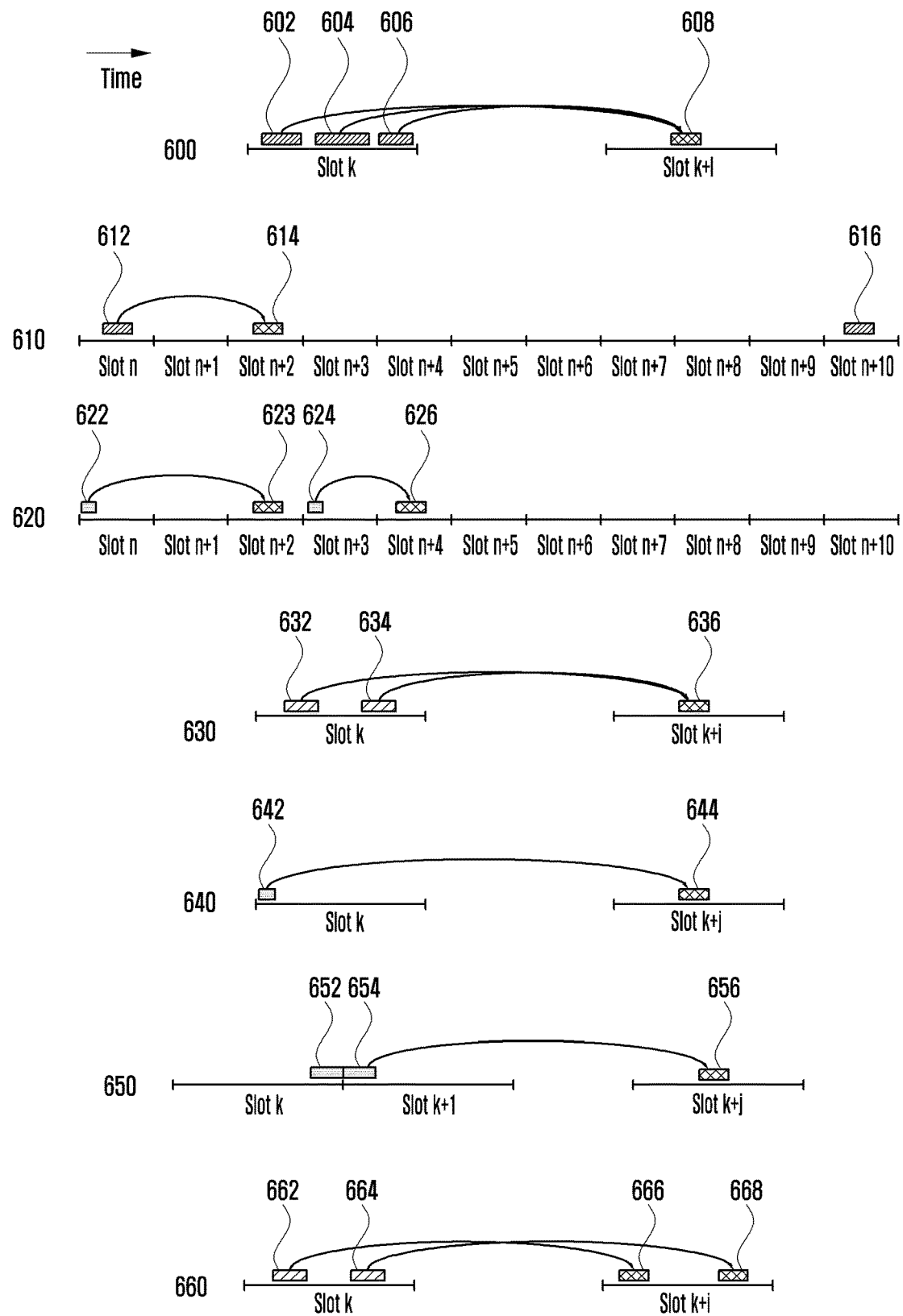
FIG. 6 is a diagram illustrating a HARQ-ACK transmission process for downlink semi-persistent scheduling (DL SPS), according to an embodiment.

FIG. 6 is a diagram illustrating a HARQ-ACK transmission process for DL SPS, according to an embodiment.

In FIG. 6, reference numeral 600 shows a situation in which PDSCHs 602, 604, and 606 that can be received maximally without overlapping in terms of time resources in slot k are mapped. For example, if the PDSCH-to-HARQ feedback timing indicator is not included in the DCI format for scheduling the PDSCH, the terminal transmits HARQ-ACK information 608 in slot k+1 according to the value of 1 configured by higher layer signaling for HARQ-ACK information. Therefore, the size of the quasi-static HARQ-ACK codebook in slot k+1 is equal to the number of maximum transmittable PDSCHs in slot k, and will be 3. In addition, when HARQ-ACK information for each PDSCH is 1 bit, the HARQ-ACK codebook of 600 to 608 of FIG. 6 will consist of a total of 3 bits of [X, Y, Z], and X will be ACK information for HARQ-ACK information for PDSCH 602, Y will be HARQ-ACK information for PDSCH 604, and Z will be HARQ-ACK information for PDSCH 606. If the PDSCH reception is successful, the corresponding information will be mapped to ACK, and otherwise, it will be mapped to NACK. In addition, when the actual DCI does not schedule the corresponding PDSCH, the terminal reports a NACK. Specifically, the location of the HARQ-ACK codebook located according to the SLIV of the PDSCH that can be scheduled in DCI may be different, and may be determined according to Table 7, Pseudo-Code 1 or Pseudo-Code 2. In reference numeral 610 of FIG. 6, HARQ-ACK transmission is shown in a situation in which downlink SPS is activated. In Rel-15 NR, the minimum period of the downlink SPS is 10 ms, and in reference numeral 610, since the length of one slot is 1 ms in the 15 kilohertz (kHz) subcarrier interval, the SPS PDSCH 612 will be transmitted in slot n, and the SPS PDSCH 616 will be transmitted in slot n+10 thereafter.

The HARQ-ACK information for each SPS PDSCH informs a period for the SPS, HARQ-ACK transmission resource information, an MCS table configuration, a number of HARQ processes as a higher signal, and then informs a frequency resource, a time resource, and an MCS value according to information included in the DCI format indicating activation of the corresponding SPS. For reference, a PUCCH resource through which HARQ-ACK information is transmitted may also be configured as a higher signal, and the PUCCH resource has the following properties.

Hopping presence

PUCCH format (start symbol and symbol length)

Here, the MCS table configuration and HARQ-ACK transmission resource information may not exist. When there is HARQ-ACK transmission resource information, Rel-15 NR supports PUCCH format 0 or 1 capable of transmitting up to 2 bits. However, in later releases, PUCCH formats 2, 3, or 4 of 2 bits or more can be sufficiently supported.

Since HARQ-ACK transmission resource information is included in the DL SPS higher signal configuration, the terminal may be able to ignore the PUCCH resource indicator in the DCI format indicating DL SPS activation. Alternatively, there may not be a PUCCH resource indicator field itself in the DCI format. On the other hand, if there is no HARQ-ACK transmission resource information in the DL SPS higher signal configuration, the terminal transmits HARQ-ACK information corresponding to the DL SPS to the PUCCH resource determined in the PUCCH resource indicator of the DCI format for activating the DL SPS. In addition, the difference between the slot in which the SPS PDSCH is transmitted and the slot in which the corresponding HARQ-ACK information is transmitted is determined by a value indicated by the PDSCH to HARQ-ACK feedback timing indicator of the DCI format for activating the DL SPS, or follows a specific value previously configured as a higher signal if there is no indicator. For example, as shown in 610 of FIG. 6, if the PDSCH to HARQ-ACK feedback timing indicator is 2, HARQ-ACK information for the SPS PDSCH 612 transmitted in slot n is PUCCH 614 of slot n+2. In addition, the PUCCH to which the corresponding HARQ-ACK information is transmitted may be configured as a higher signal, or a corresponding resource may be determined by an L1 signal indicating DL SPS activation. In addition, if it is assumed that up to three PDSCHs can be received as shown in 600 of FIG. 6 and that the time resource of the PDSCH 612 is the same as the PDSCH 604, the HARQ-ACK codebook location for the SPS PDSCH 612 transmitted through the PUCCH 614 is located at the $Y^{th}$ of [X, Y, Z].

If, when DCI indicating DL SPS release is transmitted, the terminal must transmit HARQ-ACK information for the corresponding DCI to the base station. However, in the case of a semi-static HARQ-ACK codebook, the size of the HARQ-ACK codebook and its location are determined by the time resource region to which the PDSCH is allocated and the slot interval between the PDSCH and HARQ-ACK indicated by the L1 signal or the higher signal (PDSCH to HARQ-ACK feedback timing), as described above in the disclosure. Therefore, when a DCI indicating DL SPS release is transmitted to a semi-static HARQ-ACK codebook, a specific rule is required rather than arbitrarily determining a location within the HARQ-ACK codebook. In Rel-15 NR, the location of HARQ-ACK information for DCI indicating DL SPS release is mapped in the same manner as the transmission resource region of the corresponding DL SPS PDSCH. As an example, reference numeral 620 of FIG. 6 shows a situation in which a DCI 622 indicating release of an activated DL SPS PDSCH is transmitted in slot n. When the PDSCH to HARQ-ACK feedback timing indicator included in the DCI 622 format indicates 2, the HARQ-ACK information for the DCI 622 will be transmitted to the PUCCH 623 of slot n+2. In this case, in the case of the location of the HARQ-ACK codebook, assuming that a preconfigured SPS PDSCH is scheduled in slot n, the terminal maps and transmits HARQ-ACK information for DCI 622 indicating DL SPS release at the HARQ-ACK codebook location corresponding to the corresponding SPS PDSCH. In this regard, the following two (2) methods are possible, and the base station and the terminal will transmit and receive the corresponding DCI in at least one method according to a standard or base station configuration.

Method 6-1-1: DCI indicating DL SPS release is transmitted only in a slot in which a preconfigured SPS PDSCH is to be transmitted.

For example, as shown in 620 of FIG. 6, if the SPS PDSCH is set to be transmitted in slot n, the terminal transmits the DCI 622 instructing release of the SPS PDSCH only in slot n, and assuming that the SPS PDSCH is transmitted in the slot in which HARQ-ACK information is transmitted, it is the same as the position of the slot to be determined. In other words, when the slot in which HARQ-ACK information for SPS PDSCH is transmitted is n+2, the slot in which HARQ-ACK information for DCI indicating DL SPS PDSCH release is transmitted is also n+2.

Method 6-1-2: DCI indicating DL SPS release is transmitted in any slot regardless of the slot in which the SPS PDSCH is transmitted.

For example, as shown in 620 of FIG. 6, when the SPS PDSCH is transmitted in slots n, n+10, n+20, . . . , the base station transmits a DCI 624 indicating release of the corresponding DL SPS PDSCH in slot n+3, and the value indicated in the PDSCH to HARQ-ACK feedback timing indicator included in the DCI is 1, or if there is no corresponding field and a value previously configured as a higher signal is 1, HARQ-ACK information 626 for DCI indicating DL SPS PDSCH release is transmitted and received in slot n+4.

There may be a case where the minimum period of the DL SPS is shorter than 10 ms. For example, if different equipment in a factory wirelessly requires data that requires high reliability and low latency, and the transmission period of the data is constant and the period itself is short, it should be shorter than the current 10 ms. Accordingly, the DL SPS transmission period may be determined in units of slots, symbols, or groups of symbols regardless of subcarrier intervals other than ms units. For reference, the minimum transmission period of the uplink configured grant PUSCH resource is 2 symbols.

Reference numeral 630 of FIG. 6 shows a situation in which a transmission period of a DL SPS is 7 symbols smaller than that of a slot. Since the transmission period is within one slot, up to two SPS PDSCHs 632 and 634 may be transmitted in slot k. If the value indicated by the PDSCH to HARQ-ACK feedback timing indicator is included in the DCI indicating SPS activation or there is no corresponding field, the HARQ-ACK information corresponding to the SPS PDSCH 632 and the SPS PDSCH 634 is transmitted in a slot according to a value previously set as a higher signal. For example, when the corresponding value is i, the terminal transmits HARQ-ACK information 636 for the SPS PDSCH 632 and the SPS PDSCH 634 in slot k+i. The location of the HARQ-ACK codebook included in the HARQ-ACK information should consider the transmission period as well as the TDRA, which is the time resource information for which the SPS PDSCH is scheduled. In the past, since only one SPS PDSCH could be transmitted per slot, the HARQ-ACK codebook location was determined based on TDRA, which is time resource information, without considering the transmission period, but when the DL SPS transmission period is smaller than the slot, time resource information TDRA and the transmission period should be considered together in order to determine the HARQ-ACK codebook location. Here, the TDRA refers to time domain resource allocation, and includes transmission start symbol and length information of SPS PDSCH. For example, if the DL SPS transmission period is 7 symbols and the start symbol of the DL SPS PDSCH determined by the TDRA is 2 and the length is 3, two DL SPS PDSCHs will exist in one slot as 630 of FIG. 6. That is, the first SPS PDSCH 632 is a PDSCH having OFDM symbol indices 2, 3, and 4 determined by the TDRA, and the second SPS PDSCH 634 is a PDSCH having OFDM symbol indices 9, 10, and 11 taking into account the TDRA and 7 symbols in transmission period. Accordingly, the second SPS PDSCH in the slot has the same length as the first SPS PDSCH, but the offset will be shifted by the transmission period. In summary, for quasi-static HARQ-ACK codebook generation or determination, in order to determine the location of the HARQ-ACK codebook for the SPS PDSCH in one slot, the terminal uses time resource allocation information when the SPS PDSCH transmission period is greater than 1 slot, and when the SPS PDSCH transmission period is less than 1 slot, the terminal considers time resource allocation information together with the SPS PDSCH transmission period.

When the SPS PDSCH transmission period is less than 1 slot, the SPS PDSCH may also span a slot boundary according to a combination of the transmission period and the TDRA. Reference numeral 650 of FIG. 6 shows an example in which the base station sets a format in which one SPS PDSCH beyond a slot boundary is divided into a PDSCH 652 and a PDSCH 654 and repeatedly transmitted. In this case, the PDSCH 652 and the PDSCH 654 can always have the same length or different lengths. In addition, only one HARQ-ACK information 656 for the SPS PDSCH composed of the PDSCH 652 and the PDSCH 654 is transmitted by the UE, and the slot serving as the reference is based on the slot k+1 in which the last repeated PDSCH 654 is transmitted.

An embodiment of a semi-static HARQ-ACK codebook mapping method for DCI indicating DL SPS release will now be described.

When the transmission period of the SPS PDSCH is less than 1 slot, when transmitting HARQ-ACK information for the DCI indicating release of the corresponding SPS PDSCH based on the semi-static HARQ-ACK codebook, the terminal maps the HARQ-ACK codebook for the corresponding DCI (i.e., DCI indicating release of the SPS PDSCH), based on at least one of the following five (5) methods.

Method 6-2-1: The position of the quasi-static HARQ-ACK codebook for HARQ-ACK information for the DCI indicating SPS PDSCH release is the same as the location of the HARQ-ACK codebook for the SPS PDSCH located first in terms of time resources among SPS PDSCHs received in one slot.

When the number of SPS PDSCHs in the slot in which the DCI indicating SPS PDSCH release is transmitted is 2 or more, the terminal maps and transmits HARQ-ACK information for the corresponding DCI to the position of the semi-static HARQ-ACK codebook for HARQ-ACK information of the SPS PDSCH, which is the first in time.

For example, if the maximum number of PDSCHs that can be transmitted/received without simultaneous PDSCH reception including SPS PDSCH in a slot in which a DCI indicating SPS PDSCH release is to be transmitted is 4, the HARQ-ACK codebook size for the corresponding slot is 4, and HARQ-ACK information for SPS PDSCH or PDSCH reception will be mapped to each location such as {1, 2, 3, 4}. If HARQ-ACK information is mapped at positions {2} and {3} for two SPS PDSCHs, respectively, HARQ-ACK information for DCI indicating release of the DL SPS PDSCH is mapped to position {2}.

Method 6-2-2: The position of the quasi-static HARQ-ACK codebook for HARQ-ACK information for the DCI indicating the release of the SPS PDSCH is the same as the location of the HARQ-ACK codebook for the SPS PDSCH located last from the viewpoint of time resources among SPS PDSCHs received within one slot.

If the number of SPS PDSCHs in the slot in which the DCI indicating the release of the SPS PDSCH is transmitted is 2 or more, the terminal maps and transmits HARQ-ACK information for the corresponding DCI to the position of the semi-static HARQ-ACK codebook for HARQ-ACK information of the SPS PDSCH, which is the last in time.

For example, if the maximum number of PDSCHs that can be transmitted/received without simultaneous PDSCH reception including SPS PDSCH in a slot in which a DCI indicating SPS PDSCH release is to be transmitted is 4, the HARQ-ACK codebook size for the corresponding slot is 4, and HARQ-ACK information for SPS PDSCH or PDSCH reception will be mapped to each location such as {1, 2, 3, 4}. If HARQ-ACK information is mapped at positions {2} and {3} for two SPS PDSCHs, respectively, HARQ-ACK information for DCI indicating release of the DL SPS PDSCH is mapped to position {3}.

Method 6-2-3: The position of the quasi-static HARQ-ACK codebook for HARQ-ACK information for the DCI indicating SPS PDSCH release is the same as the positions of all the HARQ-ACK codebooks for SPS PDSCHs received in one slot.

When the number of SPS PDSCHs in the slot in which the DCI indicating SPS PDSCH release is transmitted is 2 or more, the terminal repeatedly maps and transmits HARQ-ACK information for the corresponding DCI to semi-static HARQ-ACK codebook positions for HARQ-ACK information of all SPS PDSCHs.

For example, if the maximum number of PDSCHs that can be transmitted/received without simultaneous PDSCH reception including SPS PDSCH is 4 in a slot in which a DCI indicating SPS PDSCH release is to be transmitted, the HARQ-ACK codebook size for the corresponding slot is 4, and HARQ-ACK information for SPS PDSCH or PDSCH reception will be mapped to each location such as {1, 2, 3, 4}. If HARQ-ACK information is mapped at positions {2} and {3} for two SPS PDSCHs, respectively, the HARQ-ACK information for DCI indicating release of DL SPS PDSCH is repeatedly mapped to positions {2} and {3}. That is, the same HARQ-ACK information is mapped to positions {2} and {3}.

Method 6-2-4: As for the position of the quasi-static HARQ-ACK codebook for HARQ-ACK information for the DCI indicating the release of the SPS PDSCH, one of the plurality of HARQ-ACK codebook candidate positions for SPS PDSCHs received in one slot is selected by a higher signal or an L1 signal of the base station, or a combination thereof.

When the number of SPS PDSCHs in the slot in which the DCI indicating SPS PDSCH release is transmitted is 2 or more, among the quasi-static HARQ-ACK codebook locations for HARQ-ACK information of SPS PDSCHs, the base station selects one location with a higher signal or an L1 signal, or a combination thereof, and the terminal maps and transmits HARQ-ACK information for the DCI at the selected location.

For example, if the maximum number of PDSCHs that can be transmitted/received without simultaneous PDSCH reception including SPS PDSCH in a slot in which a DCI indicating SPS PDSCH release is to be transmitted is 4, the HARQ-ACK codebook size for the corresponding slot is 4, and HARQ-ACK information for SPS PDSCH or PDSCH reception will be mapped to each location such as {1, 2, 3, 4}. If, assuming a situation in which HARQ-ACK information is mapped at positions {2} and {3} for two SPS PDSCHs, respectively, the base station selects one of the {2} and {3}, for example, {2}, using a DCI indicating release of the DL SPS PDSCH, and the terminal maps and transmits HARQ-ACK information indicating release of the DL SPS PDSCH to the location {2}. As a DCI field for determining the quasi-static HARQ-ACK codebook location, a time resource allocation field, a HARQ process number, or a PDSCH-to-HARQ feedback timing indicator may be used. For example, the base station indicates the time resource information of one SPS PDSCH among the SPS PDSCHs that can be transmitted in the corresponding slot in the time resource allocation field in the DCI indicating release of the SPS PDSCH, and the terminal may transmit HARQ-ACK information of a corresponding DCI to a semi-static HARQ-ACK codebook location corresponding to the indicated SPS PDSCH.

Method 6-2-5: The location of the quasi-static HARQ-ACK codebook for HARQ-ACK information for the DCI indicating SPS PDSCH release is indicated or configured by the base station by the higher signal or the L1 signal or a combination thereof.

If the number of the maximum receivable PDSCHs without time overlap in the slot in which the DCI indicating the release of the SPS PDSCH is transmitted is two or more, the base station selects one position with a higher signal or an L1 signal or a combination thereof among the quasi-static HARQ-ACK codebook positions for the HARQ-ACK information of the corresponding PDSCHs, and the terminal maps and transmits HARQ-ACK information for the DCI at the selected location.

The set of quasi-static HARQ-ACK codebook positions that the base station can select according to Method 6-2-4 is composed of quasi-static HARQ-ACK codebook positions to which HARQ-ACK information of the SPS PDSCH can be mapped, and the set of semi-static HARQ-ACK codebook locations that can be selected by the base station by Method 6-2-5 is composed of semi-static HARQ-ACK codebook locations to which HARQ-ACK information of all PDSCHs can be mapped.

For example, if the maximum number of PDSCHs that can be transmitted/received without simultaneous PDSCH reception including SPS PDSCH in a slot in which a DCI indicating SPS PDSCH release is to be transmitted is 4, the HARQ-ACK codebook size for the corresponding slot is 4, and HARQ-ACK information for SPS PDSCH or PDSCH reception will be mapped to each location such as {1, 2, 3, 4}. The base station selects {1} by using the DCI indicating the release of the DL SPS PDSCH, and the terminal maps and transmits HARQ-ACK information indicating the release of the DL SPS PDSCH to the location {1}. As a DCI field for determining the quasi-static HARQ-ACK codebook location, a time resource allocation field, a HARQ process number, or a PDSCH-to-HARQ feedback timing indicator may be used. For example, the time resource allocation field in the DCI indicating the release of the SPS PDSCH indicates the time resource information of one of the PDSCHs that can be transmitted in the corresponding slot, and the terminal transmits HARQ-ACK information of a corresponding DCI in a semi-static HARQ-ACK codebook location corresponding to the indicated PDSCH.

The above-described methods will be possible in a situation in which only one HARQ-ACK transmission is configured to be supported in one slot. When the code block group (CBG)-based transmission for the DL SPS PDSCH is set as a higher signal by the base station, the terminal may repeat HARQ-ACK information for DCI indicating DL SPS PDSCH release as many as the number of CBGs to map and transmit the semi-static HARQ-ACK codebook resource determined by at least one of the above methods. The above-described method has been described as a method of transmitting HARQ-ACK information for a DL SPS PDSCH indicating release of one SPS PDSCH transmission/reception, but the method may also be applied to a method of transmitting HARQ-ACK information for DCI indicating simultaneous release of two or more activated DL SPS PDSCHs in one cell/one BWP. For example, when one DL SPS PDSCH release signal is related to a plurality of SPS PDSCHs activated in one cell/one BWP, the SPS PDSCHs considered for the HARQ-ACK codebook location selection may be SPS PDSCHs belonging to one configuration or all configurations as a representative. In this case, if the representative belongs to one configuration, the representative configuration may be the SPS PDSCH configuration number having the lowest index or the SPS PDSCH configuration that is activated first.

An embodiment of a dynamic HARQ-ACK codebook mapping method for multiple SPS PDSCHs transmitted in one slot will now be described.

In the dynamic HARQ-ACK codebook (or type 2 HARQ-ACK codebook), the location of the corresponding HARQ-ACK information is determined by the Total DAI and Counter DAI included in the DCI that basically schedules the PDSCH. The total DAI indicates the size of the HARQ-ACK codebook transmitted in slot n, and the counter DAI indicates the location of the HARQ-ACK codebook transmitted in slot n. Next, the dynamic HARQ-ACK codebook in Rel-15 NR is configured by Pseudo-Code 3.

Pseudo-Code 3

[Start]
If the terminal transmits HARQ-ACK information in a PUCCH in slot n and for any PUCCH format, the terminal determines the $\tilde{O}_0^{ACK}, \tilde{O}_1^{ACK}, \ldots \tilde{O}_{O^{ACK}-1}^{ACK}$, for a total number of $O_{AcK}$ HARQ-ACK information bits, according to the following pseudo-code:
Set m=0-PDCCH with DCI format 1_0 or DCI format 1_1 monitoring occasion index: lower index corresponds to earlier PDCCH with DCI format 1_0 or DCI format 1_1 monitoring occasion
  Set j=0
  Set $V_{temp}=0$
  Set $V_{temp2}=0$
  Set $V_S=\emptyset$
  Set $N_{cells}^{DL}$ to the number of serving cells configured by higher layers for the UE
  Set M to the number of PDCCH monitoring occasion(s)
  while m<M
    Set c=0—serving cell index: lower indexes correspond to lower RRC indexes of corresponding cell
    while $c<N_{cells}^{DL}$
    if PDCCH monitoring occasion m is before an active DL BWP change on serving cell c or an active UL BWP change on the PCell and an active DL BWP change is not triggered by a DCI format 1_1 in PDCCH monitoring occasion m $c=c+1$, else
    if there is a PDSCH on serving cell c associated with PDCCH in PDCCH monitoring occasion m, or there is a PDCCH indicating SPS PDSCH release on serving cell c
    if $V_{C\text{-}DAI,c,m}^{DL} \leq V_{temp}$ $j=j+1$ end it if
    $V_{temp}=V_{C\text{-}DAI,c,m}^{DL}$
    if $V_{T\text{-}DAI,m}^{DL}=0$
      $V_{temp2}=V_{C\text{-}DAI,c,m}^{DL}$
    else
      $V_{temp2}=V_{T\text{-}DAI,m}^{DL}$
    end if
    if harq-ACK-SpatialBundlingPUCCH is not provided and m is a monitoring occasion for PDCCH with DCI format 1_0 or DCI format 1_1 and the UE is configured by maxNroCodeWordsScheduledByDCI with reception of two transport blocks for at least one configured DL MVP of at least one serving cell, $\tilde{O}_{8j+2(V_{C\text{-}DAI,c,m}^{DL}-1)}^{ACK}=HARQ\text{-}ACK$ information bit corresponding to the first transport block of this cell $\tilde{O}_{8j+2(V_{C\text{-}DAI,c,m}^{DL}-1)+1}^{ACK}=HARQ\text{-}ACK$ information bit corresponding to the second transport block of this cell $V_S=V_S \cup \{8j+2(V_{C\text{-}DAI,c,m}^{DL}-1), 8j+$ $2(V_{C\text{-}DAI,c,m}^{DL}-1)+1\}$ else if harq-ACK-SpatialBundlingPUCCH is provided to the UE and in is a monitoring occasion for PDCCH with DCI format 1_1 and the UE is configured by maxNrofCodeWordsScheduledByDCI with reception of two transport blocks in at least one configured DL BWP of a serving cell,
$\tilde{O}_{4j+V_{C\text{-}DAI,c,m}^{DL}-1}^{ACK}$=binary AND operation of HARQ-ACK the information bits corresponding to the first and second transport blocks of this cell $V_S=V_S \cup \{4j+V_{C\text{-}DAI,c,m}^{DL}-1\}$ else $\tilde{O}_{4j+V_{C\text{-}DAI,c,m}^{DL}-1}^{ACK}=HARQ\text{-}ACK$ information bit of this cell $V_S=V_S \cup \{4j+V_{C\text{-}DAI,c,m}^{DL}-1\}$ end if
end if $c=c+1$ end if
end while $m=m+1$ end while
if $V_{temp2} < V_{temp}$ $j=j+1$ end if
if harq-ACK-SpatialBundlingPUCCH is not provided to the UE and the UE is configured by maxNrofCodeWordsScheduledByDCI with reception of two transport blocks for at least one configured DL BWP of a serving cell, $O^{ACK}=2 \cdot (4 \cdot j + V_{temp2})$ else $O^{ACK}=4 \cdot j + V_{temp2}$ end if
$O_i^{ACK}$=NACK for any $i \in \{0, 1, \ldots, O^{ACK}-1\} \backslash V_S$
Set c=0
while $c < N_{cells}^{DL}$
  if SPS PDSCH reception is activated for a UE and the LIE is configured to receive SPS PDSCH in a slot n–$K_{1,c}$ for serving cell c, where $K_{1,c}$ is the PDSCH-to-HARQ-feedback timing value for SPS PDSCH on serving cell c $O^{ACK}=O^{ACK}+1$ $O_{O^{ACK}-1}^{ACK}$=HARQ-ACK information bit associated with the SPS PDSCH reception
  end if $c=c+1$;

end while
[End]
Pseudo-Code 3 may be applied when the transmission period of the SPS PDSCH is greater than 1 slot, and when the transmission period of the SPS PDSCH is less than 1 slot. The dynamic HARQ-ACK codebook may be determined by Pseudo-Code 4, below. Alternatively, Pseudo-Code 4 may generally be applied regardless of the SPS PDSCH transmission period or the number of SPS PDSCHs activated in one cell/one BWP.

Pseudo-Code 4

[Start]
If the terminal transmits HARQ-ACK information in a PUCCH in slot n and for any PUCCH format, the terminal determines the $\tilde{O}_0^{ACK}, \tilde{O}_1^{ACK}, \ldots \tilde{O}_{O^{ACK}-1}^{ACK}$, for a total number of $O_{ACK}$ HARQ-ACK information bits, according to the following pseudo-code:
Set m=0-PDCCH with DCI format 1_0 or DCI format 1_1 monitoring occasion index: lower index corresponds to earlier PDCCH with DCI format 1_0 or DCI format 1_1 monitoring occasion
  Set j=0
  Set $V_{temp}$=0
  Set $V_{temp2}$=0
  Set $V_S=\emptyset$
  Set $N_{cells}^{DL}$ to the number of serving cells configured by higher layers for the UE
  Set M to the number of PDCCH monitoring occasion(s)
  while m<M
    Set c=0—serving cell index: lower indexes correspond to lower RRC indexes of corresponding cell
      while $c < N_{cells}^{DL}$
    if PDCCH monitoring occasion m is before an active DL BWP change on serving cell c or an active UL BWP change on the PCell and an active DL BWP change is not triggered by a DCT format 1_1 in PDCCH monitoring occasion m $c=c+1$;

else
    if there is a PDSCH on serving cell c associated with PDCCH in PDCCH monitoring occasion m, or there is a PDCCH indicating SPS PDSCH release on serving cell c
      If $V_{C\text{-}DAI,c,m}^{DL} \leq V_{temp}$ $j=j+1$ end if
      $V_{temp}=V_{C\text{-}DAI,c,m}^{DL}$
      if $V_{T\text{-}DAI,m}^{DL}=\emptyset$
        $V_{temp2}=V_{C\text{-}DAI,c,m}^{DL}$
      else
        $V_{temp2}=V_{T\text{-}DAI,m}^{DL}$
      end if
      if harq-ACK-SpatialBundlingPUCCH is not provided and m is a monitoring occasion for PDCCH with DO format 1_0 or DCI format 1_1 and the UE is configured by maxNrofCodeWordsScheduledByDCI with reception of two transport blocks for at least one configured DL MVP of at least one serving cell, $\tilde{O}_{8j+2(V_{C\text{-}DAI,c,m}^{DL}-1)}^{ACK}=HARQ\text{-}ACK$ information bit corresponding to the first transport block of this cell $\tilde{O}_{8j+2(V_{C\text{-}DAI,c,m}^{DL}-1)+1}^{ACK}=HARQ\text{-}ACK$ information bit corresponding to the second transport block of this cell $V_S=V_S \cup \{8j+2(V_{C\text{-}DAI,c,m}^{DL}-1), 8j+$ $2(V_{C\text{-}DAI,c,m}^{DL}-1)+1\}$ elseif harq-ACK-SpatialBundlingPUCCH is provided to the UE and m is a monitoring occasion for PDCCH with DCI format 1_1 and the UE is configured by maxNrofCodeWordsScheduledByDCI with reception of two transport blocks in at least one configured DL BWP of a serving cell, $\tilde{O}_{4j+V_{C-DAI,c,m}^{DL}-1}^{ACK}$=HARQ-ACK=binary AND operation of the HARQ-ACK information bits corresponding to the first and second transport blocks of this cell $V_S = V_S \cup \{4j+V_{C-DAI,c,m}^{DL}-1\}$ else $\tilde{O}_{4j+V_{C-DAI,c,m}^{DL}-1}^{ACK}$=HARQ-ACK information bit of this cell $V_S = V_S \cup \{4j+V_{C-DAI,c,m}^{DL}-1\}$ end if
end if $c=c+1$ end if
end while $m=m+1$ end while
if $V_{temp2} < V_{temp}$ $j=j+1$ end if
if harq-ACK-SpatialBundlingPUCCH is not provided to the UE and the UE is configured by maxNrofCodeWordsScheduledByDCI with reception of two transport blocks for at least one configured DL BWP of a serving cell, $O^{ACK}=2\cdot(4\cdot j+V_{temp2})$ end if $O^{ACK}=4\cdot j+V_{temp2}$ end if
$\tilde{O}_i^{ACK}$=NACK for any i∈{0, 1, . . . , $O^{ACK}$−1}\ $V_S$
Set c=0
while c<$N_{cells}^{DL}$
  if SPS PDSCH reception is activated for a UE and the UE is configured to receive multiple SPS PDSCHs in a slot n−$K_{1,c}$ for serving cell c, where $K_{1,c}$ is the PDSCH-to-HARQ-feedback timing value for SPS PDSCH on serving cell c
$O^{ACK}=O^{ACK}+k$ where k is the number of multiple SPS PDSCHs in a slot n-$K_{1,c}$
$O_{O^{ACK}-1}^{ACK}$=HARQ-ACK information bit associated with the SPS PDSCH reception
  end if $c=c+1$;

end while
[End]

In the above-described Pseudo-Code 4, the k value, which is the number of SPS PDSCHs in one slot, corresponds to only one SPS PDSCH configuration within one cell/one BWP, or when multiple SPS PDSCH configurations are possible within one cell/one BWP, it may include all SPS PDSCH configurations.

Pseudo-Code 3 or Pseudo-Code 4 may be applied in a situation in which HARQ-ACK information transmission is limited to one maximum per slot.

An embodiment of an individual HARQ-ACK transmission method for multiple SPS PDSCHs transmitted in one slot will now be described.

When the terminal receives a DL SPS transmission period less than 1 slot from the base station and the higher signal is configured to transmit only one HARQ-ACK per slot, the HARQ-ACK information for the DL SPS PDSCH 632 and DL SPS PDSCH 634 received in slot k as shown in 630 of FIG. 6 is transmitted through a PUCCH of slot k+i indicated by a higher signal or an L1 signal or a combination thereof in advance. For example, the terminal determines the granularity of the PDSCH to HARQ-ACK timing indicator in the DCI format indicating DL SPS activation as a slot level, and the base station provides a difference value between the slot index in which the DL SPS PDSCH is received and the slot index in which the HARQ-ACK information is transmitted to the terminal, and the PUCCH resource in which HARQ-ACK information is transmitted in the slot indicated through the L1 signal is configured to the terminal as a higher signal. In 630 of FIG. 6, the PDSCH to HARQ-ACK timing indicates the value of i. The corresponding value may be directly selected as the L1 signal, or candidate values may be set as a higher signal, and one of the values may be selected as the L1 signal.

When the terminal or the base station wants to separately transmit and receive HARQ-ACK information for DL SPS PDSCHs that are individually transmitted and received, the base station may set a DL SPS transmission period of less than 1 slot and a higher signal so that two or more HARQ-ACK transmissions per slot can be performed. For example, as shown in 660 of FIG. 6, the terminal transmits HARQ-ACK information for the SPS PDSCH 662 received in slot k through the PUCCH 666 in slot k+i, and the HARQ-ACK information for the SPS PDSCH 664 may be transmitted through the PUCCH 668 in slot k+i. To enable this, the terminal may determine the granularity for the PDSCH to HARQ-ACK timing indicator in the DCI format indicating DL SPS activation as a symbol level, and the corresponding value means the total symbol length from the transmission end symbol (or transmission start symbol) of the SPS PDSCH to the transmission start symbol (or transmission end symbol) of the PUCCH through which the corresponding HARQ-ACK information is transmitted. In 660 of FIG. 6, when the end symbol of the SPS PDSCH 662 is s0, and the start symbol of the PUCCH 666 through which HARQ-ACK information for the SPS PDSCH 662 transmitted is s1, the value indicated by the PDSCH to HARQ-ACK timing indicator will be "s1-s0", this value may be directly selected as the L1 signal, or candidate values may be configured as a higher signal, and one of the values may be determined as the L1 signal. Through the information, the terminal may determine the start symbol of the PUCCH to which HARQ-ACK information for the SPS PDSCH is to be transmitted. Other PUCCH transmission information may be determined by a higher signal, an L1 signal, or a combination thereof. If the PUCCH resource indicator is in L1, or a higher signal of Rel-15 is used, and the terminal may determine that the "starting symbol index" field, among the values indicated in the corresponding indicator, is not used. Alternatively, since the starting symbol for transmitting HARQ-ACK information separately has already been provided through PDSCH to HARQ-ACK timing indicator information, a new higher-level signal, an L1 signal without a corresponding field, or a signal composed of a combination thereof may be provided to the terminal. In summary, the terminal may make different interpretations of the PDSCH to HARQ-ACK timing indicator field included in the DCI indicating SPS PDSCH activation according to the SPS PDSCH transmission period as follows.

Method 6-3-1: Determining by slot level
When the transmission period of the SPS PDSCH is greater than 1 slot, the terminal may determine the granularity of the PDSCH to HARQ-ACK timing indicator as the slot level.

Method 6-3-2: Determining by symbol level
When the transmission period of the SPS PDSCH is less than 1 slot, the terminal may determine the granularity of the PDSCH to HARQ-ACK timing indicator as a symbol level.

A DL SPS/CG period change method for aperiodic traffic will now be described.

The transmission period of the DL SPS supported by the base station may be a unit of a slot level or a symbol level. If sensitive information on the delay time of the equipment operated by the factory is periodically generated and the period is not a value or a multiple of the standard supported by the 3GPP standards organization, the base station may not be able to set an effective DL SPS transmission period. For example, if there is a traffic pattern having a 2.5 symbol interval, the base station will not be able to allocate only a DL SPS having a transmission period of 2 symbols or 3 symbols. Therefore, there is a need to introduce a signal for setting a DL SPS transmission period having an aperiodic or a dynamically changing transmission period. The terminal can dynamically change the transmission period by at least one of the following methods, Method 6-4-1 and/or Method 6-4-2.

Method 6-4-1: DL SPS transmission period allocation method with aperiodicity

The base station may be able to set the DL SPS transmission period in a bitmap manner. For example, if bitmap information composed of 10 bits exists as a higher signal, and each bit value of the bitmap is 1, it indicates DL SPS transmission, and if it is 0, it indicates DL SPS non-transmission. When the bit unit means a slot unit, a DL SPS transmission period of various patterns may be configured for 10 slots rather than a predetermined period. The pattern can be repeated in units of 10 slots. Alternatively, the size of the bitmap and the interval indicated by each bit may be a slot or a symbol or a symbol group. Corresponding information may be independently set as a higher signal, or a range of a transmission interval that can be indicated by each bit may be changed according to a bitmap size. For example, when the size of the bitmap is 20, the time range indicated by each bit is 7 symbol units, and when the size of the bitmap is 10, the time range indicated by each bit may be slot units.

Alternatively, the base station may configure two or more DL SPS transmission periods as a higher signal in advance and configure a time difference for each successively transmitted DL SPS as a pattern. For example, it may be possible to determine a DL SPS transmission period having a 2-symbol interval and a 3-symbol interval for a 2.5 symbol traffic pattern. Table 8, below, is a table for setting the aperiodic DL SPS transmission period. Z is a decimal with a value to the first decimal point, and has a relationship of X<Z<X+1. For example, when Z is 3.2, X has a value of 3. Gap 1 refers to a symbol interval between the first SPS PDSCH resource received by the terminal and the second SPS PDSCH resource thereafter after receiving the DCI indicating SPS activation. Gap 2 refers to a symbol interval between the second SPS PDSCH resource and the third SPS PDSCH resource thereafter. That is, Gap i means a symbol interval between the i-th SPS PDSCH resource and the i+1-th SPS PDSCH resource thereafter. Configuration is a parameter to select a various pattern. Table 8 shows the configuration with a total of 9 patterns. The corresponding parameter is provided to the terminal by the higher signal or the L1 signal, and the terminal can determine the DL SPS PDSCH transmission period pattern by the value indicated by the corresponding parameter. In addition, it may be possible to implicitly determine one of the configurations according to the traffic generation period value. Additionally, when the base station and the terminal transmit and receive corresponding information according to the higher signal configuration of the corresponding pattern with the 2.3 symbol traffic pattern, the base station and the terminal may determine that configuration 3 is applied.

TABLE 8

| | Configuration | | | | | | | | |
|---|---|---|---|---|---|---|---|---|---|
| | 1 | 2 | 3 | 4 | 5 | 6 | 7 | 8 | 9 |
| Gap 1 | X + 1 | X + 1 | X + 1 | X + 1 | X + 1 | X + 1 | X + 1 | X + 1 | X + 1 |
| Gap 2 | X | X | X | X | X + 1 | X + 1 | X + 1 | X + 1 | X + 1 |
| Gap 3 | X | X | X | X + 1 | X + 1 | X | X + 1 | X + 1 | X + 1 |
| Gap 4 | X | X | X + 1 | X | X | X + 1 | X | X + 1 | X + 1 |
| Gap 5 | X | X | X | X | X + 1 | X | X + 1 | X | X + 1 |
| Gap 6 | X | X + 1 | X | X + 1 | X | X + 1 | X + 1 | X + 1 | X + 1 |
| Gap 7 | X | X | X + 1 | X | X + 1 | X + 1 | X | X + 1 | X + 1 |
| Gap 8 | X | X | X | X + 1 | X | X | X + 1 | X + 1 | X + 1 |
| Gap 9 | X | X | X | X | X + 1 | X + 1 | X + 1 | X + 1 | X + 1 |
| Gap 10 | X | X | X | X | X | X | X | X | X |

Method 6-4-2: Dynamic DL SPS transmission period change method

Method 6-4-2-1: Transmission period information is included in the DCI indicating DL SPS activation.

The DL SPS transmission period value is included in the information in the DCI. As for the transmission period value, a set of candidate values is previously configured as a higher signal, and a specific value in the set is selected as DCI. For example, when the candidate values of the transmission period as the higher signal are configured as {1 slot, 2 slots}, 1 bit of the transmission period field for indicating the transmission period is generated in the DCI, and it indicates whether the transmission period is 1 slot or 2 slots using the 1 bit. That is, the number of DCI bits is determined according to the number of transmission period candidate values included in the set of transmission periods set as the higher signal. If the number of candidate values included in the set is N, a total of ceil ($\log_2(N)$) bits are configured in the DCI. The DCI corresponds to a non-fallback DCI such as DCI format 1_1, and even if there is no fallback DCI such as DCI format 1_0, a fixed bit value and period values associated with each corresponding bit value may be applied.

Method 6-4-2-2: Utilization of an existing field in the DCI format indicating DL SPS activation 1

When one field in the DCI format indicating DL SPS activation satisfies a specific condition or indicates a specific value, the value of the other field may be used to indicate a transmission period rather than a previously indicated value. For example, if all bit values of the field indicating the HARQ process number indicate a value of "1", a field indicating time resource information may be used for indicating one DL SPS transmission period among a set of DL SPS transmission periods previously configured as a higher signal.

Method 6-4-2-3: Utilization of existing field in DCI format indicating DL SPS activation 2

For a DCI format indicating DL SPS activation, a specific field in the DCI format itself may always indicate a transmission period, or a specific value among specific fields in the DCI format may indicate a transmission period. For example, when the time resource allocation field of the DCI format is verified as a format indicating SPS PDSCH activation, the base station may determine that the corresponding time resource allocation field is used as a value indicating a transmission period of the SPS PDSCH rather than a value indicating the start symbol and length of the existing SPS PDSCH.

Method 6-4-2-4: Search space-based implicit transmission period information setting A transmission period value may be dynamically changed according to a search space in which a DCI indicating DL SPS activation is transmitted. For example, when a DCI indicating DL SPS activation is transmitted in a common search space, the DCI indicating DL SPS activation has a transmission period A value, and when a DCI indicating DL SPS activation is transmitted in a terminal specific search space, the DCI indicating DL SPS activation has a transmission period B value and may be implicitly determined by the UE. The transmission period A and the transmission period B may be previously configured to the terminal as a higher signal.

Method 6-4-2-5: DCI format-based implicit transmission period information configuration The transmission period value may be dynamically changed according to the DCI format indicating DL SPS activation. For example, the terminal may implicitly determine that the DCI indicating activation of DL SPS transmitted in DCI format 1_0, which is a fallback DCI, has a transmission period A value, and that the DCI indicating activation of the DL SPS transmitted in DCI format 1_1, which is a non-fallback DCI, has a transmission period B value. The transmission period A and the transmission period B may be previously configured to the terminal as a higher signal.

The terminal does not expect to set or receive the DL SPS PDSCH time resource information beyond the transmission period of the DL SPS, and if the corresponding configuration or instruction is given, the terminal may regard it as an error and ignore it.

Figure 7:
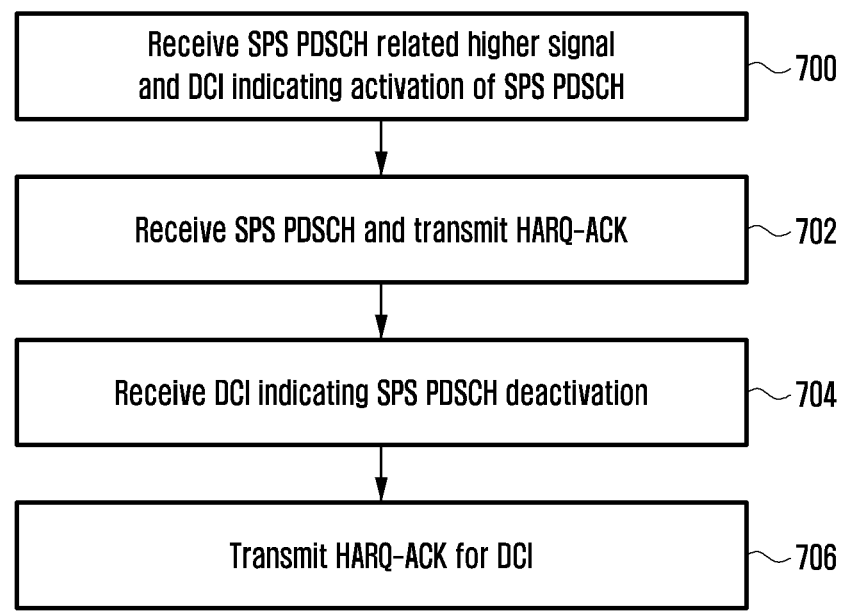
FIG. 7 is a block diagram illustrating a process of transmitting, by a terminal, semi-static HARQ-ACK codebook-based HARQ-ACK information for downlink control information (DCI) indicating deactivation of SPS PDSCH, according to an embodiment.

FIG. 7 is a block diagram illustrating a process of transmitting, by a terminal, semi-static HARQ-ACK codebook-based HARQ-ACK information for DCI indicating deactivation of SPS PDSCH, according to an embodiment.

Referring to FIG. 7, in step 700, the terminal receives the SPS PDSCH configuration information as a higher signal and receives a DCI for activating the SPS PDSCH from the base station. In this case, information set as a higher signal may include a transmission period, an MCS table, and HARQ-ACK configuration information. In step 702, after receiving the DCI indicating activation, the terminal periodically receives the SPS PDSCH and transmits HARQ-ACK information corresponding thereto. Thereafter, when there is no more downlink data to be periodically transmitted/received, the base station transmits a DCI indicating deactivation of the SPS PDSCH to the terminal. In step 704, the terminal receives the DCI indicating deactivation of the SPS PDSCH. In step 706, the terminal transmits HARQ-ACK information for DCI indicating deactivation of the SPS PDSCH to the base station, based on the SPS PDSCH transmission period. For example, if the transmission period of the SPS PDSCH is greater than 1 slot, the terminal transmits the HARQ-ACK codebook location for HARQ-ACK information corresponding to the SPS PDSCH, including HARQ-ACK information for DCI indicating deactivation of the SPS PDSCH. Transmission of HARQ-ACK information for DCI indicating deactivation of the SPS PDSCH may be based on at least one of Method 6-1-1 or 6-1-2 described above. When the transmission period of the SPS PDSCH is less than 1 slot, the terminal may transmit HARQ-ACK information for DCI information indicating SPS PDSCH deactivation, based on at least one of Methods 6-2-1 to 6-2-5. The descriptions described above in FIG. 7 are operations applied when the terminal has previously configured a quasi-static HARQ-ACK codebook from the base station as a higher signal. In addition, the descriptions described above in FIG. 7 may be applied only to the case in which the terminal has been previously configured to transmit only one HARQ-ACK per slot with higher signal or standard or terminal capability.

Figure 8:
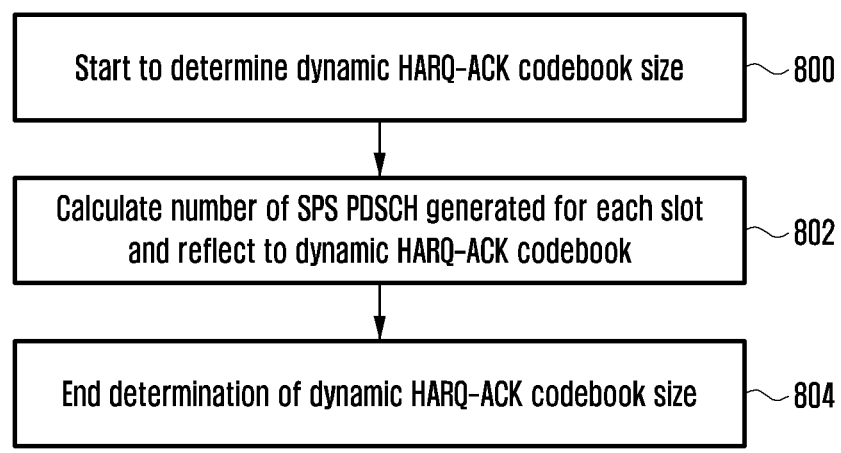
FIG. 8 is a block diagram illustrating a method of determining a dynamic HARQ-ACK codebook for reception of an SPS PDSCH by a terminal, according to an embodiment.

FIG. 8 is a block diagram illustrating a method of determining a dynamic HARQ-ACK codebook for reception of an SPS PDSCH by a terminal, according to an embodiment.

Referring to FIG. 8, when the terminal is previously configured to operate as a dynamic HARQ-ACK codebook with a higher signal, the terminal starts determining the size of the HARQ-ACK codebook for HARQ-ACK information to be transmitted in a specific slot in step 800. The terminal may determine the size of the HARQ-ACK codebook for the dynamically scheduled PDSCH. In addition, in step 802, the terminal calculates the total number of SPS PDSCHs generated in the slot corresponding to the slot in which HARQ-ACK information is to be transmitted, and reflects this in the HARQ-ACK codebook size. The terminal may be able to configure a dynamic HARQ-ACK codebook according to at least one of Pseudo-Code 3 or Pseudo-Code 4, described above. Thereafter, the terminal terminates the determination of the size of the HARQ-ACK codebook in step 804, and may transmit HARQ-ACK information in the corresponding slot. In addition, the descriptions described above in FIG. 8 may be applied only to the case in which the terminal has previously been configured to transmit only one HARQ-ACK per slot with higher signal or standard or terminal capability. For reference, if one SPS PDSCH is repeatedly transmitted across a slot boundary as shown in 650 of FIG. 6, the terminal determines the size of the HARQ-ACK codebook based on the slot in which the SPS PDSCH is last repeatedly transmitted when determining the dynamic HARQ-ACK codebook. Specifically, in the case of slot k 650 in FIG. 6, the SPS PDSCH 652 is transmitted, but instead of calculating the number of valid SPS PDSCHs to determine the dynamic HARQ-ACK codebook size, the terminal determines a dynamic HARQ-ACK codebook size for the SPS PDSCH 654 transmitted in slot k+1. In addition, when determining the value of the number of SPS PDSCHs per slot (k) to determine the size of the dynamic HARQ-ACK codebook in a specific slot in Pseudo-Code 4, the number of valid SPS PDSCHs may be calculated for a slot (or an end slot) to which an end symbol of the last SPS PDSCH belongs among repeatedly transmitted SPS PDSCHs.

Figure 9:
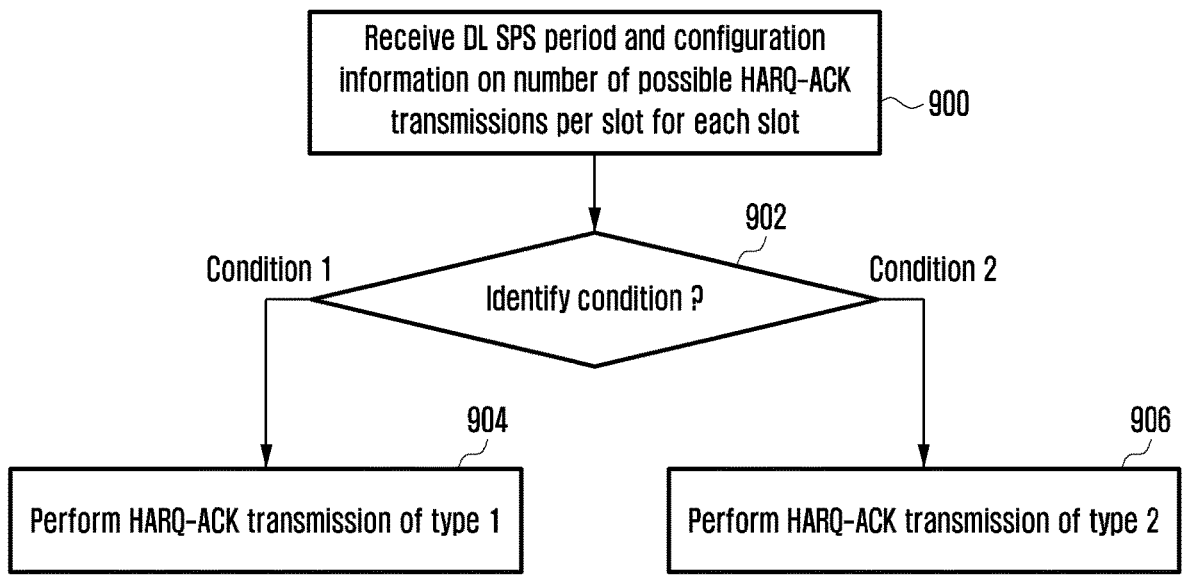
FIG. 9 is a block diagram illustrating a method of transmitting HARQ-ACK information according to a DL SPS transmission period of a terminal, according to an embodiment.

FIG. 9 is a block diagram illustrating a method of transmitting HARQ-ACK information according to a DL SPS transmission period of a terminal, according to an embodiment.

Referring to FIG. 9, in step 900, the terminal receives configuration information for the maximum number of transmissions of HARQ-ACK information per slot or a DL SPS transmission period provided by a higher signal or an L1 signal. In addition, in step 902, the terminal checks a DL SPS transmission period and a condition for transmitting HARQ-ACK information per slot. When condition 1, described below, is satisfied, the terminal performs transmission of HARQ-ACK information of the first type in step 904. When condition 2, described below, is satisfied, the terminal performs transmission of the second type of HARQ-ACK information in step 906.

Condition 1 may be at least one of the following:
when the transmission period of the DL SPS PDSCH is greater than 1 slot; or
when only one HARQ-ACK transmission is possible per slot.

Condition 2 may be at least one of the following:
when the transmission period of the DL SPS PDSCH is less than 1 slot; or
when two or more HARQ-ACK transmissions per slot are possible.

The above-described first type HARQ-ACK information transmission includes the following fields in the DCI format indicating activation of the DL SPS PDSCH.

PDSCH to HARQ-ACK feedback timing indicator: This indicates a slot in which PDSCH is transmitted and a slot interval in which HARQ-ACK information is transmitted in units of slots. When one SPS PDSCH is repeatedly transmitted across a slot boundary, as shown in 650 of FIG. 6, the criterion of a slot in which the PDSCH is transmitted is a slot of the last repeatedly transmitted SPS PDSCH.

PUCCH resource indicator: number of symbols, start symbol, PRB index, and/or PUCCH format.

Through the above information, the terminal may configure a PUCCH transmission resource and a transmission format in which HARQ-ACK information for a DL SPS PDSCH is to be transmitted. In addition, a set of values for the two field values may be configured as a higher signal in advance, and one of these values is selected as DCI.

The above-described second type HARQ-ACK information transmission includes the following fields in the DCI format indicating activation of the DL SPS PDSCH.

PDSCH to HARQ-ACK feedback timing indicator: This indicates the end symbol of the PDSCH and the start symbol interval in which HARQ-ACK information is transmitted in units of symbols.

PUCCH resource indicator: number of symbols, PRB index, and/or PUCCH format.

Through the above information, the terminal may configure a PUCCH transmission resource and a transmission format in which HARQ-ACK information for a DL SPS PDSCH is to be transmitted. In addition, a set of values for the two field values may be configured as a higher signal in advance, and one of these values is selected as DCI.

Figure 10:
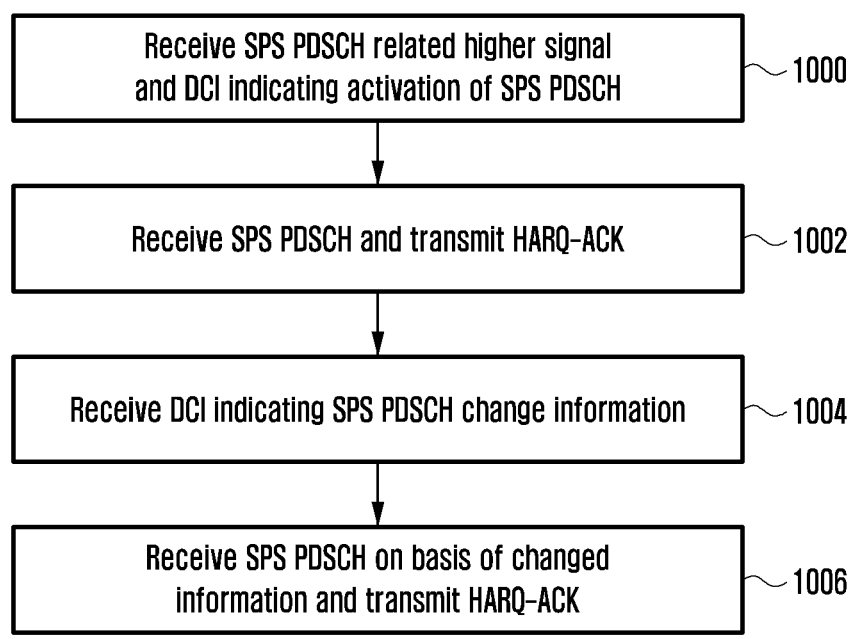
FIG. 10 is a diagram illustrating an operation of a terminal for dynamically changing a DL SPS transmission period, according to an embodiment.

FIG. 10 is a diagram illustrating an operation of a terminal for dynamically changing a DL SPS transmission period, according to an embodiment.

Referring to FIG. 10, in step 1000, the terminal receives higher level information of the SPS PDSCH, including information such as a transmission period, an MCS table, and HARQ-ACK information, and receives a DCI indicating activation of the SPS PDSCH. In step 1002, the terminal then receives the SPS PDSCH in the resource region determined by the higher signal and the L1 signal and transmits HARQ-ACK information corresponding thereto to the base station. In step 1004, the terminal receives a DCI indicating SPS PDSCH change information. Here, the change information may include an SPS PDSCH transmission period value in addition to the MCS value or the frequency and time resource domain size. For reference, as possible methods for changing the SPS PDSCH transmission period, at least one of the Methods 6-4-1 to 6-4-2, described above, may be used. After receiving the DCI, in step 1006, the terminal receives the SPS PDSCH, based on the changed information and transmits HARQ-ACK information corresponding thereto to the base station. When the SPS PDSCH transmission period is changed to a higher signal or an L1 signal, when an SPS PDSCH that exceeds the slot boundary that may be generated according to the transmission period and the time resource region in which the SPS PDSCH is transmitted/received occurs, the terminal may transmit and receive the corresponding SPS PDSCH by at least one of the following four (4) methods.

Method 10-1: Not transmitting or receiving the corresponding SPS PDSCH

For example, if the SPS PDSCH is allocated to the SPS PDSCH over slot k and slot k+1 as shown in 650 of FIG. 6, the terminal considers that the allocated SPS PDSCH is incorrectly configured and does not receive, and does not transmit the HARQ-ACK information corresponding thereto.

Method 10-2: Repeated transmission/reception by dividing the corresponding SPS PDSCH based on the slot boundary For example, if the SPS PDSCH is allocated to the SPS PDSCH over slot k and slot k+1 as shown in 650 of FIG. 6, the terminal determines that the SPS PDSCH is divided into the SPS PDSCH 652 and the SPS PDSCH 654 and repeatedly received. In addition, the terminal transmits only one HARQ-ACK information for this based on the last SPS PDSCH 654.

Method 10-3: Perform the partial transmission/reception only in the slot before the slot boundary for the corresponding SPS PDSCH For example, if the SPS PDSCH is allocated over slot k and slot k+1 as in 650 of FIG. 6, the terminal determines that a valid SPS PDSCH is allocated only for the SPS PDSCH 652, and receives the SPS PDSCH. That is, the SPS PDSCH 654 is not transmitted/received, and when transmitting HARQ-ACK information, the terminal transmits only one, based on the SPS PDSCH 652.

Method 10-4: For the corresponding SPS PDSCH, the corresponding transmission/reception is performed only for the slot beyond the slot boundary For example, when the SPS PDSCH is allocated to the SPS PDSCH over slot k and slot k+1, as shown in 650 of FIG. 6, the terminal determines that the SPS PDSCH, which is valid only for the SPS PDSCH 654, is allocated, and receives the SPS PDSCH. That is, the SPS PDSCH 652 is not transmitted/received, and when transmitting HARQ-ACK information, the terminal transmits only one, based on the SPS PDSCH 654.

Figure 11:
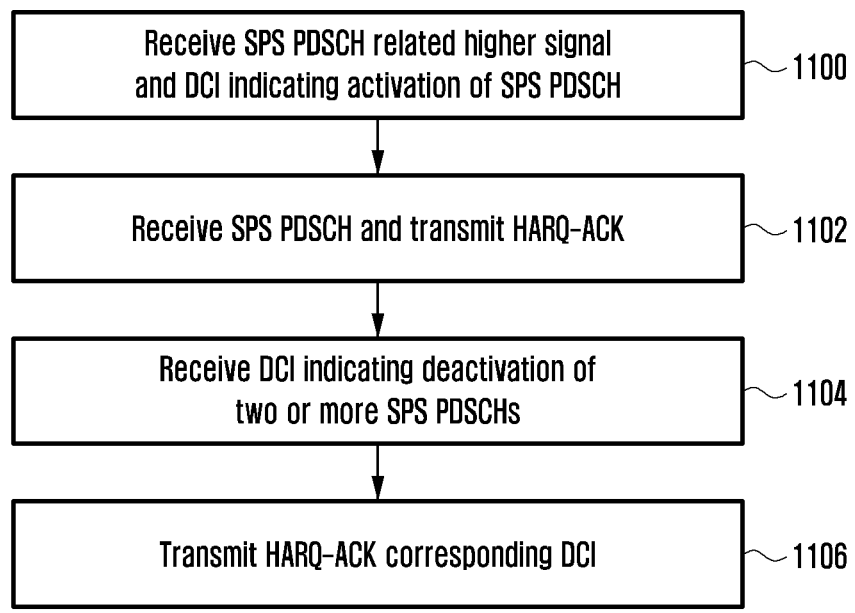
FIG. 11 is a diagram illustrating a method of transmitting HARQ-ACK information for SPS release of a terminal in a situation in which two or more DL SPSs are activated, according to an embodiment.

FIG. 11 is a diagram illustrating a method of transmitting HARQ-ACK information for SPS release of a terminal in a situation in which two or more DL SPSs are activated, according to an embodiment.

When the terminal is capable of operating two or more activated DL SPSs in one cell or one BWP, the base station may set two or more DL SPSs to one terminal. The reason for supporting more than two DL SPS configurations is that if the terminal supports various traffic, an MCS or time/frequency resource allocation period may be different for each traffic, so it can be advantageous to configure the DL SPS for each purpose.

The terminal receives higher signal configuration information for the following DL SPS.

Periodicity: DL SPS transmission period nrofHARQ-Processes. Number of HARQ processes set for DL SPS n1PUCCH-AN: HARQ resource configuration information for DL SPS mcs-Table: MCS table setting information applied to DL SPS SPS index: SPS index set in one cell/one BWP Among the higher signal configuration information, the SPS index may be used for the purpose of indicating which SPS is indicated by DCI (L1 signaling) providing SPS activation or deactivation. Specifically, in a situation in which two SPSs are set as higher signals in one cell or one BWP, in order to know which of the two SPSs the DCI instructing the terminal to activate the SPS instructs to activate the SPS, index information indicating the SPS higher information will be needed. For example, the HARQ process number field in the DCI indicating SPS activation or deactivation indicates the index of a specific SPS, and through this, the SPS configuration corresponding to the indicated SPS index may be activated or deactivated. Specifically, as shown in Table 9, below, when the DCI including the CRC scrambled with CG-RNTI includes the following information and the new data indicator (NDI) field of the corresponding DCI indicates 0, the terminal may determine that the corresponding DCI indicates release (deactivation) of a specific SPS PDSCH that has been activated.

TABLE 9

| | DCI format 0_0 | DCI format 1_0 |
|---|---|---|
| HARQ process number | SPS index | SPS index |
| Redundancy version | set to '00' | set to '00' |
| Modulation and coding scheme | set to all '1's | set to all '1's |
| Frequency domain resource assignment | set to all '1's | set to all '1's |

In Table 9, one HARQ process number may indicate one SPS index or a plurality of SPS indexes. In addition to the HARQ process number field, it may be possible to indicate one or more SPS index(s) by other DCI fields (time resource field, frequency resource field, MCS, RV, and/or PDSCH-to-HARQ timing field). Basically, one SPS can be activated or deactivated by one DCI. The location of the type 1 HARQ-ACK codebook for HARQ-ACK information for the DCI indicating SPS PDSCH release is the same as the location of the type 1 HARQ-ACK codebook corresponding to the reception location of the corresponding SPS PDSCH. If the location of the HARQ-ACK codebook corresponding to the candidate SPS PDSCH reception in the slot is $k_1$, the location of the HARQ-ACK codebook for DCI indicating release of the corresponding SPS PDSCH is also $k_1$. Therefore, when the DCI indicating SPS PDSCH release is transmitted in slot k, the terminal will not expect to receive the PDSCH corresponding to the HARQ-ACK codebook position k1 in the same slot k, and when this situation occurs, the terminal regards it as an error case.

Table 9, above, shows DCI formats 0_0 and 1_0 as examples, but it can be applied to DCI formats 0_1 and 1_1, and can also be sufficiently extended to DC formats 0_x and 1_x.

Referring to FIG. 11, in step 1100, the terminal receives SPS PDSCH higher signal configuration information and receives DCI indicating activation of the SPS PDSCH. Through this, the terminal can simultaneously operate one, two or more SPS PDSCHs in one cell or one BWP. Thereafter in step 1102, the terminal periodically receives the SPS PDSCH activated in one cell or one BWP, and transmits HARQ-ACK information corresponding thereto. For the HARQ-ACK information corresponding to the SPS PDSCH, slot interval information is determined by PDSCH-to-HARQ-ACK timing included in activated DCI information, and accurate time and frequency within the corresponding slot through n1PUCCH-AN information included in SPS higher configuration information is determined through information and PUCCH format information, by the terminal. If there is no PDSCH-to-HARQ-ACK timing field included in the DCI information, the terminal assumes that one value previously set as a higher signal is a default value and determines that the corresponding value is applied.

In a situation in which the Type 1 HARQ-ACK codebook is configured, the terminal receives a DCI indicating deactivation of one SPS PDSCH in step 1104, and transmits the HARQ-ACK information for the corresponding DCI by including it in the HARQ-ACK codebook location corresponding to the corresponding SPS PDSCH reception. If deactivation of two or more SPS PDSCHs is indicated by one piece of DCI, it may be problematic that the terminal should transmit HARQ-ACK information for the corresponding DCI in a certain HARQ-ACK codebook location. To solve this, in step 1106, the terminal transmits HARQ-ACK using at least one of the following four (4) methods.

Method a-1: Lowest index (or highest index)

In this method, when two or more SPS PDSCHs are deactivated by DCI indicating deactivation, HARQ-ACK information corresponding to the DCI indicating the deactivation is included and transmitted in the HARQ-ACK codebook location corresponding to the SPS PDSCH reception having the smallest value (or the highest value or the middle value) among the indexes of the corresponding SPS PDSCH includes. For example, when SPS PDSCH index 1, SPS PDSCH index 4, and SPS PDSCH index 5 are deactivated by one piece of DCI, the terminal transmits including HARQ-ACK information for the DCI in the HARQ-ACK codebook location corresponding to SPS PDSCH index 1 (or 5).

Method a-2: earliest HARQ-ACK codebook occasion (latest HARQ-ACK codebook occasion)

In this method, when two or more SPS PDSCHs are deactivated by DCI indicating deactivation, HARQ-ACK information corresponding to DCI indicating the deactivation is included and transmitted in the HARQ-ACK codebook located at the earliest (or latest) among the positions of the HARQ-ACK codebooks of the corresponding SPS PDSCHs. For example, in a situation in which SPS PDSCH index 1, SPS PDSCH index 4, and SPS PDSCH index 5 are deactivated by one DCI, if the HARQ-ACK codebook location corresponding to PDSCH reception of SPS PDSCH index 1 is $k_1$, if the HARQ-ACK codebook location corresponding to the PDSCH reception of the SPS PDSCH index 4 is $k_2$, if the HARQ-ACK codebook location corresponding to the PDSCH reception of the SPS PDSCH index 5 is $k_3$, and $k_1<k_2<k_3$, the terminal transmits the HARQ-ACK information corresponding to the DCI in $k_1$ (or $k_3$). If the location of the HARQ-ACK codebook for PDSCH reception of two or more SPS PDSCHs is the same, the terminal considers it as one and performs the above operation.

Method a-3: All HARQ-ACK codebook occasions

In this method, when two or more SPS PDSCHs are deactivated by DCI indicating deactivation, instead of selecting the HARQ-ACK codebook location according to the above-described method a-1 or a-2, all HARQ-ACK codebook locations include and transmit HARQ-ACK information for the DCI. For example, when SPS PDSCH index 1, SPS PDSCH index 4, and SPS PDSCH index 5 are deactivated by one DCI, the terminal includes and transmits HARQ-ACK information for the DCI, in HARQ-ACK codebook locations corresponding to SPS PDSCH indexes 1, 4, and 5. If at least two or more HARQ-ACK codebook locations among the SPS PDSCHs are the same, the terminal considers them as one and transmits HARQ-ACK information. In addition, in a situation in which SPS PDSCH index 1, SPS PDSCH index 4, and SPS PDSCH index 5 are deactivated by one DCI, if the HARQ-ACK codebook location corresponding to PDSCH reception of SPS PDSCH index 1 is $k_1$, if the HARQ-ACK codebook location corresponding to PDSCH reception of SPS PDSCH index 4 is $k_2$, if the HARQ-ACK codebook location corresponding to the PDSCH reception of the SPS PDSCH index 5 is $k_3$, and $k_1<k_2<k_3$, the terminal transmits the HARQ-ACK information corresponding to the DCI by including it in $k_1$, $k_2$, and $k_3$. If the location of the HARQ-ACK codebook for PDSCH reception of two or more SPS PDSCHs is the same, the terminal considers it as one and performs the above operation.

Method a-4: gNB configuration

This method means that the base station first determines the above-described methods a-1 to a-3 as a higher signal. Second, in addition to the above methods a-1 to a-3, it may be possible for the base station to directly determine the location of the HARQ-ACK codebook as a higher signal or an L1 signal. At this time, when two or more SPS PDSCHs are deactivated by one DCI, the location of the HARQ-ACK codebook that can be determined by the base station may be determined as a higher or L1 signal within the possible HARQ-ACK codebook location candidates for the corresponding SPS PDSCHs, or regardless of this, it may be possible to determine the location of the HARQ-ACK codebook as a higher order or L1 signal.

When receiving DCI indicating release or deactivation of the one or more SPS PDSCHs, the terminal does not expect to be scheduled so that the location of the HARQ-ACK codebook to send HARQ-ACK information for the corresponding DCI is the same as the location of the HARQ-ACK codebook to send HARQ-ACK information for the PDSCH scheduled by another DCI. When receiving such scheduling, the terminal regards it as an error case and performs an arbitrary operation.

Figure 12:
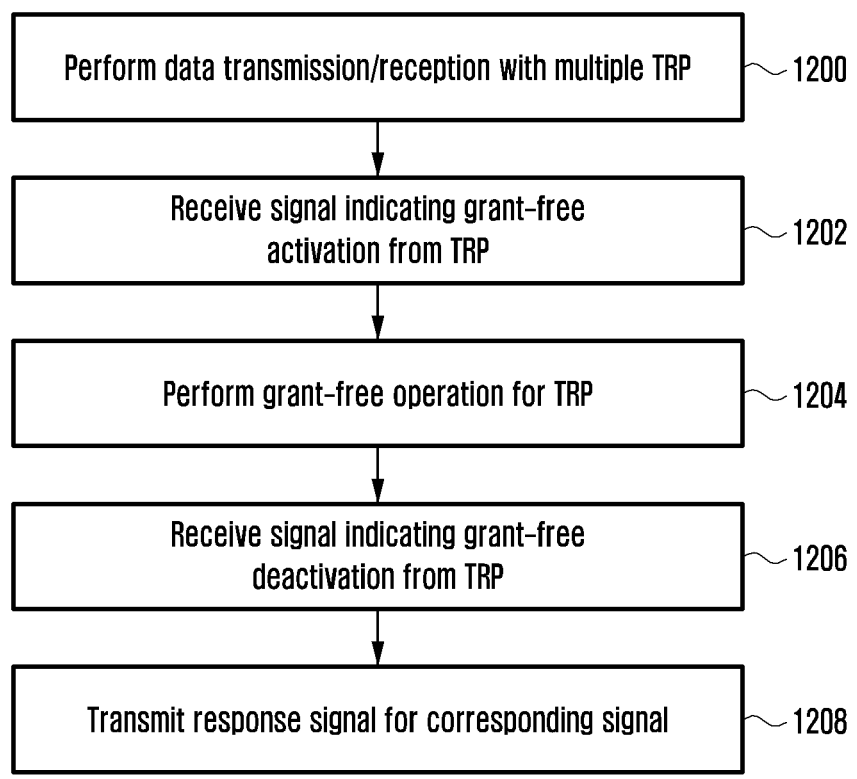
FIG. 12 is a diagram illustrating a grant-free operation in a situation in which a terminal is connected to two or more transmission and reception points (TRPs), according to an embodiment.

FIG. 12 is a diagram illustrating a grant-free operation in a situation in which a terminal is connected to two or more transmission and reception points (TRPs), according to an embodiment.

Referring to FIG. 12, in step 1200, the terminal transmits and receives data with multiple TRPs. Here, the term TRP may be used interchangeably with the term of a base station or a base station. In step 1202, the terminal receives a signal indicating grant-free activation from one or more TRPs. In this case, the signal indicating grant-free activation may be a higher signal or an L1 signal. After receiving a signal indicating activation information, in step 1204, the terminal transmits or receives data in one or more TRP and grant-free resources. In addition, the terminal may receive one or more grant-free resource configurations within one cell or one BWP. Thereafter, in step 1206, the terminal receive a signal indicating grant-free deactivation/release from one or more TRPs. In this case, the signal indicating the grant-free deactivation/release may be a higher signal or an L1 signal. In step 1208, the terminal transmits a response signal to a signal indicating the grant-free deactivation/release. For example, when grant-free is SPS, the signal is DCI, and in this case, the terminal transmits HARQ-ACK information for DCI. In addition, when grant-free is configured grant type 2, the signal is DCI, and at this time, the terminal transmits confirmation information to the TRP through the MAC CE to transmit response information for DCI.

In the grant-free operations, there are largely configured as grant type 1 and grant type 2 in the uplink, and there is an SPS in the downlink. In the configured grant type 1, grant resource configuration, activation, and deactivation are performed by the higher signal, and in the configured grant type 2, some resource configuration information is transmitted through a higher signal, and the remaining configuration information and activation and deactivation of the configured grant resources are performed through DCI (L1 signal).

As described herein, the aforementioned configurations are described as grant-free for convenience. In a situation where two or more grant-free configurations are possible within one cell or one BWP, when a terminal can transmit and receive data with two or more TRPs, one grant-free resource may be linked to one TRP to transmit and receive data. For example, when grant-free resource A is configured, the terminal determines that the grant-free resource is associated with TRP 1, and receives or transmits data from TRP 1 and periodic grant-free resource.

Specifically, in the case of the configured grant type 1, because the configuration, activation, and deactivation of the configured grant resource are instructed only with the higher signal without the L1 signal, information indicating from which TRP the configured grant is transmitted may be included in the higher signal information. For example, the following parameters may exist among higher information for the configured grant type.

TRP index (or spatial domain information): TRP information linked to the configured grant One TRP linked to one configured grant or one configured grant may be associated with a plurality of TRPs. Specifically, a case in which a plurality of TRPs are linked to the configured grant may be detailed in the following three (3) situations.

Situation b-1: As an example of linking with different TRPs for each specific configured grant resource, if one configured grant resource is periodically configured, and the terminal is connected with two TRPs, from the time when the configured grant is activated, the odd-numbered configured grant may be associated with TRP 1, and the even-numbered configured grant may be associated with TRP 2. If this is generalized, the TRP associated for each specific configured grant may be determined by a formula such as "configured grant index" mod "TRP number"="TRP index".

Situation b-2. All configured grant resources may be associated with two or more TRPs. For each configured grant occasion, the terminal may be able to transmit data to a plurality of TRPs.

Situation b-3: The transmission period is determined for each TRP regardless of the configured grant index, so that a specific configured grant may be associated with one TRP, and another configured grant may be associated with a plurality of TRPs. For example, in a situation where the terminal is connected with two TRPs, TRP 1 is associated with all configured grant resources, and TRP 2 is associated with an even-numbered configured grant resource, in the odd-numbered configured grant resource, the terminal transmits data from the corresponding resource, and in the even-numbered configured grant resource when data occurs only for TRP 1, and in the even-numbered configured grant resource, the terminal transmits data from the corresponding resource when data occurs for TRP 1 and TRP 2.

The above-described situations are applicable to all grant-free operations including SPS. Information related to the association of the one grant-free resource and a plurality of TRPs may be configured as a higher level or an L1 signal. In the case of SPS, after receiving the configuration information and activation information of the configured grant type 1, the terminal transmits data without a separate grant when data occurs with the configured grant resource configured for the TRP indicated in the TRP index.

In the case of the configured grant type 2, some information may be transmitted to a higher signal, and the remaining configuration information, activation, and deactivation may be indicated using the L1 signal. In this case, if there is TRP index information in the higher signal, the terminal receives the L1 signal indicating activation of the configured grant type 2, and then transmits the data without a separate grant if there is data to be sent to the configured grant resource for the TRP indicated in the TRP index provided by the higher configuration information. On the other hand, if there is no information on the TRP index in the higher configuration information, the terminal implicitly determines the TRP to transmit data for the resource set to the configured grant according to the TRP associated with the CORESET in which the DCI indicating the activation of the configured grant type 2 is transmitted. For example, when a CORESET in which DCI indicating activation of configured grant type 2 has been transmitted is transmitted from TRP 1, the terminal transmits the data to TRP 1 without a separate grant when data occurs for the activated configured grant resource. TRP in which DCI indicating deactivation of the configured grant type 2 is transmitted will be capable of at least one of the following two (2) methods.

Method b-1: The configured grant resource associated with TRP 1 can instruct the release of the configured grant only DCI transmitted from the CORESET of TRP 1. If one DCI supports simultaneous release of two or more configured grant resources, according to this method, the two or more configured grants should each be associated with TRP 1.

Method b-2: Unlike Method 1, DCI transmitted from a CORESET associated with a TRP other than TRP 1 may also instruct the release of the configured grant associated with TRP 1. If one DCI supports simultaneous release of two or more configured grant resources, according to this method, the two or more configured grants may be associated with different TRPs.

In the case of the SPS, the detailed operation of the above-described configured grant type 2 is mostly similar, and in other parts, in the case of the SPS, the terminal receives data for the activated SPS resource, and reports HARQ-ACK information for this to the TRP. When the corresponding SPS resource is associated with TRP 1, the terminal transmits HARQ-ACK information for data received through the corresponding SPS resource to TRP 1. If the SPS resource is associated with two or more TRPs, the TRP to which the terminal will transmit HARQ-ACK information may be determined according to the above-described situation. If, in one SPS configuration, a specific SPS resource is received from TRP 1, the terminal transmits HARQ-ACK information for the PDSCH received from the corresponding SPS to TRP 1. If, in one SPS configuration, a specific SPS resource is received from TRP 1 and TRP 2, the terminal transmits HARQ-ACK information for the PDSCH received from the SPS to TRP 1 or TRP 2 according to higher signal configuration or L1 signal indication. Alternatively, when a specific SPS resource is received from TRP 1 and TRP 2 in one SPS configuration, the terminal transmits HARQ-ACK information for the PDSCH received from the SPS to TRP 1 with the lowest index (or when TRP 1 is the master TRP, transmits to TRP 1).

Additionally or alternatively, in a situation in which a DCI indicating activation in the configured grant type 2 or SPS is transmitted to a CORESET associated with TRP 1, the configured grant type 2 or the TRP associated with the SPS may be a situation where the TRP is a TRP other than TRP 1. Specifically, when the terminal determines in advance the TRP association information for the configured grant type 2 or SPS, based on the higher signal, the above operation may be possible. Alternatively, a field directly indicating TRP information may be added in DCI information indicating activation, or TRP information may be indirectly indicated using a HARQ process number or an RV value in DCI.

Additionally or alternatively, when different grant-free resources associated with one TRP overlap, the terminal should select one of them and transmit or receive data as a grant-free resource. In this case, as a method of selection based on the terminal implementation or for the grant-free resource, a priority value may be transmitted according to a higher signal configuration or an L1 signal indication, and the terminal may transmit or receive data through a grant-free resource having a high priority based on the corresponding priority value. If different grant-free resources associated with different TRPs overlap, the terminal may transmit or receive data for the grant-free resources without applying the selection method.

Figure 13:
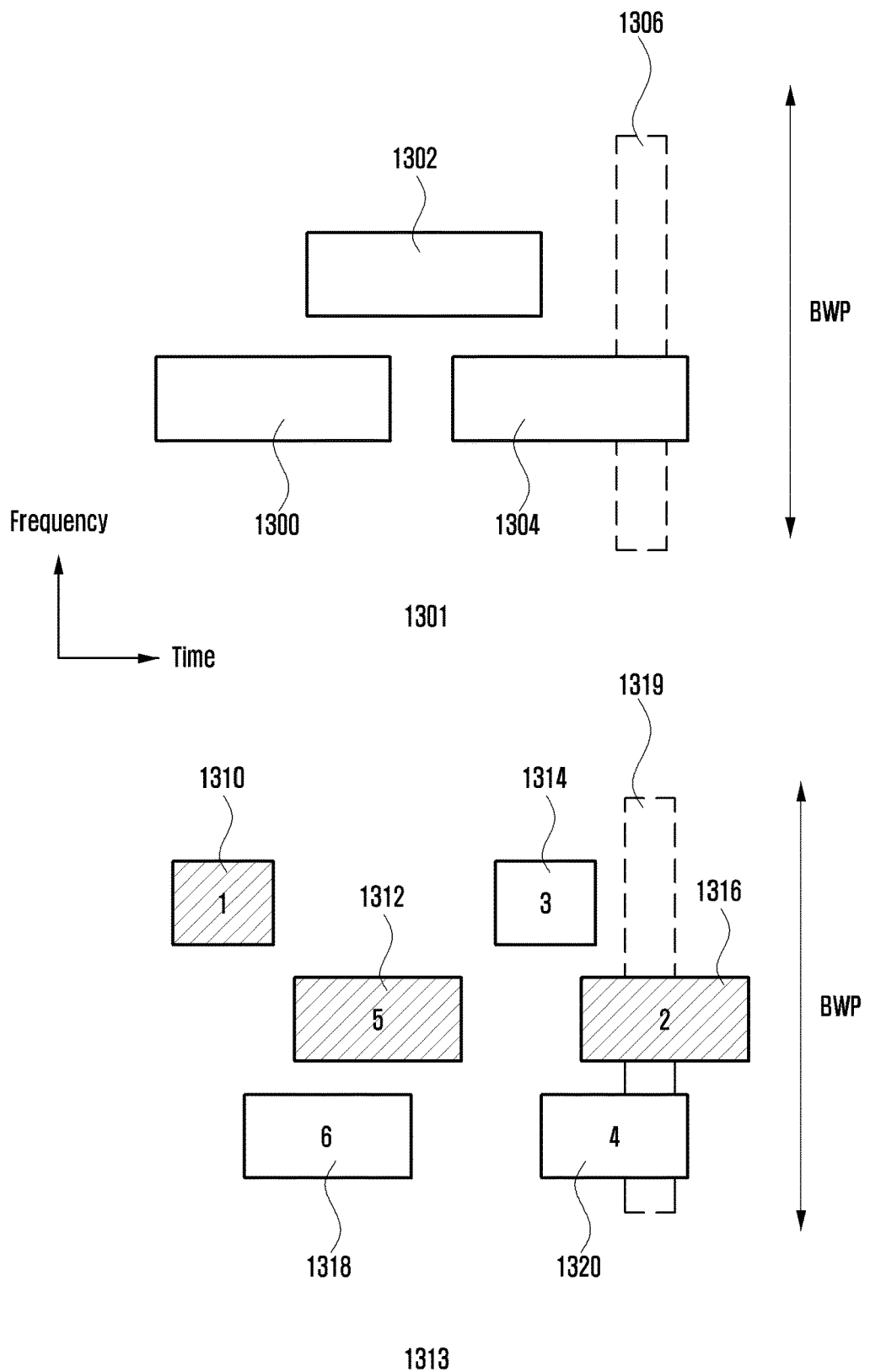
FIG. 13 is a diagram illustrating a DL SPS reception operation of a terminal in a situation in which two or more DL SPSs overlap with time, according to an embodiment.

FIG. 13 is a diagram illustrating a DL SPS reception operation of a terminal in a situation in which two or more DL SPSs overlap with time, according to an embodiment.

In FIG. 13, DL SPS reception is described as an example, but the description of the reception is equally applicable to UL SPS. In this case, configuration information transmission and activation by DCI are still transmitted by the base station to the terminal, but operations related to TB reception in an overlapping situation may be performed by the base station other than the terminal.

The description of the DL SPS has been described in the disclosure, but additional references to section 10.2 of 3GPP standard TS38.213, section 5.3 of TS38.321, and section 6.3.2 of TS38.331 are implicitly included herein. In FIG. 13, the terminal may receive two or more sets of different DL SPS higher signal configuration information within one activated BWP and activate the same. In Rel-16 NR, up to 8 DL SPS can be configured in one BWP. The disclosure is not limited thereto and may be applied to 8 or more DL SPS settings within the BWP. Different DL SPS PDSCHs (hereinafter referred to as "DL SPS") may be classified into index information set/instructed by a higher signal or an L1 signal in advance. For example, the index information may be included directly (explicitly) in the configuration information transmitted to the higher signal. The configuration information may include at least one of periodicity, nrof-HARQ-Processes, n1PUCCH-AN, and mcs-Table information for each DL SPS configuration. In addition, index information for distinguishing each DL SPS may be included. In addition, the index information may be included in control information transmitted as a higher signal and/or an L1 signal. Additionally, the index information may be configured implicitly. In the configuration information transmitted to the higher signal, the index information may be configured to increase sequentially in the order in which the DL SPS configuration information is included. In addition, after the higher signal is configured, the index information may be configured to increase sequentially in the order of activation by control information transmitted through the L1 signal. If a plurality of DL SPSs are activated in the control information, the index information may be configured to increase in the order included in the higher signal.

In addition, the terminal may encounter a situation in which two or more activated different DL SPS resources partially overlap in terms of time resources. Here, activation may refer to a state set by a higher-level signal, may refer to a state that is actually operated by an L1 message after setting, or both. Additionally, the time resource may be configured or allocated as information included in the higher signal, or may be configured or allocated using information included in the L1 message or the transmission time of the L1 message. For example, when two or more DL SPS resources have different transmission periods, time resource overlap between different DL SPS resources may occur as shown in FIG. 13 in a specific transmission period or slot.

Referring to FIG. 13, three different DL SPS resources are overlapped in terms of time resources in 1301. If the terminal can receive only one DL SPS resource at a time, the terminal receives only one DL SPS resource among the overlapped DL SPS resources. In this case, there may be a method for the terminal to randomly select and receive one of the overlapped DL SPS resources. However, from the viewpoint of the base station, since the base station terminal does not know that the terminal has received DL SPS of the overlapped DL SPS resources and transmitted HARQ-ACK information thereto, a method for selecting a DL SPS resource needs to be defined in advance between the base station and the UE. In order to solve this problem, at least one or a plurality of the following five (5) methods may be applied in combination.

Method 13-1: This is a method of prioritizing the DL SPS resource with the lowest index among the time-overlapping DL SPS resources. For example, when a DL SPS resource having an index value of 1 and a DL SPS resource having an index value of 3 overlap each other, the terminal receives a TB transmitted from the base station via the DL SPS resource having an index value of 1, and does not receive a DL SPS resource having an index value of 3. Accordingly, the terminal demodulates/decodes a TB received through a DL SPS resource having an index value of 1, and transmits HARQ-ACK information for this through a PUCCH resource previously set for a DL SPS resource having an index value of 1. Even in a situation in which three or more DL SPSs overlap in time, the terminal receives the TB transmitted through the DL SPS resource with the lowest index value. In addition, in a situation in which different DL SPS resources overlap with time, the terminal may not receive the TB transmitted through the DL SPS resource except the DL SPS resource with the lowest index value, or may operate assuming that the base station does not transmit the TB through the corresponding resource. For example, the terminal may not perform a demodulation/decoding operation in DL SPS resources except for the DL SPS resource having the lowest index value. In addition, the terminal may not transmit feedback information for DL SPS resources, for example, ACK/NACK information, except for the DL SPS resource having the lowest index value.

Method 13-2: This is a method of prioritizing the DL SPS resource with the highest index among the time-overlapping DL SPS resources. For example, when a DL SPS resource having an index value of 1 and a DL SPS resource having an index value of 3 overlap each other, the terminal receives a TB transmitted from the base station through the DL SPS resource having an index value of 3, and does not receive a DL SPS resource having an index value of 1. Accordingly, the terminal demodulates/decodes the TB received through a DL SPS resource having an index value of 3, and transmits HARQ-ACK information for this through PUCCH resources previously configured for the DL SPS resource having the index value of 3. Even in a situation in which three or more DL SPSs overlap in time, the terminal receives the TB transmitted through the DL SPS resource having the highest index value. Additionally, in a situation in which different DL SPS resources overlap with time, the terminal may not receive the TB transmitted through the DL SPS resource except for the DL SPS resource with the highest index value, or may operate assuming that the base station does not transmit the TB through the corresponding resource. For example, the terminal may not perform a demodulation/decoding operation in DL SPS resources except for the DL SPS resource having the highest index value. In addition, the terminal may not transmit feedback information for DL SPS resources, for example, ACK/NACK information, except for the DL SPS resource having the highest index value.

Method 13-3: This is a method of prioritizing DL SPS resources in chronological order along with Method 13-1 or Method 13-2. In other words, it is a method in which the resource of the DL SPS, which is already determined to have a low priority in determining whether to prioritize a resource through index comparison, is excluded from the determination of priority due to overlapping with other resources. At this time, the resource priority determination may be performed sequentially in chronological order (or in the reverse order of time within a specific time domain). Here, the specific time domain may be a specific transmission period or slot. Specifically, it is determined whether the DL SPS resources overlap with other DL SPS resources in chronological order. If overlapping occurs, it is assumed that a reception operation is not received in the DL SPS resource of a lower priority through index comparison, or that the base station has not transmitted a TB. In addition, the DL SPS of low priority may be excluded from the operation of determining whether to overlap afterwards.

Referring to FIG. 13, reference numeral 1301 shows a situation in which three DL SPSs are overlapped differently from each other. If the index value configured in the DL SPS 1300 is 1, the index value configured in the DL SPS 1302 is 3, and the index value configured in the DL SPS 1304 is 5, according to Method 13-1, the terminal does not receive the DL SPS 1304 because the index value is higher than the DL SPS 1302, and does not receive the DL SPS 1302 because the index value is higher than the DL SPS 1300. Accordingly, the terminal will receive only the DL SPS 1300 according to Method 13-1 even though the DL SPS 1300 and the DL SPS 1304 do not time overlap each other in the situation 1301 of FIG. 13. Therefore, as in Method 13-1, in a situation where the smaller the index, the higher the priority, the operation, by the terminal, of determining the priority of the DL SPS resource with only the resource and index information for which the DL SPS is configured and receiving the DL SPS having a high priority may be inefficient. Method 13-3, in order to solve this problem, determines whether or not time overlaps with other valid DL SPSs at the time when the terminal actually receives the DL SPS, and in the case of overlapping, the terminal does not receive the DL SPS(s) having a low priority and excludes the same from determining whether the DL SPS time overlap. Then, the terminal performs an operation of determining whether to overlap with respect to the DL SPS(s) that are not excluded in determining whether to overlap the DL SPS time. For example, a method as shown in the following Table 10 may be applied.

TABLE 10

Step 1: Check valid and active DL SPS transmission resources within a specific transmission section or slot, and end when there are no more valid and activated resources.
Step 2: Check for the existence of other DL SPS resources that overlap in time with the earliest scheduled DL SPS among valid and activated DL SPS transmission resource(s) in step 1.
Step 3: if no overlapping occurs in step 2, the terminal receives the first scheduled DL SPS, regards the corresponding DL SPS resource as an invalid DL SPS resource, and moves to step 1.
Step 4: If overlapping occurs in step 3, the DL SPS transmission resource with the highest priority of the overlapped DL SPS transmission resources is received, other DL SPS transmission resources are not received, and all the overlapped DL SPS resources are regarded as invalid resources, and the process moves to step 1.

In the case of the above Method 13-1, if the index value configured in the DL SPS 1300 is 1, the index value configured in the DL SPS 1302 is 3, and the index value configured in the DL SPS 1304 is 5, as in Step 1 of Table 10, the terminal determines all the DL SPS resources 1300, 1302, and 1304 activated within a specific transmission period or slot as valid DL SPS resources. In addition, as in Step 2 of Table 10, the terminal will determine whether there is another DL SPS(s) overlapping before receiving the DL SPS 1300 scheduled first in chronological order. As in Step 4 of Table 10, since the DL SPS 1300 overlaps with the DL SPS 1302, the terminal receives the DL SPS 1300 with a high priority (with an index value of 1) and does not receive the DL SPS 1302 with a low priority (with an index value of 3). The DL SPS 1300 and the DL SPS 1302 are determined as invalid DL SPSs, and the terminal moves to Step 1 of Table 10 to check the next DL SPS 1304 that exists first.

As in step 2 of Table 10, the terminal determines whether valid DL SPS resources overlapping with the DL SPS 1304 exist. Since the DL SPS 1302 are no longer valid DL SPS resources, the terminal determines that there is no overlapped resource and moves to step 3 of Table 10. The terminal receives the DL SPS 1304.

The Method 13-2 can be applied in the same way. In addition, as shown in Table 10, if the operation is applied based on the fast chronological order of the DL SPS, a method of performing the operation in a reverse order is also possible, as described below.

Method 13-4: In addition to Method 13-1 (or Method 13-2), this is a method of determining priority in consideration of the time resources allocated to the DL SPS. In other words, this is a method in which the resource of the DL SPS, which is already determined to have a low priority in determining whether to prioritize a resource through index comparison, is excluded from the determination of priority due to overlapping with other resources. At this time, the resource priority determination may be performed sequentially from a DL SPS having a low index (or a DL SPS having a high index) within a specific time domain. Here, the specific time domain may be a specific transmission period or slot. Specifically, the terminal determines whether the resources of the DL SPS overlap with the resources of other DL SPSs in ascending order of the index within a specific time domain. If overlapping occurs, it is assumed that a reception operation is not received in the DL SPS resource of a lower priority through index comparison, or that the base station has not transmitted a TB. In addition, the DL SPS of low priority may be excluded from the operation of determining whether to overlap afterwards.

Considering Method 13-3, if the index value configured in the DL SPS 1300 is 5, the index value configured in the DL SPS 1302 is 3, and the index value configured in the DL SPS 1304 is 1, the terminal may not receive the DL SPS 1300, and the DL SPS 1302 may overlap with the DL SPS 1303 and may be received at the terminal even though the priority is low. Therefore, considering the reception in chronological order may cause problems. Accordingly, the terminal excludes the DL SPS (A) with the highest priority and DL SPS overlapping with at least one symbol from the viewpoint of time resources in consideration of the time resource region to which all DL SPSs activated in a specific transmission period or slot are allocated, and receives the highest priority DL SPS (A). The terminal excludes the DL SPS (B) having the highest priority among the remaining DL SPS resources that are not excluded and the DL SPS overlapping with at least one symbol in terms of the time resource, and the terminal decides to receive the DL SPS (B). In addition, this operation is continuously performed until there are no DL SPSs that are not determined to be received or excluded. Within the specific period or slot, the terminal receives DL SPSs, and transmits HARQ-ACK information thereto to the BS. For example, a method as shown in the following Table 11 may be applied.

TABLE 11

Step 1: Check DL SPS transmission resources determined to be received or not received among the activated DL SPS resources in a specific transmission period or slot, if there is at least one DL SPS transmission resource that is determined not to be received or not received, move to step 2, otherwise, move to step 3.

TABLE 11-continued

Step 2: Determine the DL SPS having the highest priority to receive among the DL SPS resources that are determined not to be received or not received, determine DL SPS resources overlapping with the DL SPS and at least one symbol not to be received, and move to step 1.
Step 3: Terminal receives DL SPS resources determined to be received, reports HARQ-ACK information thereon to the base station, and the DL SPS resources determined not to be received are not received by the terminal.

Reference numeral 1313 of FIG. 13 shows that DL SPS 1310, DL SPS 1312, DL SPS 1314, DL SPS 1316, DL SPS 1318, and DL SPS 1320 having six different indices are activated and scheduled in one slot. When a DL SPS having a low index value has a high priority, according to Method 13-4, the terminal receives the DL SPS 1310 of index 1 and does not receive the DL SPS 1318 of index 6 overlapping with it. The terminal receives the DL SPS 1316 of the index 2, which has the next higher priority, and does not receive the DL SPS 1314 of the index 3 and the DL SPS 1320 of the index 4 overlapping therewith. The terminal receives the DL SPS 1312 of the index 5 having the next highest priority. Accordingly, the terminal finally receives the DL SPS 1310, DL SPS 1312, and DL SPS 1316 and reports the HARQ-ACK information thereto to the base station after demodulation/decoding.

Method 13-5: This is a method of determining priority by considering symbol direction information in a specific transmission period or slot in a time division duplex (TDD) situation in applying Method 13-3 or 13-4. Here, the symbol direction may be one of downlink, uplink, and flexible. For a method of indicating symbol direction information in a TDD situation, section 11.1 of 3GPP standard TS 38.213 is referred. Basically, the terminal receives information only when the resource region to which the DL SPS is allocated is higher or when all symbols are indicated as downlink by the L1 signal. Alternatively, when at least one symbol among the resources to which the DL SPS is allocated is configured/indicated as an uplink symbol or a flexible symbol by a higher level or L1 signal, the terminal does not receive the DL SPS. Therefore, it may be possible to apply Method 13-3 or Method 13-4 in consideration of this.

For example, in the case of Method 13-3, the following conditions may be added to Table 10.

The terminal regards the DL SPS as a valid DL SPS resource only when all of the transmission resources of the DL SPS are indicated as downlink by the higher level or the L1 signal. Alternatively, the terminal regards that DL SPS resources in which at least one symbol overlaps with a symbol configured/instructed as an uplink symbol or a flexible symbol by a higher level or L1 signal are invalid and does not receive the DL SPS resources. In 1301 of FIG. 13, the DL SPS 1304 overlaps with the symbol 1306 configured/instructed as an uplink symbol or a flexible symbol by a higher or L1 signal, and thus the terminal does not receive it.

In other words, before performing Method 13-3, it is determined whether each DL SPS resource overlaps an uplink symbol or a flexible symbol. The terminal does not receive the TB in the DL SPS resource overlapping the uplink symbol or the flexible symbol, or operates assuming that the base station has not transmitted TB. Thereafter, in performing Method 13-3, Method 13-3 may be performed after the DL SPS is excluded from determining whether to prioritize.

In the case of Method 13-4, at least one of the following conditions may be added in Table 11.

The terminal determines not to receive DL SPS resources in which at least one symbol overlaps with a symbol set/instructed as an uplink symbol or a flexible symbol by a higher level or L1 signal. In 1311 of FIG. 13, since the DL SPSs 1316 and 1320 overlap the symbol 1319 set/instructed as an uplink or flexible symbol by a higher or L1 signal, the terminal does not receive the corresponding DL SPS 1316 and DL SPS 1320. Accordingly, in this case, the terminal receives the DL SPS 1310, DL SPS 1312, and DL SPS 1314 according to Method 13-4 and reports HARQ-ACK information thereto. The terminal does not receive the DL SPS 1318, DL SPS 1316, and DL SPS 1140 according to Methods 13-4 and 13-5.

Alternatively, when the terminal is configured to receive L1 of the slot format indicator (SFI), only for DL SPS resources in which all symbols are indicated as downlink symbols by the L1 signal of the SFI, the DL SPS resource received by the terminal is finally determined according to the priority application method of Table 11.

In other words, before performing Method 13-4, it is determined whether each DL SPS resource overlaps an uplink symbol or a flexible symbol. The terminal operates assuming that the TB is not received in the overlapping DL SPS resource or that the base station has not transmitted the TB. Thereafter, in performing Method 13-4, the DL SPS may be excluded from determining whether to prioritize, and then Method 13-4 may be performed.

Alternatively, after performing the Method 13-1 to Method 13-5, the terminal determines whether a symbol configured or indicated by a higher signal or an L1 signal overlaps an uplink symbol or a flexible symbol for DL SPSs determined to be received, and it may be possible for the terminal not to receive the overlapping DL SPS even for at least one symbol. In consideration of the symbol direction of the TDD structure, the terminal operation may be defined in the 3GPP standard as shown in Table 12 below.

TABLE 12

If more than one PDSCH on a serving cell each without a corresponding PDCCH transmission are partially or fully overlapping in time where all symbol of PDSCH(s) are indicated by downlink symbol if UE is provided to monitor SFI, a UE is not required to decode a PDSCH among these PDSCHs other than one with the lowest configured sps-ConfigIndex.

Figure 14:
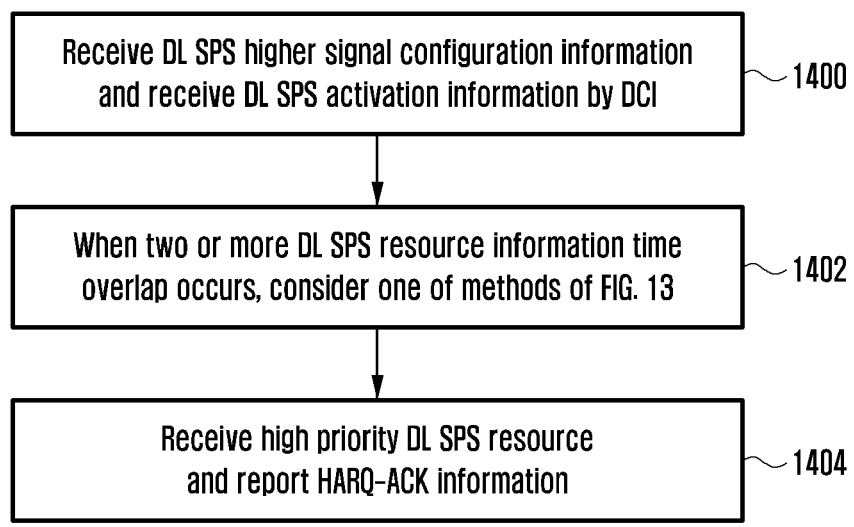
FIG. 14 is a block diagram illustrating a reception operation of a terminal in a situation in which two or more DL SPSs overlap with time, according to an embodiment.

FIG. 14 is a block diagram illustrating a reception operation of a terminal in a situation in which two or more DL SPSs overlap with time, according to an embodiment.

Referring to FIG. 14, in step 1400, the terminal receives DL SPS configuration information through a higher-level signal (RRC) in advance. In this case, index information on the DL SPS may also be received or indirectly configured. In addition, the terminal may activate DL SPS information configured on a higher layer by the DCI including the CRC scrambled with CS-RNTI individually or as a group. Here, the DL SPS may be activated only by receiving configuration information of a higher signal, and in this case, DCI reception including the CRC scrambled with CS-RNTI may be omitted. The terminal periodically receives information from resources previously configured for each of the DL SPSs. In step 1402, if the DL SPSs having two or more different indexes overlap in time, the terminal may perform at least one of Methods 13-1 to 13-5, described above with reference to FIG. 13. Accordingly, the terminal receives only the DL SPS having the highest priority (e.g., the lowest index value) and reports HARQ-ACK information in step 1404. In addition, the DL SPSs having a low priority (e.g., having a high index value) may not be received by the UE, reported as HARQ-ACK information, or may not generate HARQ-ACK information itself. When the terminal receives two or more DL SPS resources within one slot, the terminal may use one of the following two (2) methods when configuring the HARQ-ACK codebook.

Method 14-1: HARQ-ACK information may be mapped sequentially for the DL SPS resource having the lowest index. For example, when the terminal receives the DL SPS of index 1, the DL SPS of index 3, and the DL SPS of index 5 in one slot, the terminal reads the HARQ-ACK codebook (HARQ-ACK information for DL SPS index 1, HARQ-ACK information for DL SPS index 3, and HARQ-ACK information for DL SPS index 5).

Method 14-2: Based on the time resource domain of the DL SPSs actually received by the terminal in the slot, the HARQ-ACK information for the DL SPS received first is sequentially mapped. For example, when the DL SPS of index 1 is received at symbols 1 to 3, the DL SPS of index 3 is received at symbols 10 to 11, and the DL SPS of index 5 is received at symbols 4 to 6, From the viewpoint of the time resource in which the SPS PDSCH is actually transmitted/received, the terminal configures the HARQ-ACK codebook as HARQ-ACK information for DL SPS index 1, HARQ-ACK information for DL SPS index 5, and HARQ-ACK information for DL SPS index 3. Alternatively, the terminal uses the applied time domain resource allocation (TDRA) value when activating the DL SPS. That is, for DL SPSs received in one slot, the terminal generates a HARQ-ACK codebook with reference to 9.1.2 of 3GPP standard TS 38.213 for TDRA values for the corresponding DL SPSs.

Figure 15:
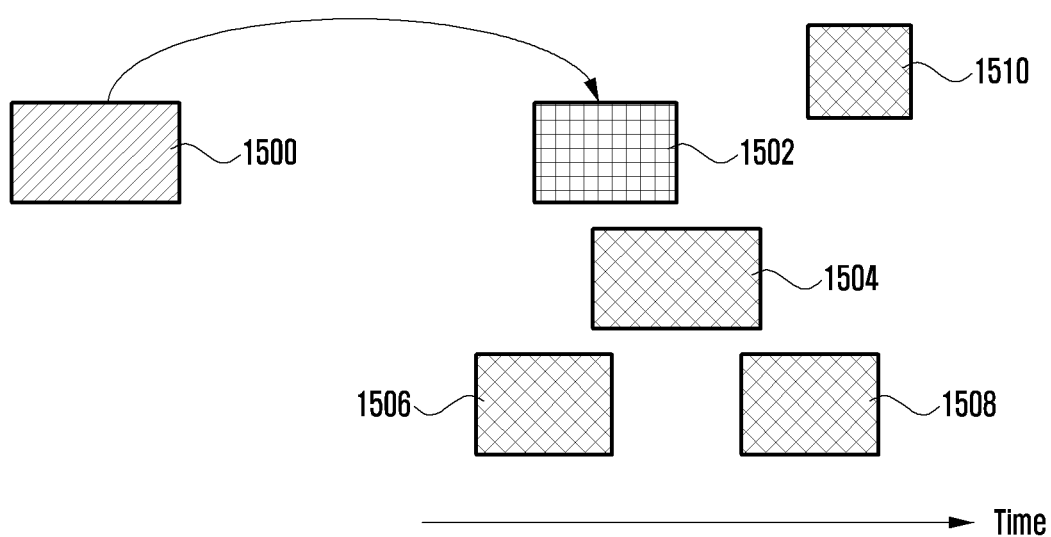
FIG. 15 is a diagram illustrating a reception operation of a terminal when a plurality of PDSCHs are overlapped and scheduled in terms of time resources, according to an embodiment.

FIG. 15 is a diagram illustrating a reception operation of a terminal when a plurality of PDSCHs are overlapped and scheduled in terms of time resources, according to an embodiment.

The terminal may report HARQ-ACK information for reception of the plurality of DL SPSs in a situation where a plurality of DL SPSs are received within one BWP. The DL SPS higher level configuration information will include information as shown in Table 13, below.

TABLE 13 sps-Configindex-r16: Index information of configured SPS
SPS-ConfigDeactivationStatList-r16: Table configuration information of SPS release, each state in the table includes one or more pieces of SPS configuration information (index)
SPS-ConfigDeactivationStat-r16: Include one or more pieces of SPS configuration information (index) in one state
SPS-PUCCH-AN-List: List of PUCCH resource ID for HARQ-ACK codebook is configured, and each PUCCH resource ID includes pay load size and commonly applied to all of SPS configuration information. When corresponding information is configured, nIPUCGH-AN configuration information is ignored
SPS-PUCCH-AN-ResourceID: PUCCH resource ID configuration information
MaxPayloadSize: Maximum pay load size for PUCCH resource ID
Periodicity: Transmission period of DL SPS TABLE 13-continued NrofHARQ-processes: Number of HARQ processes configured for DL SPS
NIPUCCH-AN: PUCCH resource ID, PUCCH resource ID is determined by separate PUCCH higher configuration information, Time/frequency resource information on which PUCCH is transmitted for each PUCCH resource ID, PUCCH format, or hopping information are included
mcs-Table: Whether to use MCS table 3 (QAM64LowSE)

The terminal may receive one or more SPSs within one BWP through the higher signal configuration information of Table 13. Other SPS configuration information is included in the DCI that activates the SPS. The DCI includes a CRC scrambled with CS-RNTI.

In FIGS. 13 and 14, a method of selecting and receiving one SPS PDSCH in a situation in which a plurality of SPS PDSCHs are simultaneously scheduled in a specific time resource is considered.

When one or more SPS PDSCHs and PDSCHs are scheduled with DCI overlap in time resources, the terminal follows the operation described below. In the disclosure, the SPS PDSCH means a PDSCH transmitted and received in a specific time resource domain periodically without DCI. The SPS PDSCH may be replaced with a term of a PDSCH provided without a corresponding (or scheduled) PDCCH or a PDSCH provided without a corresponding (or scheduled) DCI. The PDSCH scheduled by DCI means a PDSCH scheduled by DCI including CRC scrambled with C-RNTI or MCS-C-RNTI or CS-RNTI transmitted in the PDCCH. The PDSCH scheduled with DCI may be replaced with a term of a dynamically scheduled PDSCH or a PDSCH provided as a PDCCH. Specifically, the first SPS PDSCH scheduled by the DCI including the CRC scrambled with CS-RNTI is regarded as the PDSCH provided as the PDCCH, and the PDSCH scheduling retransmission for the SPS PDSCH is also regarded as the PDSCH provided as the PDCCH.

If the last symbol of the PDCCH containing CRC scrambled with C-RNTI or MCS-C-RNTI and containing DCI information for scheduling the PDSCH is at least 14 symbols before the first symbol of the PDSCH scheduled without DCI (after activating the SPS PDSCH by DCI format including CRC scrambled in CS-RNTI in advance), the terminal receives (or decodes) a PDSCH scheduled by DCI including CRC scrambled with C-RNTI or MCS-C-RNTI. The terminal does not receive (or decode) a PDSCH that is not scheduled by DCI. Except for the above conditions, when the PDSCH scheduled by DCI including CRC scrambled with C-RNTI or MCS-C-RNTI and PDSCH activated by DCI including CRC scrambled with CS-RNTI overlap at least one symbol in terms of time resources in one serving cell, the terminal does not expect to decode the two PDSCHs, and when the base station is scheduled as described above, the terminal considers an error case and performs a random operation.

Referring to FIG. 15, 1502 is a PDSCH scheduled by DCI in a specific PDCCH 1500, and 1504, 1506, 1508, and 1510 are SPS PDSCHs transmitted and received in a resource region periodically configured without DCI. When it is possible for the terminal to receive only one unicast PDSCH in a specific time resource region, as shown in FIG. 15, when a plurality of PDSCHs are simultaneously scheduled in a specific time resource region, the terminal needs to consider a method of receiving only one PDSCH among them. That is, in FIG. 15, when one PDSCH scheduled by DCI and one, two or more SPS PDSCHs overlap in a specific time resource region, a method of receiving the PDSCH of the terminal is considered. In FIG. 15, 1504, 1506, 1508, and 1510 are SPS PDSCHs each having different time and frequency resources and different transmission periods, and have different SPS PDSCH indexes, which are set or indicated in advance as a higher signal or an L1 signal.

The terminal applies at least one of the following three (3) methods. For the convenience of explanation, it is assumed that the index of 1504 is 1, the index of 1506 is 3, the index of 1508 is 5, and the index of 1510 is 6.

Method 15-1: The terminal receives one of the overlapped PDSCHs through the following two steps. In summary before the Method 15-1 is described in detail, the terminal resolves the overlap between the PDSCH provided by the PDCCH and the SPS PDSCHs, and then resolves the overlap between the PDSCH provided by the PDCCH and the SPS PDSCHs that do not overlap.

Step 1 of Method 15-1: First, the terminal resolves the overlap between the PDSCH scheduled by DCI and the overlapping SPS PDSCHs. Referring to FIG. 15 as an example, when the PDSCH 1502 provided by the PDCCH 1500 and the SPS PDSCHs 1504 and 1506 overlap, if the last symbol of the PDCCH 1500 providing the PDSCH 1502 exists 14 symbols before the first symbol of the SPS PDSCH 1506 allocated first in time among the SPS PDSCHs overlapping the corresponding PDSCH 1502, the terminal receives and demodulates/decodes the PDSCH 1502 provided by the PDCCH 1500, does not receive the SPS PDSCHs 1504 and 1506 overlapping the PDSCH 1502, and does not perform demodulation/decoding. Alternatively, when the PDSCH 1502 provided by the PDCCH 1500 and the SPS PDSCHs 1504 and 1506 overlap, if the last symbol of the PDCCH 1500 providing the PDSCH 1502 does not exist 14 symbols before the first symbol of the SPS PDSCH 1506 allocated first in time order among the SPS PDSCHs overlapping the corresponding PDSCH 1502, the terminal does not receive the PDSCH 1502 and SPS PDSCHs 1504 and 1506, or receives the SPS PDSCH 1504 having the lowest index among the SPS PDSCHs 1504 and 1506 and performs demodulation/decoding.

Step 2 of Method 15-1: When the PDSCH 1502 provided by the PDCCH 1500 and the non-overlapping SPS PDSCHs 1510 and 1508 overlap, the terminal receives the SPS PDSCH 1508 having the lowest index among them. Specifically, the terminal receives SPS PDSCHs and performs demodulation/decoding according to one of the methods described above with reference to FIGS. 13 to 14. Accordingly, the terminal receives the PDSCH 1502 and the SPS PDSCH 1508 in FIG. 15 and performs demodulation/decoding. Alternatively, if the PDSCH selected by the terminal in Step 2 of Method 15-1 is an SPS PDSCH other than the PDSCH 1502, and the SPS PDSCH and other SPS PDSCHs overlap, the terminal receives the SPS PDSCH according to one of the above-described methods with reference to FIGS. 13 to 14 and performs demodulation/decoding. For example, when the terminal receives the SPS PDSCH 1504, the terminal does not receive the SPS PDSCH 1508 overlapping the SPS PDSCH 1504, but will receive the SPS PDSCH 1510. Accordingly, in FIG. 15, the terminal will receive the SPS PDSCH 1504 and the SPS PDSCH 1510, and perform demodulation/decoding.

Method 15-2. The terminal receives one of the overlapped PDSCHs through the following two steps. For reference, Step 2 is the same as Step 2 in Method 15-1, but the process of determining the standard of 14 symbols in Step 2 is different.

Step 1 of Method 15-2: First, the terminal resolves the overlap between the PDSCH scheduled by DCI and the overlapping SPS PDSCHs. Referring to FIG. 15 as an example, when the PDSCH 1502 provided by the PDCCH 1500 and the SPS PDSCHs 1504 and 1506 overlap, if the last symbol of the PDCCH 1500 providing the PDSCH 1502 exists 14 symbols before the first symbol of the SPS PDSCH 1504 having the lowest index among the SPS PDSCHs overlapping the corresponding PDSCH 1502, the terminal receives and demodulates/decodes the PDSCH 1502 provided by the PDCCH 1500, does not receive the SPS PDSCHs 1504 and 1506 overlapping the PDSCH 1502, and does not perform demodulation/decoding. Alternatively, when the PDSCH 1502 provided by the PDCCH 1500 and the SPS PDSCHs 1504 and 1506 overlap, if the last symbol of the PDCCH 1500 providing the PDSCH 1502 does not exist 14 symbols before the first symbol of the SPS PDSCH 1506 allocated first in time order among the SPS PDSCHs overlapping the corresponding PDSCH 1502, the terminal does not receive the PDSCH 1502 and SPS PDSCHs 1504 and 1506 or receives the SPS PDSCH 1504 having the lowest index among the SPS PDSCHs 1504, and 1506 and performs demodulation/decoding.

Step 2 of Method 15-2: When the PDSCH 1502 provided by the PDCCH 1500 and the non-overlapping SPS PDSCHs 1510 and 1508 overlap, the terminal receives the SPS PDSCH 1508 having the lowest index among them. Specifically, the terminal receives SPS PDSCHs and performs demodulation/decoding according to one of the methods described above with reference to FIGS. 13 to 14. Accordingly, the terminal receives the PDSCH 1502 and the SPS PDSCH 1508 in FIG. 15 and performs demodulation/decoding. Alternatively, if the PDSCH selected to be received by the terminal in Step 2 of Method 15-2 is an SPS PDSCH other than the PDSCH 1502, and the SPS PDSCH and other SPS PDSCHs overlap, the terminal receives the SPS PDSCH according to one of the above-described methods with reference to FIGS. 13 to 14 and performs demodulation/decoding. For example, when the terminal receives the SPS PDSCH 1504, the terminal will not receive the SPS PDSCH 1508 overlapping with the SPS PDSCH 1504, but will receive the SPS PDSCH 1510. Accordingly, in FIG. 15, the terminal will receive the SPS PDSCH 1504 and the SPS PDSCH 1510, and perform demodulation/decoding.

Method 15-3: The terminal receives one of the overlapped PDSCHs through the following two steps. In Method 15-3, unlike Methods 15-1 and 15-2, whether the PDSCHs scheduled by DCI overlap is considered after solving the overlap between SPS PDSCHs. In summary, the overlap between the SPS PDSCHs is solved regardless of the PDSCH provided by the PDCCH, and thereafter, the overlap between the PDSCH and the SPS PDSCHs provided by the PDCCH is solved.

Step 1 of Method 15-3: First, the terminal solves the overlapping problem between SPS PDSCHs without considering the PDSCH scheduled by DCI. Accordingly, the terminal determines the SPS PDSCH according to one of the methods described above in FIGS. 13 to 14. For example, the terminal decides to receive the SPS PDSCH 1504 and the SPS PDSCH 1510.

Step 2 of Method 15-3: The terminal determines whether the SPS PDSCHs 1504 and 1510 selected in Step 1 of Method 15-3 and the PDSCH 1502 provided as the PDCCH 1500 overlap. When the SPS PDSCH 1504 overlaps the PDSCH 1502, if the last symbol of the PDCCH 1500 containing the DCI scheduling the PDSCH 1502 exists 14 symbols before the first symbol of the SPS PDSCH 1504, the terminal does not receive the SPS PDSCH 1504, but receives the PDSCH 1502 and performs demodulation/decoding. Accordingly, in FIG. 15, the terminal receives the PDSCH 1502 and the SPS PDSCH 1510. Alternatively, when the SPS PDSCH 1504 overlaps with the PDSCH 1502, if the last symbol of the PDCCH 1500 including the DCI scheduling the PDSCH 1502 does not exist 14 symbols before the first symbol of the SPS PDSCH 1504, the terminal does not expect to receive the SPS PDSCH 1504 and PDSCH 1502, or the SPS PDSCH 1504 receives and performs demodulation/decoding and the terminal does not receive the PDSCH 1502. Accordingly, in FIG. 15, the terminal receives the SPS PDSCH 1504 and the SPS PDSCH 1510.

In the above methods, the above-described 14 symbols can be applied by replacing them with other symbol values. Alternatively, absolute time ($T_{proc}$) can be expressed according to Equation (1) below.

$$T_{proc}=N \cdot (2048+144) \cdot \kappa 2^{-\mu} \cdot T_C \qquad (1)$$

In Equation (1), the value of N is an integer value that can have different values according to terminal processing capability and subcarrier spacing. $\mu$ is a subcarrier spacing, which means the smallest value among the subcarrier spacings of the PDCCH and PDSCH. For reference, at 15 kHz, $\mu=0$, at 30 kHz, $\mu=1$, at 60 kHz, $\mu=2$, at 120 kHz, $\mu=3$, and at 240 kHz, $\mu=4$. For $\kappa$ and $T_C$, the values defined in Section 4.1 of 3GPP standard TS38.211 are used.

In FIG. 15, the overlap between the above-described SPS PDSCHs and PDSCHs provided through PDCCH transmission is considered in a situation in which all of the PDSCHs are configured as downlink symbols. If a symbol direction can be determined as a downlink symbol, a flexible symbol, or an uplink symbol in a TDD situation, a method for the terminal to determine a candidate group of SPS PDSCHs may be as follows.

If the terminal is not configured to perform monitoring of the dynamic SFI L1 signal, the terminal may not receive SPS PDSCHs in which at least one symbol has been previously determined as an uplink symbol by a higher signal among a plurality of activated SPS PDSCHs. Alternatively, when the terminal is configured to perform monitoring of the dynamic SFI L1 signal and receives the SFI L1 signal, the terminal may not receive the SPS PDSCH in which at least one symbol of the plurality of activated SPS PDSCHs is indicated as an uplink symbol or a flexible symbol by the SFI signal. Alternatively, if the terminal is configured to perform monitoring of the dynamic SFI L1 signal but does not receive the SFI L1 signal, the terminal may not receive the SPS PDSCH in which at least one symbol among the plurality of activated SPS PDSCHs is indicated as an uplink symbol and a flexible symbol by a higher signal in advance. Methods for determining the configured or indicated symbol direction for SPS PDSCH reception in the above-described TDD situation may be applied according to each step of the Methods 15-1 to 15-3.

Figure 16:
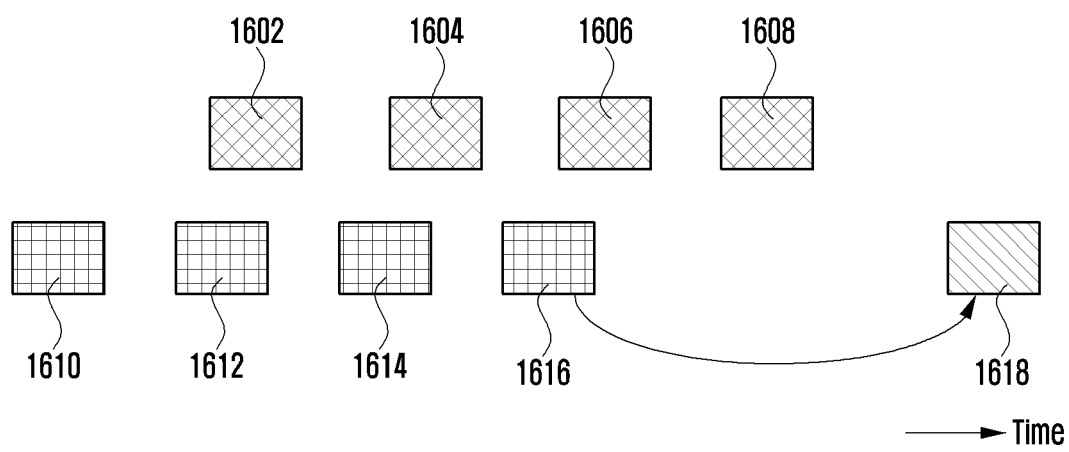
FIG. 16 is a diagram illustrating a situation in which HARQ-ACK information is transmitted in an SPS PDSCH repeated transmission situation, according to an embodiment.

FIG. 16 is a diagram illustrating a situation in which HARQ-ACK information is transmitted in a SPS PDSCH repeated transmission situation, according to an embodiment.

For a PDSCH set by a higher signal and activated by a specific DCI format and scheduled without PDCCH transmission, if the terminal is configured to support repetitive transmission for the DCI format, the terminal applies the allocation of the same symbol as many times as the number of consecutive slots of the number of repeated transmissions. For example, when a specific SPS index i is activated by DCI format 1_1 in a situation where the number of repetitive transmissions of 4 times has been previously set as a higher signal for DCI format 1_1, the SPS PDSCH corresponding to the specific SPS index i is repeatedly transmitted in 4 consecutive slots every period previously set as a higher signal. In addition, it is assumed that the same TB is repeated for repeatedly transmitted PDSCHs, and that the terminal is configured to have a single transport layer for the corresponding PDSCH. Also, it is assumed that the redundancy version (RV) value applied to the TB of the $N^{th}$ transmission is determined in the following manner. That is, it is assumed that the RV value of the first SPS PDSCH (N=0) among the SPS PDSCHs repeatedly transmitted for SPS PDSCHs scheduled without the PDCCH is configured as 0. A pattern of 0, 2, 3, 1 is sequentially applied to the SPS PDSCHs transmitted thereafter, and the pattern is repeated when the repetitive transmission is 4 or more times. Therefore, it is assumed that the terminal applies values set forth in Table 14, below, to the RV.

TABLE 14

| RV value applied to Nth transmission | | | |
|---|---|---|---|
| N mod 4 = 0 | N mod 4 = 1 | N mod 4 = 2 | N mod 4 = 3 |
| 0 | 7 | 3 | 1 |

A higher signal indicating repetitive transmission for a specific DCI format is configured, and for a PDSCH scheduled in the DCI format, the terminal determines the timing of transmitting HARQ-ACK information for repeated reception of the corresponding PDSCH based on the slot of the last scheduled PDSCH. In other words, when a specific DCI field is included in the DCI format, the terminal receives a PDSCH to HARQ-ACK feedback timing value according to the DCI field value, and when the DCI field is not included in the DCI format, the terminal receives a PDSCH to HARQ-ACK feedback timing value by a pre-set higher signal. When the corresponding value is k, the terminal transmits a PUCCH or PUSCH including HARQ-ACK information for PDSCHs repeatedly transmitted from slot $n-N_{repeat}+1$ to slot n according to the DCI format to the base station in slot n+k, based on slot n of the last scheduled PDSCH. The $N_{repeat}$ is the number of repetitive transmissions of the PDSCH previously configured as a higher signal. If the terminal reports HARQ-ACK information for reception of the PDSCH in a slot other than the slot n+k, the terminal reports by configuring the HARQ-ACK information bit for the PDSCH as a NACK value.

FIG. 16 is a diagram illustrating that a terminal reports HARQ-ACK information for reception of an SPS PDSCH in a situation where two SPSs are configured and activated. Specifically, FIG. 16 illustrates a situation in which, for the first SPS, SPS PDSCHs 1602, 1604, 1606, and 1608 are repeatedly transmitted over four consecutive slots at a specific period, and it is assumed that the corresponding SPS index value is set to 0. In addition, for the second SPS, it is assumed that the SPS PDSCHs 1610, 1612, 1614, and 1616 are repeatedly transmitted over four consecutive slots at a specific period that is the same as or different from the first SPS, and the corresponding SPS index value is configured as 1. In addition, the PUCCH or PUSCH through which HARQ-ACK information is transmitted and received for the SPS PDSCHs is repeatedly transmitted and received in the second SPS is 1618. HARQ-ACK information for SPS PDSCHs repeatedly transmitted/received in the first SPS is omitted for convenience. Basically, the terminal determines the slot of the PUCCH or PUSCH in which HARQ-ACK information for the last SPS PDSCH is transmitted/received, based on the slot in which the last SPS PDSCH is transmitted/received among the SPS PDSCHs repeatedly transmitted/received from the viewpoint of the scheduled SPS PDSCH, regardless of actually transmitting and receiving SPS PDSCHs. However, if the SPS PDSCHs overlap with each other in even at least one symbol in the time resource, since the terminal can receive only one SPS PDSCH, the terminal receives the SPS PDSCH having the lowest index value among the SPS PDSCHs. Therefore, in FIG. 16, since the index of the second SPS is higher than the index of the first SPS, the terminal does not actually receive the SPS PDSCHs 1612, 1614, and 1616 overlapping the SPS PDSCHs 1602, 1604, and 1606 related to the first SPS. Therefore, from the viewpoint of HARQ-ACK transmission for the SPS PDSCH, there is a possibility that the HARQ-ACK transmission for the second SPS PDSCH can be performed more quickly. Therefore, in order to transmit a PUCCH or PUSCH including HARQ-ACK information, the terminal transmits a PUCCH or PUSCH including HARQ-ACK information after k slots, based on the slot of the SPS PDSCH 1610 that was actually last received for the second SPS. In FIG. 16, it is assumed that, in the second SPS, the slot through which the SPS PDSCH 1610 is transmitted and received is n−3, the slot through which the SPS PDSCH 1612 is transmitted and received is n−2, the slot through which the SPS PDSCH 1614 is transmitted and received is n−1, and the slot through which the SPS PDSCH 1616 is transmitted and received is n. Also, it is assumed that, in the first SPC, the slot through which the SPS PDSCH 1602 is transmitted and received is n−2, the slot through which the SPS PDSCH 1604 is transmitted and received is n−1, the slot through which the SPS PDSCH 1606 is transmitted and received is n, and the slot through which the SPS PDSCH 1608 is transmitted and received is n+1.

Therefore, when the slot of the SPS PDSCH 1616 in FIG. 16 is n, the terminal transmits PUCCH or PUSCH including HARQ-ACK information in slot n−3+k, based on slot n−3 in which the SPS PDSCH 1610 was actually received last in the repetitive transmission for the second SPS according to the above-described proposed method. The above-described method is a criterion for determining the last reception slot of the SPS PDSCH, and is determined under the condition that reception of the corresponding SPS PDSCH is not performed by other SPS settings.

Even if the SPS PDSCH overlaps with the PDSCH scheduled by the PDCCH, the terminal does not receive the SPS PDSCH, in which case the above-described method is not considered. For example, as a reason the terminal does not receive the SPS PDSCH 1616, if the overlapping PDSCH 1606 is a PDSCH scheduled by a PDCCH other than the SPS PDSCH, the terminal determines the HARQ-ACK transmission timing based on the slot of the SPS PDSCH 1616. The reason for not considering the SPS PDSCHs canceled by the dynamically scheduled PDSCH is that the terminal does not know when and at which point the corresponding dynamically scheduled PDSCH will be transmitted from the base station, and there is a possibility that the terminal misses DCI information for scheduling the corresponding PDSCH. If the terminal misses the corresponding DCI information, there is a possibility that the base station and the terminal determine different slot values for transmitting HARQ-ACK information. Therefore, when determining the slot value of the PUCCH or PUSCH including HARQ-ACK information for repeated SPS PDSCH transmission/reception, the terminal makes a determination based on the slot value of the SPS PDSCH configured to be transmitted and received later among the SPS PDSCHs of the SPS corresponding to an index smaller than the corresponding SPS index value among the SPS PDSCHs that are repeatedly transmitted and received. In addition, in the case of TDD, the above method may be applied in the same manner to SPS PDSCHs including at least one symbol determined as an uplink symbol and as a higher signal in advance, irrespective of the SFI L1 signal that dynamically provides symbol information.

In summary, when the terminal determines a slot of a PUCCH or PUSCH including HARQ-ACK information for a specific SPS, the terminal determines the slot value of the SPS PDSCH to be transmitted and received last among SPS PDSCHs not excluded from reception by at least one of the following conditions.

Condition 16-1: SPS PDSCHs overlapping with the SPS PDSCH of the SPS having an index value lower than the index of the specific SPS are excluded from reception Condition 16-2: SPS PDSCHs in which at least one symbol is previously indicated as an uplink symbol as a higher signal are excluded from reception For example, in FIG. 16, when SPS PDSCHs 1610, 1612, 1614, 1616 are PDSCHs through which one TB is repeatedly transmitted and received, the SPS PDSCH 1614 overlaps with another SPS PDSCH 1604 having a low index value and is determined not to receive the UE, and the SPS PDSCH 1616 is determined to not receive the terminal by including at least one uplink symbol as a higher signal in advance, the terminal determines a slot in which a PUCCH or PUSCH including HARQ-ACK information for the corresponding SPS PDSCH can be transmitted (i.e., slot n−2+k), based on the slot value of the last SPS PDSCH 1612 (i.e., slot n−2) among the remaining SPS PDSCHs other than the SPS PDSCHs 1614 and 1616 determined not to be received. In another method not yet described, the HARQ-ACK transmission timing is always determined based on the last slot of the last transmitted/received SPS PDSCH among repeatedly transmitted/received SPS PDSCHs regardless of whether the actual SPS PDSCH is transmitted or received.

A terminal that has previously configured a higher signal to report a type 1 HARQ-ACK codebook generation and HARQ-ACK feedback when any one SPS PDSCH satisfies at least one of Condition 16-1 or Condition 16-2, in a slot other than the transmission slot (e.g., n+k or n−a+k, where n−a is the last reception slot of the SPS PDSCH determined by the method) including the HARQ-ACK information determined by at least one of the above methods described with reference to FIG. 16, the terminal configures the HARQ-ACK information bit for reception of the corresponding SPS PDSCH to NACK, or does not generate the corresponding HARQ-ACK information bit because the actual SPS PDSCH has not been received.

Conditions proposed to consider a method of determining a HARQ-ACK transmission timing for the repeatedly transmitted SPS PDSCH may be sufficiently considered to determine an RV value and described with reference to FIG. 17 below.

Figure 17:
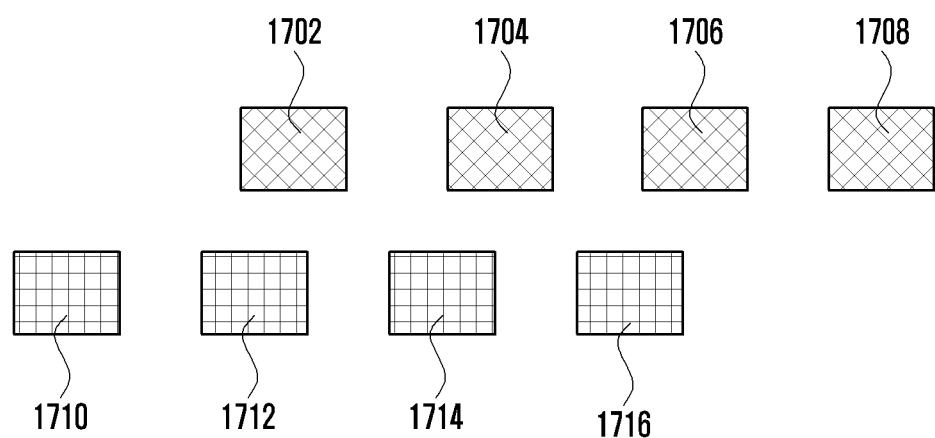
FIG. 17 is a diagram illustrating a method of determining a redundancy version (RV) for repetitive SPS PDSCH transmission, according to an embodiment.

FIG. 17 is a diagram illustrating a method of determining an RV for repetitive SPS PDSCH transmission, according to an embodiment.

As described above in FIG. 16, when the SPS PDSCH is repeatedly transmitted, the RV value may be determined based on Table 14. However, in a situation that the terminal is configured with two SPS higher and activated as shown in FIG. 17, when SPS PDSCHs 1702, 1704, 1706, and 1708 according to the first SPS are SPS PDSCHs in which one TB is repeatedly transmitted and are SPSs having a value of index 1, and SPS PDSCHs 1710, 1712, 1714, and 1716 according to the second SPS are SPS PDSCHs in which another TB is repeatedly transmitted and are SPSs having a value of index 0, the terminal does not actually receive the SPS PDSCHs 1702, 1704, and 1706 by the other SPS PDSCHs 1712, 1714, and 1716 having an index lower than that of the corresponding SPS. In this case, if the RV value is set regardless of whether the SPS PDSCH is actually transmitted or received, as shown in Table 14, the RV of the SPS PDSCH 1702 will be 0, the RV of the SPS PDSCH 1704 will be 2, the RV of the SPS PDSCH 1706 will be 3, the RV of the SPS PDSCH 1708 will be 1, and the terminal will only receive the SPS PDSCH 1708 having an RV value of 1 for the first SPS. RV is a value that indicates where the information (or bit values) generated after the terminal has channel-coded specific data information starts, and is generally known to have a higher decoding performance of a PDSCH indicated by RV0 or RV3 than that of a PDSCH indicated by RV1 or RV2.

Accordingly, in the above-described situation of FIG. 17, for the first SPS, the terminal receives the SPS PDSCH 1708 indicated as RV1, and thus the decoding performance may be low. Thus, if the terminal can determine the reception time of SPS PDSCHs for a specific SPS in advance, it may be possible to determine the RV values of each SPS PDSCH accordingly. In FIG. 17, since both the SPS PDSCH according to the first SPS and the SPS PDSCH according to the second SPS are SPS PDSCHs activated by the higher signal and the L1 signal in advance, and are periodically transmitted and received, if specific SPS PDSCHs overlap each other in terms of time resources in advance, the terminal may determine which SPS PDSCH according to which one SPS that is selected and received.

That is, in the situation described with reference to FIG. 17, since the terminal receives only the SPS PDSCH 1708 for the first SPS, the terminal may be able to map the RV of the SPS PDSCH 1708 to 0 instead of 1. On the other hand, when the terminal determines not to receive a specific SPS PDSCH due to overlap with a PDSCH scheduled by another PDCCH, dynamic change of the RV value may not be considered. This is because, if the terminal misses the DCI information of the PDCCH transmitted for the dynamically scheduled PDSCH, a problem that the base station and the terminal assume different RV values may occur, which may degrade decoding performance for the SPS PDSCH. In addition, since both the base station and the terminal know that the terminal does not receive the corresponding SPS PDSCH for an SPS PDSCH including a symbol previously set as an uplink symbol as a higher signal in the TDD situation as described above in FIG. 16, the RV value mapping may be performed based on corresponding information. In summary, the terminal may apply the above-described method of applying the RV value to SPS PDSCHs in which one TB is repeatedly transmitted, only to SPS PDSCHs not excluded from reception by at least one of the following conditions.

Condition 17-1: SPS PDSCHs overlapping with the SPS PDSCH of the SPS having an index value lower than the index of the specific SPS are excluded from reception Condition 17-2: SPS PDSCHs in which at least one symbol is previously indicated as an uplink symbol as a higher signal are excluded from reception For example, in FIG. 17, in a situation in which the SPS PDSCH 1704 overlaps with another SPS PDSCH 1714 having an index lower than that of the corresponding SPS and is determined not to be received by the UE, and the SPS PDSCH 1706 is determined not to receive the corresponding SPS PDSCH because at least one symbol is previously configured as an uplink symbol by a higher signal, the terminal may determine that the SPS PDSCH 1702 is RV0 and the SPS PDSCH 1708 is RV1 based on all of the above conditions.

In another method for determining the RV for the repeatedly transmitted/received SPS PDSCH as shown in FIG. 17, the SPS PDSCH may be determined based on the scheduled time resource region regardless of the actual transmission/reception of the SPS PDSCH. For example, even though the SPS PDSCH 1704 is not actually transmitted/received with respect to the SPS PDSCHs 1702, 1704, 1706, 1708 according to the first SPS of FIG. 17, the terminal may consider that 0 is applied to the RV of the SPS PDSCH 1702, 3 is applied to the RV of the SPS PDSCH 1706, and 1 is applied to the RV of the SPS PDSCH 1708.

Figure 18:
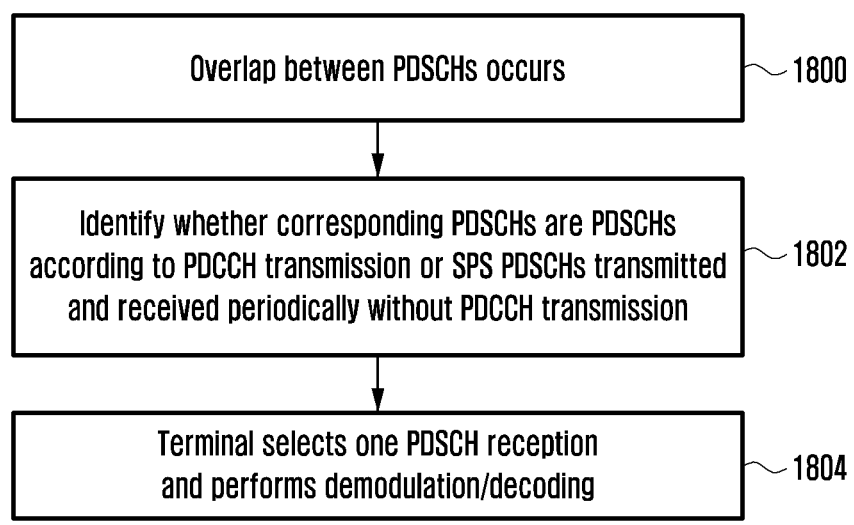
FIG. 18 is a block diagram illustrating a method of receiving a PDSCH by a terminal in a PDSCH overlapping situation, according to an embodiment.

FIG. 18 is a block diagram illustrating a method of receiving a PDSCH by a terminal in a PDSCH overlapping situation, according to an embodiment.

The terminal receives higher-level signal information for SPS configuration in advance. Here, the higher signal information may correspond to all or part of the information presented in Table 13 described above with reference to FIG. 15. Thereafter, after receiving the DCI indicating activation of the SPS set in advance, the terminal periodically receives the SPS PDSCH. In addition, the terminal may receive two or more SPSs within one cell or one BWP.

Referring to FIG. 18, in step 1800, the terminal confirms that the PDSCH overlapping situation occurs. For example, the terminal may confirm based on at least one of the following situations.

Situation 1: Overlap between one PDSCH and another SPS PDSCH scheduled by DCI

Situation 2: Overlap between one PDSCH scheduled by DCI and a plurality of other SPS PDSCHs Situation 3: Overlap between multiple SPS PDSCHs The terminal determines which of the above situations is the PDSCH overlap. In step 1802, the terminal identifies whether corresponding PDSCHs are PDSCHs according to a PDCCH transmission or SPS PDSCHs transmitted and received periodically without a PDCCH transmission.

In step 1804, the terminal selects one PDSCH reception and performs demodulation or decoding. In the case of situation 1 or 2, the terminal selects and receives an overlapped PDSCH, and demodulates or decodes the selected PDSCH by at least one of the methods described with reference to FIG. 15. In the case of situation 3, the terminal selects and receives an overlapped PDSCH, and demodulates or decodes the selected PDSCH by at least one of the methods described above with reference to FIG. 13.

Figure 19:
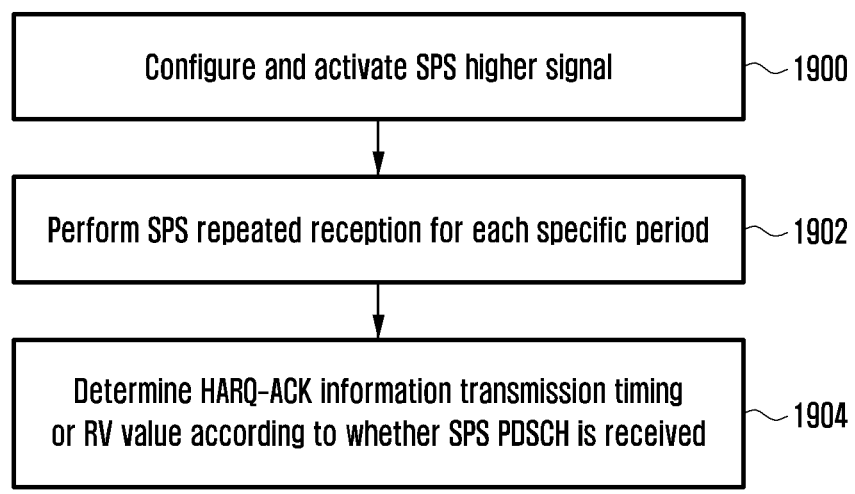
FIG. 19 is a block diagram illustrating a method of determining a HARQ-ACK feedback timing and an RV value of a terminal in a situation of repeated SPS PDSCH reception, according to an embodiment.

FIG. 19 is a block diagram illustrating a method of determining a HARQ-ACK feedback timing and an RV value of a terminal in a situation of repeated SPS PDSCH reception, according to an embodiment.

The terminal receives higher-level signal information for SPS configuration in advance. Here, the higher signal information may correspond to all or part of the information presented in Table 13 described above with reference to FIG. 15. Before receiving the DCI format for activating the SPS, if the terminal receives a higher configuration for repetitive transmission of the corresponding DCI format, the terminal may receive the DCI format for activating the SPS.

Referring to FIG. 19, in step 1900, the terminal configures and activates the SPS higher signal. In step 1902, the terminal performs SPS PDSCH repetitive reception for the SPS activated through the DCI format for as many slots as the number of repetitive transmissions set as the higher signal every period set as the higher signal. For example, when the number of repetitive transmissions is 4 and the transmission period is 10 slots, the terminal may perform repeated reception of the SPS PDSCH for every 10 slots and 4 consecutive slots. In step 1904, the terminal determines a slot in which a PUCCH or a PUSCH including HARQ-ACK information for repeatedly transmitted/received SPS PDSCHs is transmitted based on at least one of the above-described methods with reference to FIG. 17. In addition, in step 1904, the terminal determines the RV values for the repeatedly transmitted and received SPS PDSCHs based on at least one of the above-described methods with reference FIG. 18.

Figure 20:
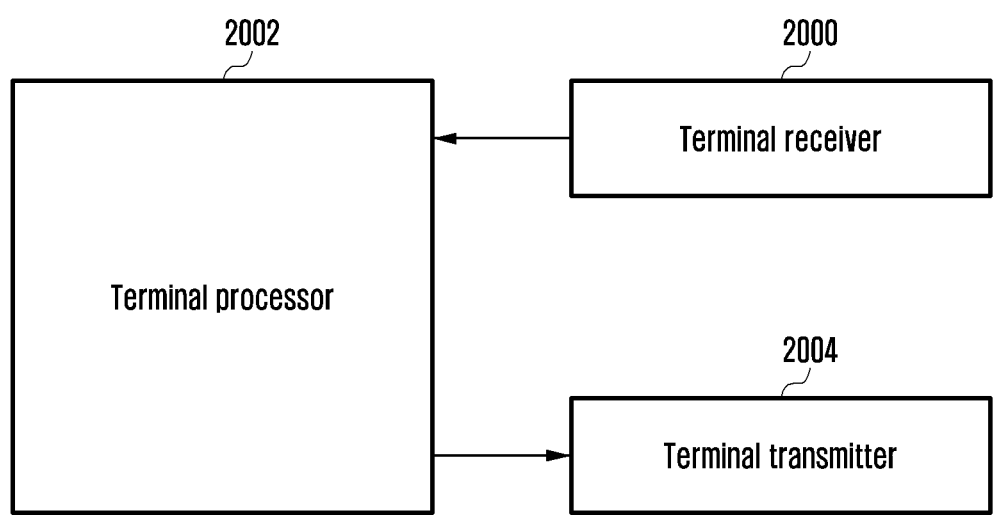
FIG. 20 is a block diagram illustrating the structure of a terminal, according to an embodiment.

FIG. 20 is a block diagram illustrating the structure of a terminal, according to an embodiment.

Referring to FIG. 20, the terminal includes a terminal receiver 2000, a terminal transmitter 2004, and a terminal processor 2002. The terminal receiver 2000 and the terminal transmitter 2004 may be collectively referred to as a transceiver. The transceiver may transmit and receive signals with a base station. The signal may include control information and data. To this end, the transceiver may include a radio frequency (RF) transmitter that up-converts and amplifies a frequency of a transmitted signal, and an RF receiver that amplifies a received signal with low noise and down-converts a frequency. In addition, the transceiver may receive a signal through a wireless channel, output the same to the terminal processor 2002, and transmit the signal output from the terminal processor 2002 through a wireless channel. The terminal processor 2002 may control a series of processes so that the terminal can operate according to the above-described embodiments.

Figure 21:
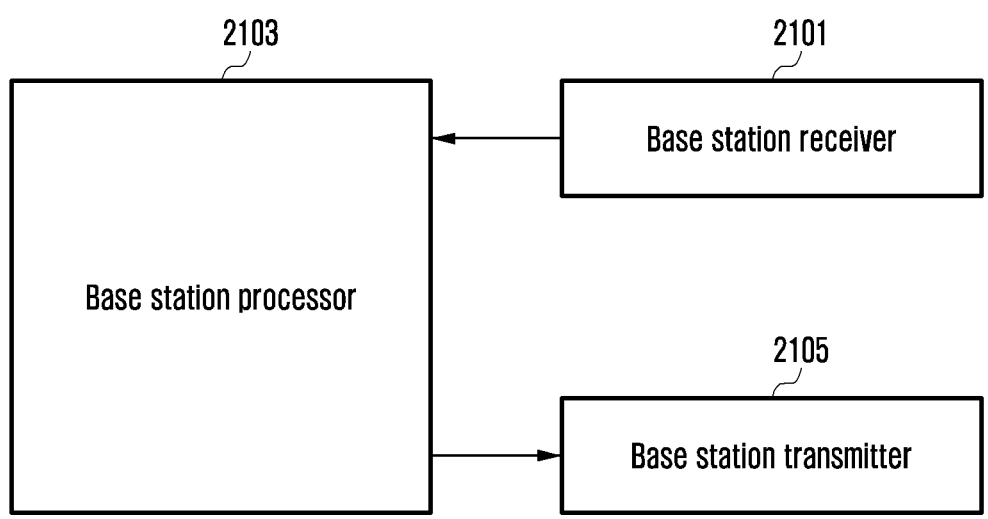
FIG. 21 is a block diagram illustrating a structure of a base station, according to an embodiment.

FIG. 21 is a block diagram illustrating a structure of a base station, according to an embodiment.

Referring to FIG. 21, a base station includes at least one of a base station receiver 2101, a base station transmitter 2105, and a base station processor 2103. The base station receiver 2101 and the base station transmitter 2105 may be collectively referred to as a transceiver. The transceiver may transmit and receive signals with a terminal. The signal may include control information and data. To this end, the transceiver may include an RF transmitter that up-converts and amplifies a frequency of a transmitted signal, and an RF receiver that amplifies a received signal with low noise and down-converts a frequency. In addition, the transceiver may receive a signal through a wireless channel, output the same to the base station processor 2103, and transmit the signal output from the base station processor 2103 through the wireless channel. The base station processor 2103 may control a series of processes so that the base station can operate according to the above-described embodiments.

Figure 22:
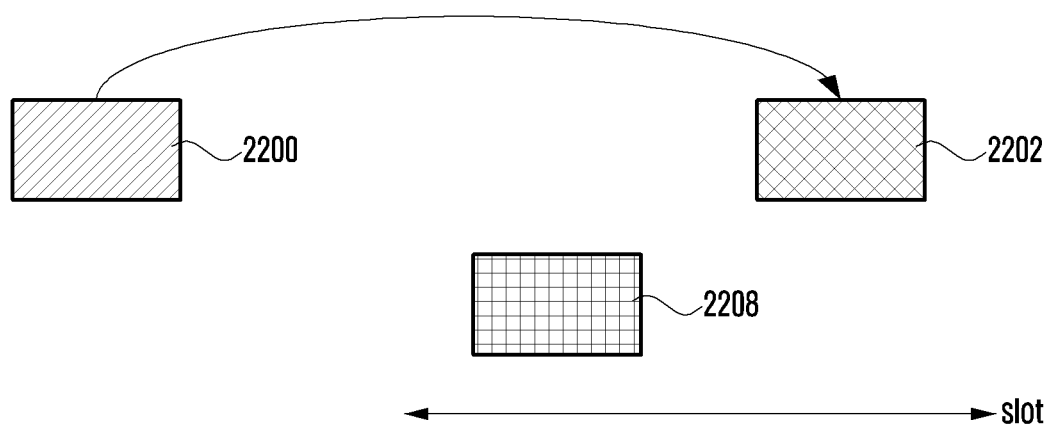
FIG. 22 is a diagram illustrating a situation in which a plurality of PDSCHs are allocated to one terminal in one serving cell, according to an embodiment.

FIG. 22 is a diagram illustrating a situation in which a plurality of PDSCHs are allocated to one terminal in one serving cell, according to an embodiment.

Within one serving cell, the terminal may be scheduled to receive PDSCH by DCI included in the PDCCH received from the base station or to periodically schedule PDSCH without PDCCH. The former refers to dynamic PDSCH scheduling by PDCCH, and the latter refers to periodic PDSCH scheduling or SPS PDSCH scheduling according to configuration by a higher signal and activation by an L1 signal. FIG. 22 illustrates a situation in which a terminal is scheduled with a PDSCH 2202 scheduled by a PDCCH 2200 and an SPS PDSCH 2208 without a separate PDCCH for scheduling within one slot.

If the terminal has the ability to receive and process a plurality of PDSCHs within one slot, the terminal may receive two different PDSCHs 2202 and 2208 in the situation shown in FIG. 22.

On the contrary, if the terminal has the ability to receive and process only one PDSCH in one slot and reports it to the base station (or when the terminal reports the ability to not receive two or more unicast PDSCHs in one slot to the base station), as shown in FIG. 22, in a situation in which a plurality of PDSCHs are scheduled in one slot within one serving cell, the terminal may perform at least one of the following two (2) methods or a combination thereof. In addition, although FIG. 22 shows that two PDSCHs 2202 and 2208 in one serving cell are scheduled in different time resources within one slot, even in a situation in which at least some symbols are overlapped, the terminal may perform at least one of the following methods or a combination thereof.

Method 22-1: The terminal receives and decodes the PDSCH 2202 provided by the PDCCH 2200 and reports HARQ-ACK information thereto to the base station. The terminal does not receive the SPS PDSCH 2208 and does not report HARQ-ACK information for this to the base station. The operation described above in Method 22-1 may be always valid without conditions or may be valid only under certain conditions. For example, the above-described operation may be effective only when the last symbol of the PDCCH 2200 providing scheduling information of the PDSCH 2202 exists before X symbols (i.e., the number of symbols after the first symbol) of the SPS PDSCH 2208, and in other cases, the terminal may regard it as an error case and perform an arbitrary operation. The X value may be 14 or may have the same or different integer value according to the subcarrier spacing value. The PDCCH is a channel through which DCI including CRC scrambled with C-RNTI, CS-RNTI or MCS-C-RNTI is transmitted.

Method 22-2: If the last symbol of the PDCCH 2200 providing scheduling information of the PDSCH 2202 exists before the first symbol of the SPS PDSCH 2208, the terminal may receive and decode the PDSCH 2202, and report HARQ-ACK information thereto to the base station. In addition, the SPS PDSCH 2208 may not be received and HARQ-ACK information for this may not be reported to the base station. On the other hand, when the last symbol of the PDCCH 2200 providing scheduling information of the PDSCH 2202 does not exist before X symbols (i.e., the number of symbols after the first symbol) of the SPS PDSCH 2208, the terminal does not receive the PDSCH 2202 because it the PDSCH 2202 is not valid, and the terminal may report HARQ-ACK information for the SPS PDSCH 2208 to the base station after receiving and decoding the SPS PDSCH 2208.

When a terminal having the ability to receive only one PDSCH per slot in one serving cell is configured or scheduled to receive two or more PDSCHs in a specific slot, if there is a PDSCH scheduled by the PDCCH among the two or more PDSCHs, the terminal may receive the PDSCH scheduled by the PDCCH, and report HARQ-ACK information for this to the base station. In addition, the terminal may not receive other PDSCHs and may not report HARQ-ACK information for this.

When a terminal having the ability to receive only one PDSCH per slot in one serving cell is configured or scheduled to receive two or more PDSCHs in a specific slot, if there is not a PDSCH scheduled by the PDCCH among the two or more PDSCHs, the terminal may receive the SPS PDSCH having the lowest index and report HARQ-ACK information for this to the base station. In addition, the terminal may not receive other PDSCHs and may not report HARQ-ACK information for this.

Referring to FIG. 22, in a situation in which the base station allocates the SPS PDSCH 2208 resource for periodically occurring eMBB data transmission and reception to the terminal, the PDSCH 2202 resource for the suddenly generated URLLC data transmission and reception may be scheduled through the PDCCH 2200. In this example, even though the terminal cannot receive a plurality of unicast PDSCHs in one slot and URLLC data is more important than eMBB data, the base station and the terminal may intentionally not transmit and receive eMBB data in the SPS PDSCH 2208 resource. Rather, the base station and the terminal may be able to transmit and receive URLLC data in the dynamically allocated PDSCH 2202 resource through the PDCCH 2200.

In FIG. 22, a situation in which the PDSCH 2202 is scheduled to be transmitted or received later than the PDSCH 2208 is described, but on the contrary, it may be sufficiently applicable to a situation in which the PDSCH 2202 is scheduled to be transmitted or received earlier than the PDSCH 2208. In addition, although the PDSCH has been mainly described above in FIG. 22, it can also be applied to the PUSCH. For example, in FIG. 22, PUSCH 2202 is a resource scheduled by PDCCH 2200, and PUSCH 2208 is a resource that can transmit and receive information periodically without PDCCH (e.g., configured grant type 1 PUSCH or configured grant type 2 PUSCH), and the terminal may report that the terminal is capable of transmitting and receiving only one PUSCH per slot to the base station. In this case, in a situation in which the two PUSCHs 2202 and 2208 overlap or do not overlap in terms of time resources within the slot, as shown in FIG. 22, the terminal may transmit the PUSCH 2202 provided by the PDCCH with priority, and may not transmit the PUSCH 2208. Such a terminal operation may be applicable when there is no priority or may be limited to PUSCHs having the same priority. If priority information is provided for PUSCH transmission/reception, the terminal may transmit a PUSCH with a high priority and the terminal may not transmit a PUSCH with a low priority.

For example, if the priority of the PUSCH 2208 is higher than the PUSCH 2202, the terminal may transmit the PUSCH 2208 with priority and may not transmit the PUSCH 2202, even if the PUSCH 2202 is scheduled by the PDCCH 2200. The priority information may be provided by a higher signal or L1 (e.g., field information in DCI). When a field or value indicating a priority is high, it may be determined that priority information of a corresponding PUSCH is high. For example, when the field indicating the priority is 0 or 1, it may be determined that a PUSCH having a value of 1 has a higher priority than a PUSCH having a value of 0, and the value of 1 or 0 may be provided by a higher signal or an L1 signal. However, this is for illustration only, and on the contrary, when the field or value indicating the priority is low, it is possible to determine that priority information of the corresponding PUSCH is high.

In the drawings in which methods of the disclosure are described, the order of the description does not always correspond to the order in which steps of each method are performed, and the order between the steps may be changed or the steps may be performed in parallel. Additionally, in the drawings in which methods of the disclosure are described, some elements may be omitted and or additional elements may be added therein without departing from the essential spirit and scope of the disclosure.

In the disclosure, the main operation of the terminal for the SPS PDSCH has been described, but the disclosure may be equally applied to the grant-free PUSCH (or configured grant type 1 and type 2).

Further, in methods of the disclosure, some or all of the contents of each embodiment may be combined without departing from the essential spirit and scope of the disclosure.

It will be apparent to those skilled in the art that other modifications and changes may be made to embodiments of the disclosure on the basis of the technical spirit of the disclosure.

The above respective embodiments may be employed in combination, as necessary. For example, some of the plurality of embodiments of the disclosure may be partially combined to operate a base station and a terminal. Further, although the above embodiments have been described by way of the NR system, other variants based on the technical idea of the embodiments may be implemented in other systems such as FDD or TDD LTE systems.

Further, although certain embodiments of the disclosure have been described and shown using particular terms, they have been used in a general sense merely to easily explain the technical contents of the disclosure and help achieve an understanding of the disclosure, and are not intended to limit the scope of the disclosure. It will be apparent to those skilled in the art that, in addition to the embodiments disclosed herein, other variants may be achieved on the basis of the technical idea of the disclosure.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. A method performed by a terminal in a communication system, the method comprising:
    identifying a physical downlink shared channel (PDSCH) scheduled by a physical downlink control channel (PDCCH);
    identifying a plurality of PDSCHs;
    identifying one or more PDSCHs among the plurality of PDSCHs without corresponding PDCCHs;
    identifying an earliest starting symbol of at least one PDSCH that overlaps with the PDSCH scheduled by the PDCCH in time, among the identified one or more PDSCHs; and
    decoding the PDSCH scheduled by the PDCCH, in case that the PDCCH ends at least 14 symbols before the earliest starting symbol of the at least one PDSCH.

2. The method of claim 1, wherein the PDSCH scheduled by the PDCCH is not decoded in case that the PDCCH ends within the 14 symbols before the earliest starting symbol of the at least one PDSCH.

3. The method of claim 1, wherein a symbol duration associated with the 14 symbols is identified based on the smallest numerology between the PDCCH and the PDSCH scheduled by the PDCCH.

4. The method of claim 1, wherein identifying the one or more PDSCHs among the plurality of PDSCHs further comprises:
   identifying a first PDSCH with a lowest index among the plurality of PDSCHs;
   excluding PDSCHs that overlap with the first PDSCH in time; and
   identifying a second PDSCH with a lowest index among PDSCHs remaining after excluding PDSCHs that overlap with the first PDSCH in time.

5. The method of claim 1, wherein the PDCCH includes a cyclic redundancy check (CRC) scrambled with a cell radio network temporary identifier (C-RNTI), a configured scheduling (CS)-RNTI or a modulation and coding scheme (MCS)-C-RNTI.

6. A method performed by a base station in a communication system, the method comprising:
   identifying a physical downlink shared channel (PDSCH) scheduled by a physical downlink control channel (PDCCH);
   identifying a plurality of PDSCHs;
   identifying one or more PDSCHs among the plurality of PDSCHs without a corresponding PDCCH;
   identifying an earliest starting symbol of at least one PDSCH that overlaps with the PDSCH scheduled by the PDCCH in time, among the identified one or more PDSCHs; and
   transmitting the PDSCH scheduled by the PDCCH, in case that the PDCCH ends at least 14 symbols before the earliest starting symbol of the at least one PDSCH.

7. The method of claim 6, wherein the PDSCH scheduled by the PDCCH is not transmitted in case that the PDCCH ends within the 14 symbols before the starting symbol of the at least one PDSCH.

8. The method of claim 6, wherein a symbol duration associated with the 14 symbols is identified based on the smallest numerology between the PDCCH and the PDSCH scheduled by the PDCCH.

9. The method of claim 6, wherein identifying the one or more PDSCHs among the plurality of PDSCHs further comprises:
   identifying a first PDSCH with a lowest index among the plurality of PDSCHs;
   excluding PDSCHs that overlap with the first PDSCH in time; and
   identifying a second PDSCH with a lowest index among PDSCHs remaining after excluding PDSCHs that overlap with the first PDSCH in time.

10. The method of claim 6, wherein the PDCCH includes a cyclic redundancy check (CRC) scrambled with a cell radio network temporary identifier (C-RNTI), a configured scheduling (CS)-RNTI or a modulation and coding scheme (MCS)-C-RNTI.

11. A terminal in a communication system, the terminal comprising:
   a transceiver; and
   a controller configured to:
   identify a physical downlink shared channel (PDSCH) scheduled by a physical downlink control channel (PDCCH),
   identify a plurality of PDSCHs;
   identify one or more PDSCHs among the plurality of PDSCHs without corresponding PDCCHs,
   identify an earliest starting symbol of at least one PDSCH that overlaps with the PDSCH scheduled by the PDCCH in time, among the identified one or more PDSCHs; and
   decode the PDSCH scheduled by the PDCCH, in case that the PDCCH ends at least 14 symbols before the earliest starting symbol of the at least one PDSCH.

12. The terminal of claim 11, wherein the first PDSCH scheduled by the PDCCH is not decoded in case that the PDCCH ends within the 14 symbols before the earliest starting symbol of the at least one PDSCH.

13. The terminal of claim 11, wherein a symbol duration associated with the 14 symbols is identified based on the smallest numerology between the PDCCH and the PDSCH scheduled by the PDCCH.

14. The terminal of claim 11, wherein identifying the one or more PDSCHs among the plurality of PDSCHs further comprises:
   identifying a first PDSCH with a lowest index among the plurality of PDSCHs;
   excluding PDSCHs that overlap with the first PDSCH in time; and
   identifying a second PDSCH with a lowest index among PDSCHs remaining after excluding PDSCHs that overlap with the first PDSCH in time.

15. The terminal of claim 11, wherein the PDCCH includes a cyclic redundancy check (CRC) scrambled with a cell radio network temporary identifier (C-RNTI), a configured scheduling (CS)-RNTI or a modulation and coding scheme (MCS)-C-RNTI.

16. A base station in a communication system, the base station comprising:
   a transceiver; and
   a controller configured to:
   identify a physical downlink shared channel (PDSCH) scheduled by a physical downlink control channel (PDCCH),
   identify a plurality of PDSCHs,
   identify one or more PDSCHs among the plurality of PDSCHs without corresponding PDCCHs,
   identify an earliest starting symbol of at least one PDSCH that overlaps with the PDSCH scheduled by the PDCCH in time, among the identified one or more PDSCHs; and
   transmit the PDSCH scheduled by the PDCCH, in case that the PDCCH ends at least 14 symbols before the earliest starting symbol of the at least one PDSCH.

17. The base station of claim 16, wherein the PDSCH scheduled by the PDCCH is not transmitted in case that the PDCCH ends within the 14 symbols before the starting symbol of the at least one PDSCH.

18. The base station of claim 16, wherein a symbol duration associated with the 14 symbols is identified based on the smallest numerology between the PDCCH and the PDSCH scheduled by the PDCCH.

19. The base station of claim 16, wherein identifying the one or more PDSCHs among the plurality of PDSCHs further comprises:
   identifying a first PDSCH with a lowest index among the plurality of PDSCHs;

excluding PDSCHs that overlap with the first PDSCH in time; and identifying a second PDSCH with a lowest index among PDSCHs remaining after excluding PDSCHs that overlap with the first PDSCH in time.

20. The base station of claim 16, wherein the PDCCH includes a cyclic redundancy check (CRC) scrambled with a cell radio network temporary identifier (C-RNTI), a configured scheduling (CS)-RNTI or a modulation and coding scheme (MCS)-C-RNTI.

* * * * *